US008916418B2

(12) United States Patent
Ishii et al.

(10) Patent No.: US 8,916,418 B2
(45) Date of Patent: Dec. 23, 2014

(54) SURFACE-EMITTING LASER MODULE, OPTICAL SCANNER DEVICE, AND IMAGE FORMING APPARATUS

(75) Inventors: Toshihiro Ishii, Miyagi (JP); Satoru Sugawara, Miyagi (JP); Yoshihiro Ohba, Miyagi (JP); Kazuhiro Harasaka, Miyagi (JP); Shunichi Sato, Miyagi (JP); Kazuhiko Adachi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 222 days.

(21) Appl. No.: 13/049,391

(22) Filed: Mar. 16, 2011

(65) Prior Publication Data

US 2011/0228035 A1 Sep. 22, 2011

(30) Foreign Application Priority Data

Mar. 18, 2010 (JP) ................... 2010-062220
Jan. 19, 2011 (JP) ................... 2011-008870

(51) Int. Cl.
*H01L 21/00* (2006.01)
*B41J 2/385* (2006.01)
(Continued)

(52) U.S. Cl.
CPC ........... *B41J 2/45* (2013.01); *H01S 5/3202* (2013.01); *H01S 5/02296* (2013.01);
(Continued)

(58) Field of Classification Search
CPC ............. B41J 2/385; B41J 2/41; B41J 2/435; B41J 2/47; B41J 2/455; B41J 2/45; H01L 21/00; H01L 3/08
USPC ......... 347/111, 112, 129, 130, 134, 138, 152, 347/224, 225, 233, 238, 245, 263; 372/92, 372/98, 99; 438/22, 26, 106, 116
See application file for complete search history.

(56) References Cited

U.S. PATENT DOCUMENTS 5,923,691 A 7/1999 Sato
5,939,733 A 8/1999 Sato
(Continued)

FOREIGN PATENT DOCUMENTS

EP 1130720 A1 6/2001
EP 1972924 A1 9/2008
(Continued)

OTHER PUBLICATIONS

European search report dated Oct. 26, 2012 in connection with corresponding European patent application No. 11158900.8.

(Continued)

*Primary Examiner* — Justin Seo
*Assistant Examiner* — Kendrick Liu
(74) *Attorney, Agent, or Firm* — Cooper & Dunham LLP

(57) ABSTRACT

A disclosed surface-emitting laser module includes a surface-emitting laser formed on a substrate to emit light perpendicular to its surface, a package including a recess portion in which the substrate having the surface-emitting laser is arranged, and a transparent substrate arranged to cover the recess portion of the package and the substrate having the surface-emitting laser such that the transparent substrate and the package are connected on a light emitting side of the surface-emitting laser. In the surface-emitting laser module, a high reflectance region and a low reflectance region are formed within a region enclosed by an electrode on an upper part of a mesa of the surface-emitting laser, and the transparent substrate is slanted to the surface of the substrate having the surface-emitting laser in a polarization direction of the light emitted from the surface-emitting laser determined by the high reflectance region and the low reflectance region.

16 Claims, 48 Drawing Sheets

(51) Int. Cl.
  B41J 2/41 (2006.01)
  B41J 2/435 (2006.01)
  B41J 2/47 (2006.01)
  B41J 2/455 (2006.01)
  B41J 2/45 (2006.01)
  H01S 5/022 (2006.01)
  B82Y 20/00 (2011.01)
  H01S 5/042 (2006.01)
  H01S 5/32 (2006.01)
  H01S 5/0683 (2006.01)
  H01S 5/42 (2006.01)
  H01S 5/183 (2006.01)
  H01S 5/343 (2006.01)

(52) U.S. Cl.
  CPC .............. H01S 5/0683 (2013.01); H01S 5/423 (2013.01); H01S 5/18311 (2013.01); H01S 5/02212 (2013.01); H01S 2301/14 (2013.01); H01S 5/18394 (2013.01); B82Y 20/00 (2013.01); H01S 5/1835 (2013.01); H01S 5/18391 (2013.01); H01S 5/18358 (2013.01); H01S 5/18355 (2013.01); H01S 5/0425 (2013.01); H01S 5/34306 (2013.01); H01S 5/02248 (2013.01)
  USPC ............. 438/116; 438/26; 347/134; 347/138; 347/130; 347/152; 347/238; 347/245; 347/263

(56) References Cited

U.S. PATENT DOCUMENTS

| | | | |
|---|---|---|---|
| 6,002,700 | A | 12/1999 | Sato |
| 6,061,371 | A | 5/2000 | Uejima et al. |
| 6,072,196 | A | 6/2000 | Sato |
| 6,207,973 | B1 | 3/2001 | Sato et al. |
| 6,233,264 | B1 | 5/2001 | Sato |
| 6,542,528 | B1 | 4/2003 | Sato et al. |
| 6,563,851 | B1 | 5/2003 | Jikutani et al. |
| 6,567,435 | B1 | 5/2003 | Scott et al. |
| 6,614,821 | B1 | 9/2003 | Jikutani et al. |
| 6,659,659 | B1 * | 12/2003 | Malone ........................ 385/94 |
| 6,674,785 | B2 | 1/2004 | Sato et al. |
| 6,765,232 | B2 | 7/2004 | Kaminishi et al. |
| 6,803,604 | B2 | 10/2004 | Takahashi et al. |
| 6,927,412 | B2 | 8/2005 | Takahashi et al. |
| 6,959,025 | B2 | 10/2005 | Jikutani et al. |
| 6,975,663 | B2 | 12/2005 | Sekiya et al. |
| 7,002,527 | B2 | 2/2006 | Sugawara |
| 7,352,935 | B2 | 4/2008 | Furuyama et al. |
| 7,511,868 | B2 | 3/2009 | Nakajima |
| 7,684,458 | B2 | 3/2010 | Sato et al. |
| 7,693,204 | B2 | 4/2010 | Sato et al. |
| 7,720,125 | B2 | 5/2010 | Jikutani et al. |
| 7,746,912 | B2 | 6/2010 | Motomura et al. |
| 2005/0147143 | A1 * | 7/2005 | Jikutani ........................ 372/43 |
| 2006/0022213 | A1 | 2/2006 | Posamentier |
| 2006/0187997 | A1 | 8/2006 | Ezaki et al. |
| 2007/0014324 | A1 | 1/2007 | Maeda et al. |
| 2007/0030874 | A1 | 2/2007 | Ariga et al. |
| 2007/0153860 | A1 * | 7/2007 | Chang-Hasnain et al. ........................ 372/50.124 |
| 2008/0055672 | A1 | 3/2008 | Watanabe et al. |
| 2008/0233017 | A1 | 9/2008 | Sato et al. |
| 2008/0308639 | A1 * | 12/2008 | Stern et al. ................ 235/462.32 |
| 2009/0262770 | A1 | 10/2009 | Itoh et al. |
| 2009/0285252 | A1 | 11/2009 | Ishii et al. |
| 2009/0285602 | A1 | 11/2009 | Harasaka et al. |
| 2009/0295902 | A1 | 12/2009 | Sato et al. |
| 2009/0303308 | A1 | 12/2009 | Itoh et al. |
| 2009/0310632 | A1 | 12/2009 | Sugawara et al. |
| 2010/0060712 | A1 | 3/2010 | Sato et al. |
| 2010/0189467 | A1 | 7/2010 | Sato et al. |
| 2010/0214633 | A1 | 8/2010 | Sato et al. |
| 2010/0328747 | A1 | 12/2010 | Jikutani et al. |
| 2011/0037825 | A1 | 2/2011 | Jikutani et al. |
| 2011/0058587 | A1 | 3/2011 | Sakurai et al. |
| 2012/0251182 | A1 * | 10/2012 | Adachi et al. ................. 399/177 |

FOREIGN PATENT DOCUMENTS

| | | |
|---|---|---|
| EP | 23202145 A1 | 5/2011 |
| JP | 2001-156395 | 6/2001 |
| JP | 2005-38956 | 2/2005 |
| JP | 2005-86027 | 3/2005 |
| JP | 2005-86067 | 3/2005 |
| JP | 2005-252032 | 9/2005 |
| JP | 2007-79295 | 3/2007 |
| JP | 2008-16824 | 1/2008 |
| JP | 2008-192780 | 8/2008 |
| JP | 4351965 | 7/2009 |
| WO | WO01/91257 | 11/2001 |

OTHER PUBLICATIONS

Japanese official action dated Aug. 5, 2014 in corresponding Japanese patent application No. 2011-008870.

* cited by examiner

FIG.13
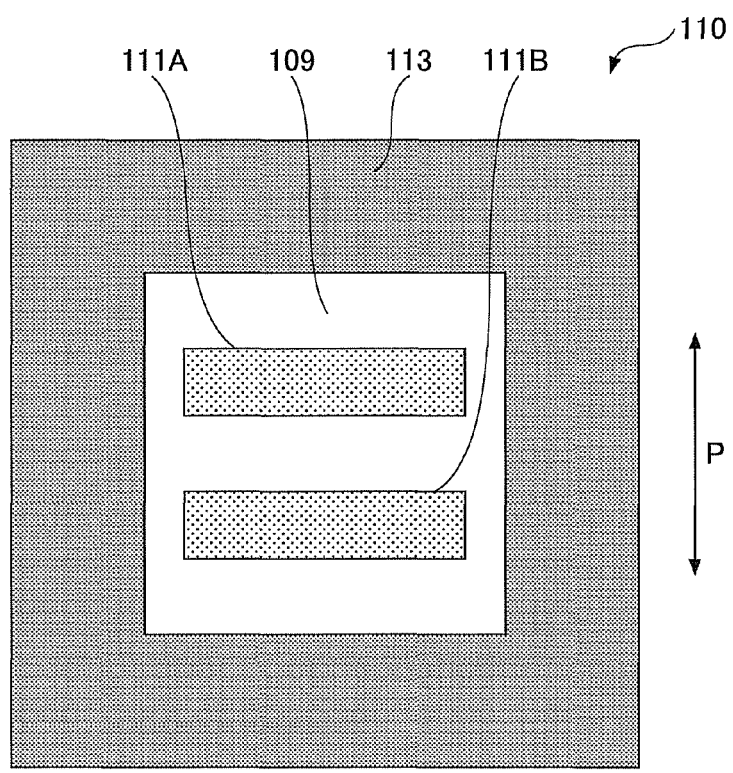
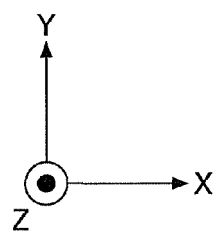

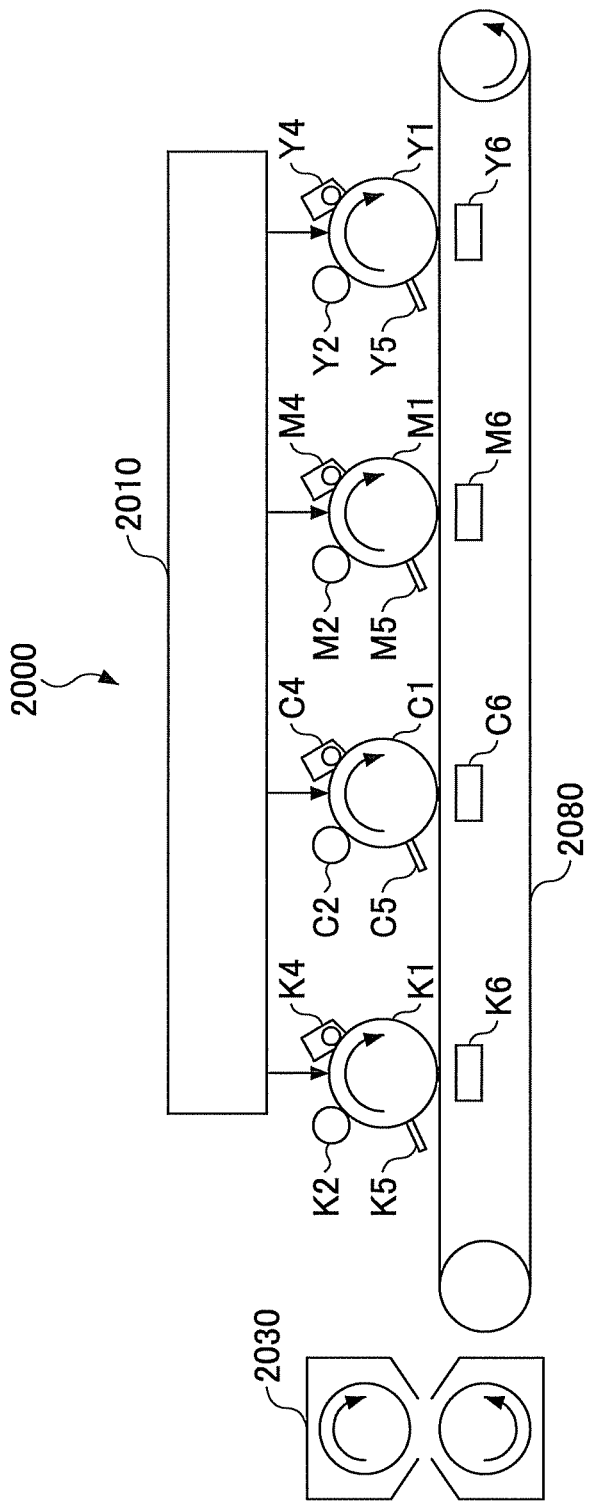

SURFACE-EMITTING LASER MODULE, OPTICAL SCANNER DEVICE, AND IMAGE FORMING APPARATUS

BACKGROUND OF THE INVENTION

1. Field of the Invention

The invention relates to a surface-emitting laser module, an optical scanner device and an image forming apparatus.

2. Description of the Related Art

There has been an increasing demand for multi-color image forming apparatuses capable of producing high-resolution images. The printing speeds of such multi-color image forming apparatuses have been increased every year so that the multi-color image forming apparatuses are utilized for simplified printing in on-demand printing systems. Specifically, such a multi-color image forming apparatus is, for example, provided with a two-dimensional laser array element including two-dimensionally arranged surface-emitting lasers such that sub-scanning intervals of recording density on photoreceptors are adjusted approximately to 1/n. Accordingly, the multi-color image forming apparatus is capable of forming a n*m dot matrix configuration as a pixel unit.

In optical systems including the surface-emitting laser elements or semiconductor laser elements, laser light may be fluctuated by feedback light, which is light reflected from lenses or a glass cover returning to the original laser elements. Examples of such laser-light fluctuation include various light fluctuation types such as high-speed laser-light fluctuation occurring in nsec order and laser-light fluctuation occurring in msec order. Since the surface-emitting lasers generally have a high mirror reflectance, they are considered to have high resistance to the feedback light. However, recent findings suggest the surface-emitting lasers are not necessarily highly resistant to the feedback light. In particular, in a case where the optical system includes a surface-emitting laser array including plural surface-emitting lasers, laser light emitted from a surface-emitting laser is reflected to an adjacent surface-emitting laser to fluctuate its laser light.

In order to suppress the effect of such feedback light, Japanese Patent Application Publication No. 2005-252032 (hereinafter referred to as "Patent Document 1") discloses a technology to increase feedback light resistance of the surface-emitting laser element. In the technology disclosed in the Patent Document 1, relaxation oscillation frequency in the resonator is set to exceed an optical communication frequency which modulates a laser beam output from the surface emitting laser element by applying the modulation doping of carbon to a barrier layer of the active layer and increasing a differential gain. Further, Japanese Patent Application Publication No. 2005-86027 (hereinafter referred to as "Patent Document 2") discloses a technology to enhance the feedback light resistance of the surface-emitting laser by providing a laser-light absorption layer to partially absorb laser light in the surface-emitting laser element.

Moreover, Japanese Patent No. 4351965 (hereinafter referred to as "Patent Document 3") discloses a technology to lower an adverse effect of the feedback light. In the technology disclosed in Patent Document 3, optical fibers are slanted at 2 degrees or more to the surface-emitting laser to avoid the feedback light reflected from end surfaces of the optical fibers. The methods of slanting the end surfaces of the glass cover or optical fibers are generally used for reducing the adverse effect of the feedback laser light. However, the degrees at which the end surfaces of the optical fibers are simply slanted may be limited by its design configuration, and hence, it is preferable that the maximum effect may be obtained in reducing the feedback light with the minimum slant degrees.

However, with the technologies disclosed in Patent Documents 1 through 3, it appears to be difficult to reduce the light fluctuation to a predetermined amount or less and thus it may be difficult to produce a surface-emitting laser module capable of lowering the light fluctuation to a predetermined amount or less.

SUMMARY OF THE INVENTION

Accordingly, it is a general object of at least one embodiment of the present invention to provide a surface-emitting laser module having little laser light fluctuation due to feedback light, an optical scanner device and an image forming apparatus having such surface-emitting laser module that substantially obviate one or more problems caused by the limitations and disadvantages of the related art.

In one embodiment, there is provided a surface-emitting laser module that includes a surface-emitting laser formed on a substrate and configured to emit light perpendicular to a surface thereof; a package including a recess portion in which the substrate having the surface-emitting laser formed thereon is arranged; and a transparent substrate arranged to cover the recess portion of the package together with the substrate having the surface-emitting laser formed thereon located in the recess portion of the package such that the transparent substrate and the package are connected to each other on a light emitting side of the surface-emitting laser. In the surface-emitting laser module, a high reflectance region having a high reflectance of the light emitted from the surface-emitting laser and a low reflectance region having a low reflectance of the light emitted therefrom are formed within a region enclosed by an electrode formed on an upper part of a mesa of the surface-emitting laser. Further, in the surface-emitting laser module, the transparent substrate is slanted to the surface of the substrate having the surface-emitting laser formed thereon in a polarization direction of the light emitted from the surface-emitting laser determined by the high reflectance region and the low reflectance region formed within the region enclosed by the electrode on the upper part of the mesa of the surface-emitting laser.

In another embodiment, there is provided an optical scanner device to optically scan a surface subject to scanning with light. The optical scanner device includes a light source including a surface-emitting laser; a light deflecting portion to deflect the light emitted from the light source; and a scanning optical system to converge the light deflected by the light deflecting portion onto the surface subject to scanning.

In another embodiment, there is provided an image forming apparatus that includes an image carrier; and an optical scanner device to scan light modulated based on image information on the image carrier.

BRIEF DESCRIPTION OF THE DRAWINGS

Other objects and further features of embodiments will be apparent from the following detailed description when read in conjunction with the accompanying drawings, in which:

FIG. 13 is a first explanatory diagram illustrating a second example of the surface-emitting laser according to the first embodiment;

FIG. 51 is a configuration diagram illustrating a color printer according to a fourth embodiment.

DESCRIPTION OF THE PREFERRED EMBODIMENTS

Figure 1:
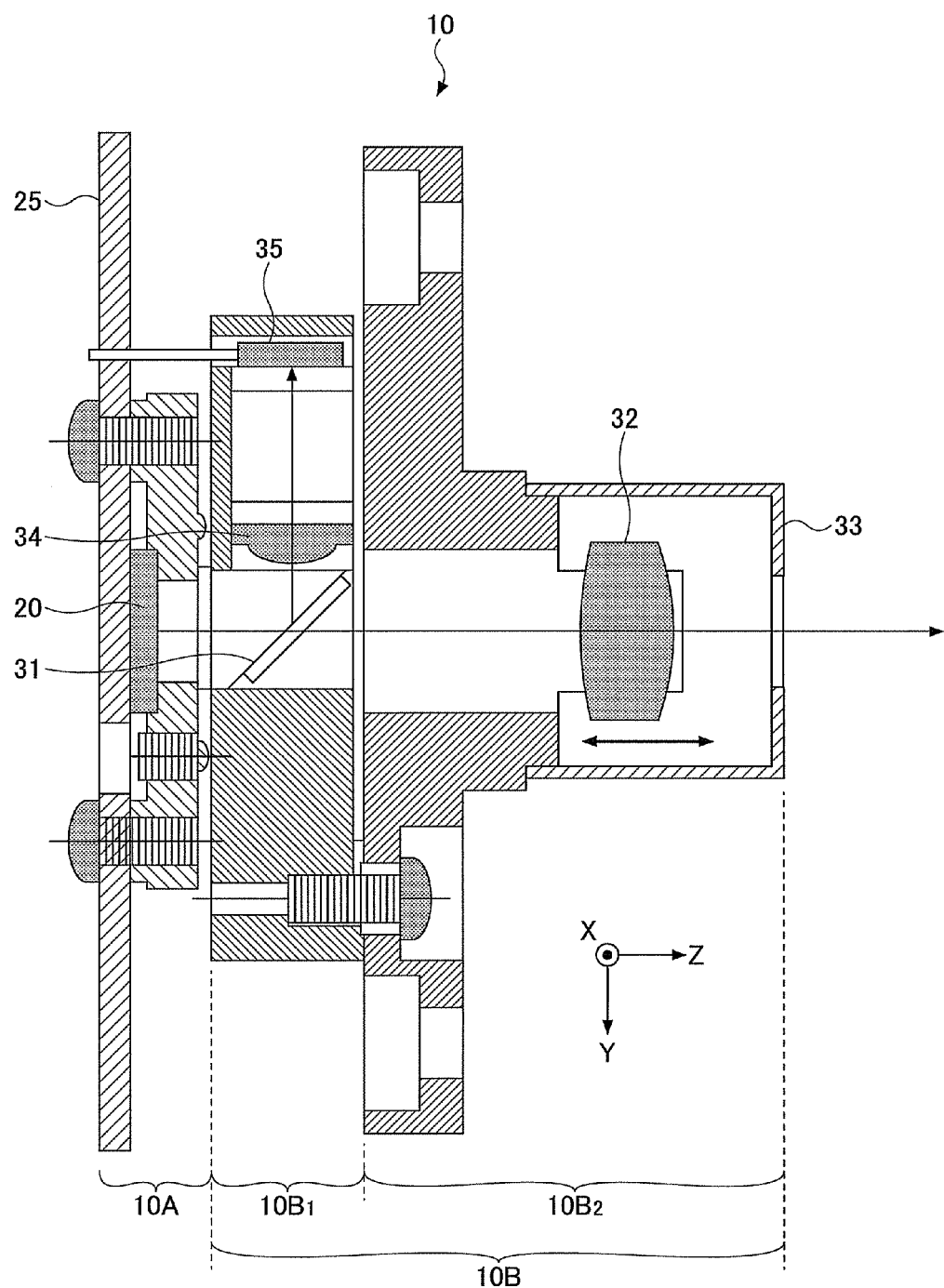
FIG. 1 is a configuration diagram illustrating an illuminant unit (a light source) including surface-emitting laser modules.

Embodiments are described below with reference to accompanying drawings. In the embodiments, identical components provided with the same reference numerals and overlapped descriptions are omitted.

[First Embodiment]

A first embodiment includes a surface-emitting laser module having a surface-emitting laser array composed of plural surface-emitting lasers.

As illustrated in FIG. 1, an illuminant unit 10 (i.e., a light source) is formed by combining a laser module 10A having a surface-emitting laser module 20 according to the first embodiment and an optical module 10B.

Note that in this specification, a Z-axis direction is defined as a light emitting direction of laser light emitted from the illuminant unit 10, X-axis and Y-axis directions are defined as respective two orthogonal directions in a plane perpendicular to the Z-axis direction. The laser module 10A includes the surface-emitting laser module 20, a not-shown laser control device to drive surface emitting lasers provided in the surface-emitting laser module 20, and a printed circuit board (PCB) 25 on which the surface-emitting laser module 20 and the not-shown laser control device are mounted.

The optical module 10B includes a first portion 10B1 and a second portion 10B2. The first portion 10B1 includes an aperture mirror 31, a converging lens 34, and a light-receiving element 35, whereas the second portion 10B2 includes a collimation lens 32 and an opening plate 33.

The first portion 10B1 is arranged at a +Z side of the laser module 10A such that the aperture mirror 31 is located in an optical path of laser light emitted from a not-shown surface-emitting laser array chip (i.e., the surface-emitting element) of the surface-emitting laser module 20. Laser light incident on the aperture mirror 31 is partially reflected in a −Y direction such that the light-receiving element 35 receives the reflected light via the converging lens 34. The light-receiving element 35 outputs a signal in response to the amount of received light (i.e., a photoelectric converted signal) into the not-shown laser control device.

The second portion 10B2 is arranged at a +Z side of the first portion 10B1 such that the collimation lens 32 is located in an optical path of light having passed through the aperture mirror 31. Note that the collimation lens 32 adjusts the light having passed through the aperture mirror 31 to an approximately parallel light. The opening plate 33 includes an opening for forming the light having passed through the collimation lens 32. Thus, the light passing through the opening of the opening plate 33 corresponds to the laser light (output light) output from the illuminant unit 10. The light emitted from the surface-emitting laser module 20 is directly incident on the optical module 10B.

Figure 2A:
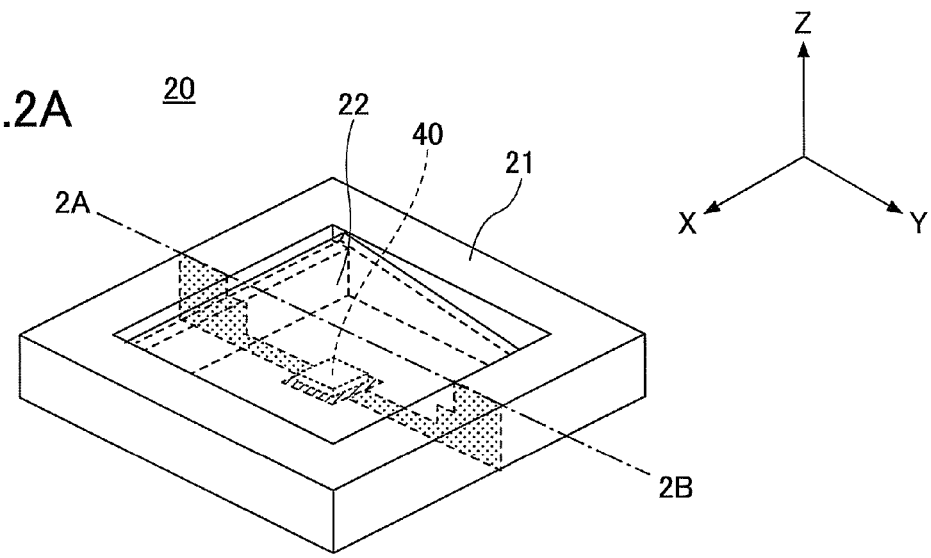
FIGS. 2A, 2B, and 2C are diagrams illustrating the surface-emitting laser module according to a first embodiment.
Figure 2B:
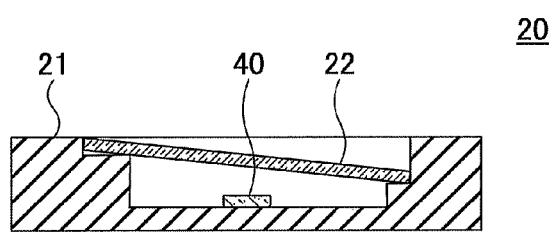
Figure 2C:
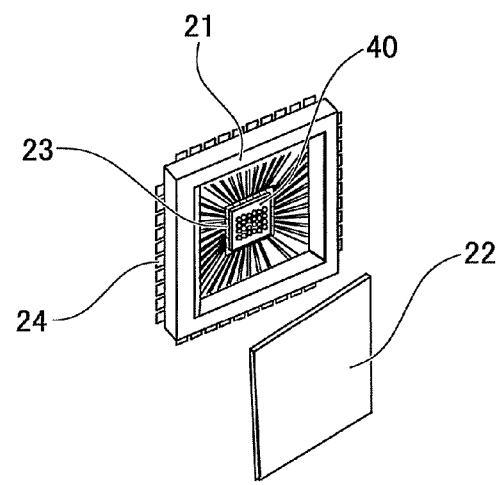
Figure 3:
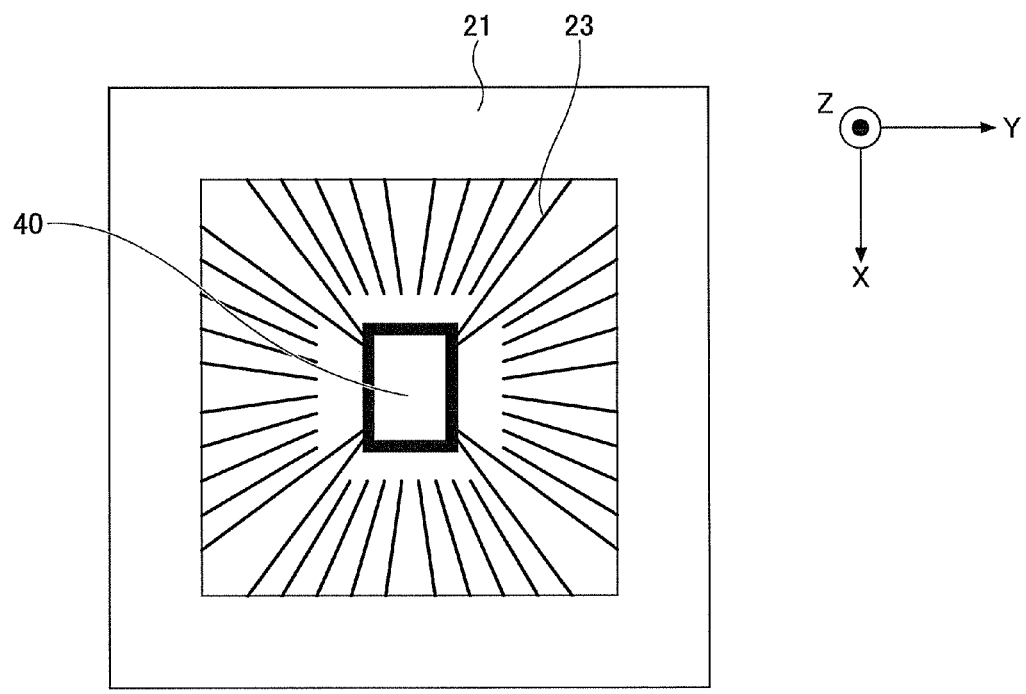
FIG. 3 is a top diagram illustrating a package utilized for the surface-emitting laser module according to the first embodiment.

Next, the surface-emitting laser module 20 is described with reference to FIGS. 2A to 2C, and FIG. 3. FIG. 2A is a perspective diagram illustrating the surface-emitting laser module 20, FIG. 2B is a cross-sectional diagram cut along a broken line 2A and 2B in FIG. 2A, and FIG. 2C is a perspective diagram illustrating an inside of the surface-emitting laser module 20. FIG. 3 is a top diagram illustrating the inside of the surface-emitting laser module 20 from which a glass cover 22 (see FIG. 28) that is a transparent substrate is removed. The surface-emitting laser module 20 according to the first embodiment is formed by implementing a surface-emitting laser array chip 40 into a package 21 called a ceramic leaded chip carrier (or CLCC). The glass cover 22 is placed on an upper surface of the package 21 to prevent foreign matter such as dust from getting inside the package 21. Thus, the glass cover 22 is a transparent member located at a closest position from the surface-emitting lasers. If the glass cover 22 is arranged approximately in parallel with the surface-emitting laser array chip 40, the light emitted from the surface-emitting laser array chip 40 is partially reflected off the glass cover 22 to be incident on active layers as feedback light via openings of the surface-emitting lasers in the surface-emitting laser array chip 40.

Thus, in the surface-emitting laser module 20 according to the first embodiment, the glass cover 22 is arranged such that the glass cover 22 is slanted to the surface of the surface-emitting laser array chip 40. Accordingly, adverse effects of the glass cover 22 arranged on the package 21 caused by the feedback light may be prevented. Note that the greater the angle at which the glass cover 22 is slanted to the surface-emitting laser array chip 40, the greater the preventing effect may be. However, a preferable angle at which the glass cover 22 is slanted may be approximately 15 degrees based on the limitations of the mounting space and a beam shape of the laser light. Thus, in the surface-emitting laser module 20 according to the first embodiment, the slanting angle of the glass cover 22 is at 15 degrees to the surface of the surface-emitting laser array chip 40. Note that a slanting direction of the glass cover 22 is described later in more detail.

As illustrated as an example in FIGS. 2C and 3, the package 21 is made of ceramics and includes metallic wires 23 inside the package 21. The metallic wires 23 are extended from the periphery to the center of the package 21 and individually connected to respective side-wall electrodes 24 provided on the side surfaces of the package 21. The package 21 includes a die attach area provided with a metallic film in its central portion, and the die attach area is utilized as a common electrode. In this embodiment, eight metallic wires are connected to four corners of the die attach area of the package 21. The surface-emitting laser array chip 40 is die-bonded to the die attach area with solder such as AuSn. Note that electrode wires are formed on a surface of the surface-emitting laser array chip 40, and the electrode wires are individually connected from not-shown electrode pads to not-shown p-side electrodes of the respective vertical cavity surface emitting lasers (VCSELs).

Alternatively, the electrode wires 23 may be electrically coupled with the not-shown electrode pads formed on the surface-emitting laser array chip 40 by wire-bonding.

(Surface-Emitting Laser)

Next, surface-emitting lasers formed on the surface-emitting laser array chip 40 are described. The surface-emitting laser array includes plural surface-emitting lasers arranged two dimensionally in an array, and the surface emitting laser array chip 40 is such a surface-emitting laser array formed into a chip.

Figure 4A:
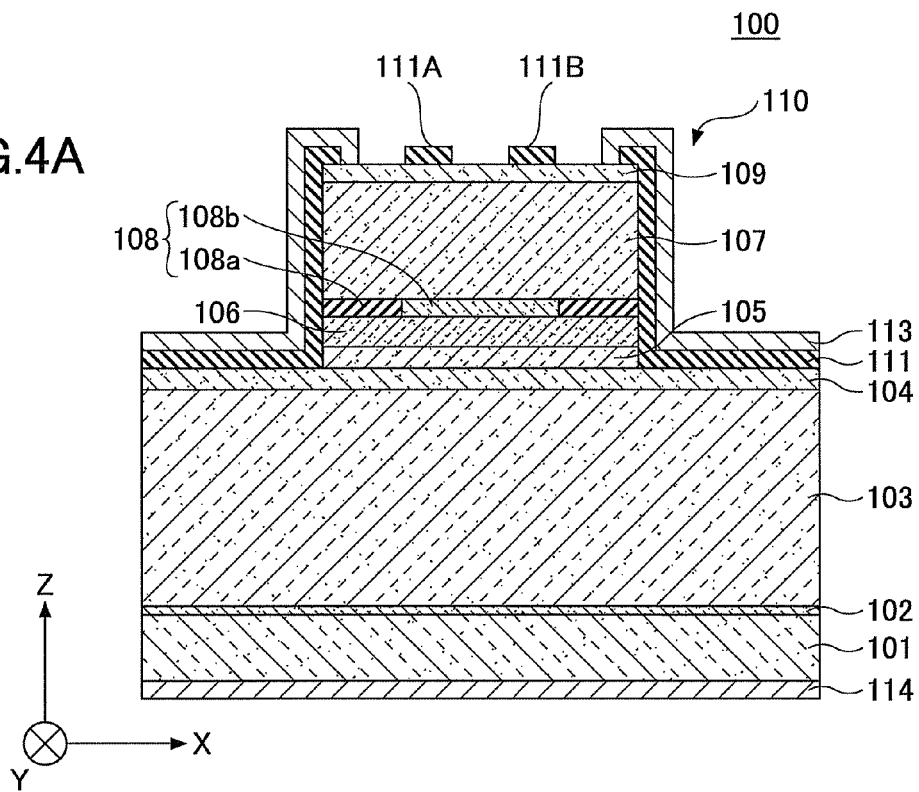
FIGS. 4A and 4B are configuration diagrams illustrating a surface-emitting laser according to the first embodiment.
Figure 4B:
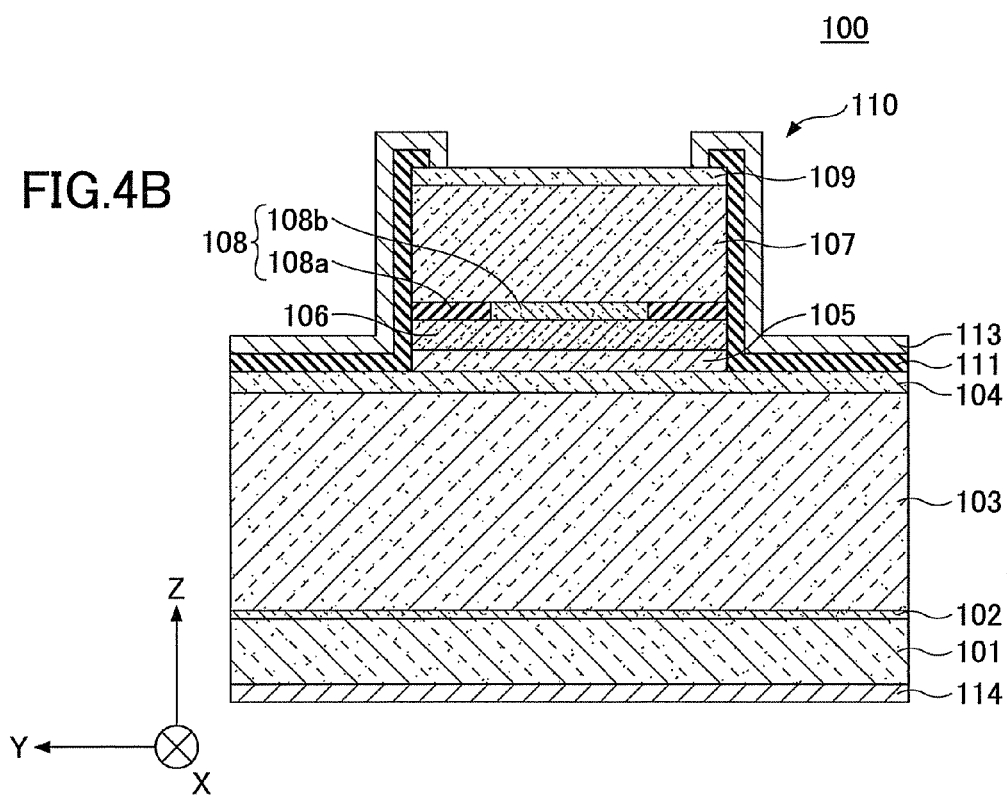

One of surface-emitting lasers 100 forming the surface-emitting laser array is described with reference to FIGS. 4A and 4B. Note that FIG. 4A is a cross-sectional diagram illustrating an XZ plane of the surface-emitting laser 100, and FIG. 4B is a cross-sectional diagram illustrating a YZ plane of the surface-emitting laser 100. As noted earlier, the Z-axis direction is defined as a laser oscillation direction, and the X-axis and Y-axis directions are defined as respective two mutually orthogonal directions in a plane perpendicular to the Z-axis direction.

The surface-emitting laser 100 has a oscillation wavelength of 780 nm band, and includes a substrate 101, a buffer layer 102, a lower semiconductor DBR 103, a lower spacer layer 104, an active layer 105, an upper spacer layer 106, an upper semiconductor DBR 107, and a contact layer 109. Further, a mesa 110 is formed by etching in corresponding parts of the lower spacer layer 104, the active layer 105, the upper spacer layer 106, the upper semiconductor DBR 107, and the contact layer 109. A protection layer 111 is formed on the mesa 110, and transparent layers 111A and 111B are formed simultaneously with the protection layer 111 formed on the mesa 110. The upper semiconductor DBR 107 includes a current constricting layer 108 having a selective oxidation region 108a and a current constricting region 108b. A p-side electrode 113 is formed on an upper portion of the mesa 110 and an n-side electrode 114 is formed on a rear surface of the substrate 101.

Figure 5A:
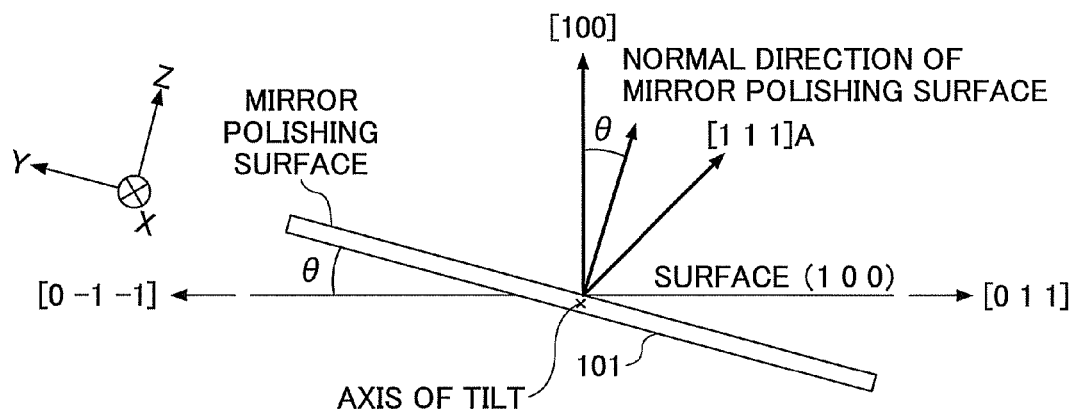
FIGS. 5A and 5B are diagrams illustrating a slanted substrate.
Figure 5B:
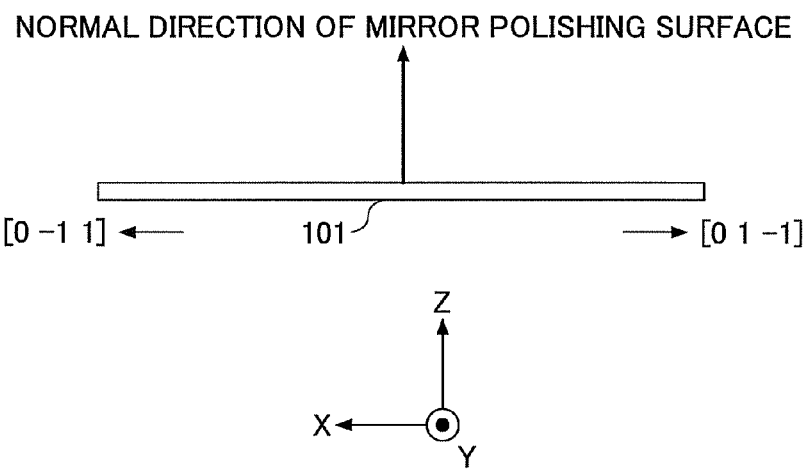

As illustrated in FIG. 5A, the substrate 101 has a mirror polished surface (a main surface) as a top surface. The substrate 101 is formed of an n-GaAs mono-crystal substrate and a normal direction of the substrate 101 is slanted at 15 degrees ($\theta=15$) toward a crystal orientation [1 1 1]A direction from a crystal orientation [1 0 0] direction. That is, the substrate 101 is a slanted substrate. As illustrated in FIG. 5B, the substrate 101 is arranged such that a crystal orientation [0 −1 1] direction of the substrate 101 is a +X direction and the crystal orientation [0 1 −1] direction of the substrate 101 is a −X direction.

Note that polarization control to stabilize a polarization direction in the X-axis direction may be acted by utilizing the slanted substrate as the substrate 101.

As illustrated in FIGS. 4A and 4B, the buffer layer 102 is stacked on a surface of the substrate 101 in a +Z direction and is formed of an n-GaAs layer.

Figure 6:
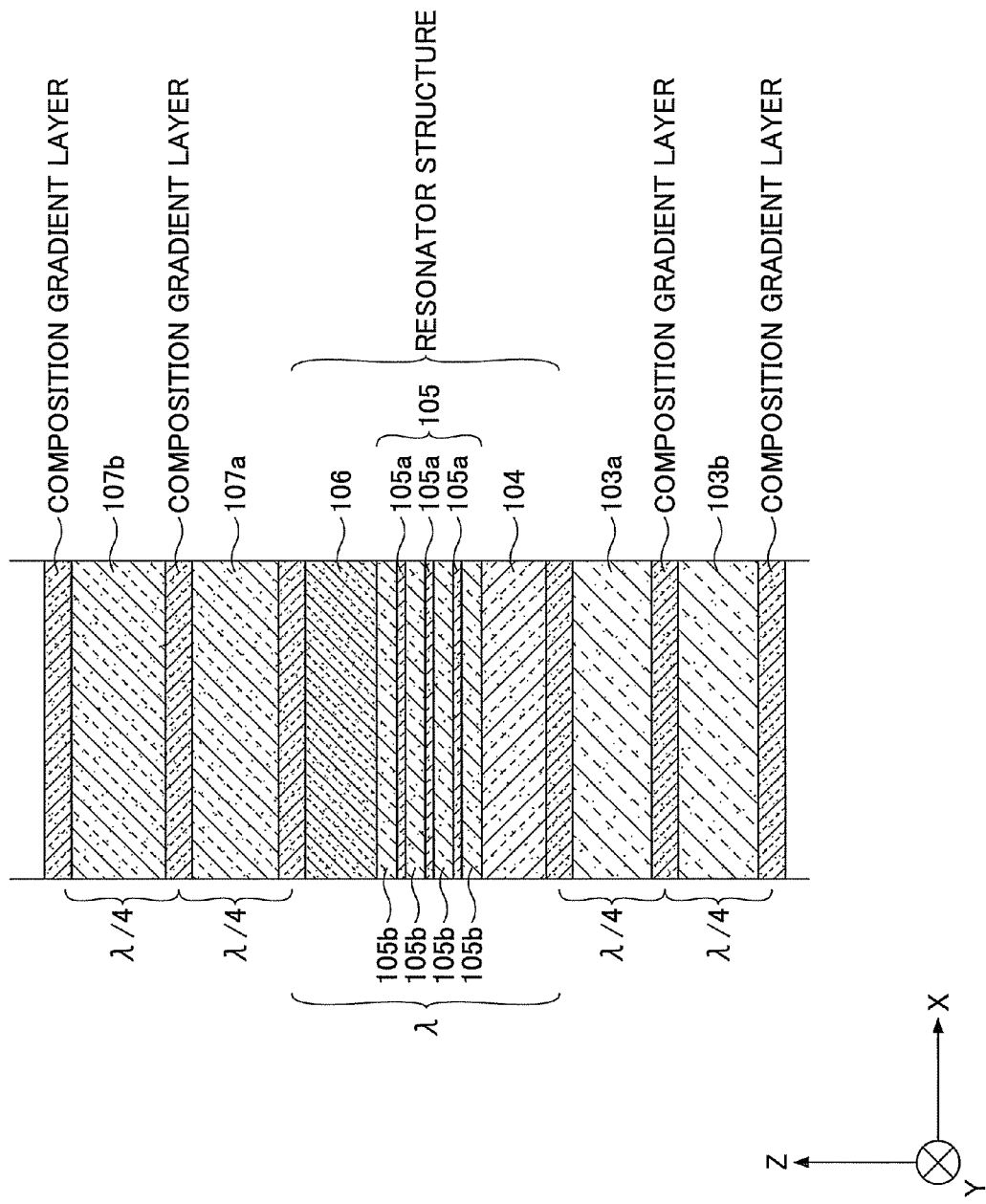
FIG. 6 is a first explanatory diagram illustrating a first example of the surface-emitting laser according to the first embodiment.

The lower semiconductor DBR 103 is stacked on a surface of the buffer layer 102 in the +Z direction. The lower semiconductor DBR 103 has 40.5 pairs of refractive index layers each having a low refractive index layer 103a made of an n-AlAs and a high refractive index layer 103b made of an n-$Al_{0.3}Ga_{0.7}As$. As illustrated in FIG. 6, composition gradient layers having a thickness of 20 nm are provided between the low refractive index layers 103a and the high refractive index layers 103b for reducing electric resistance. The composition gradient layer has a gradual compositional change from one composition to the other. Each of the low refractive index layer 103a and the high refractive index layer 103b includes half of the adjacent composition gradient layer, and an optical thickness of the corresponding refractive index layer including the half of the adjacent composition gradient layer is $\lambda/4$ based on the oscillation wavelength of $\lambda$. Note that if the optical thickness is $\lambda/4$, the actual thickness D of the corresponding refractive index layer is $D=\lambda/4n$ where n represents a refractive index of a medium of that layer.

The lower spacer layer 104 is stacked on a surface of the lower semiconductor DBR 103 in the +Z direction. The lower spacer layer 103 is formed of a non-doped layer made of $(Al_{0.1}Ga_{0.9})_{0.5}In_{0.5}P$.

The active layer 105 is stacked on a surface of the lower spacer layer 104 in the +Z direction and has a triple quantum well structure having three triple quantum well layers 105a and four barrier layers 105b as illustrated in FIG. 6. Each of the quantum well layers 105a is formed of a composition of GaInAsP that induces compression strain of 0.7% and has a band gap wavelength of 780 nm. Each of the barrier layers 105b is formed of a composition of GaInP that induces stretching strain of 0.6%.

The upper spacer layer 106 is stacked on a surface of the active layer 105 in the +Z direction. The upper spacer layer 105 is formed of a non-doped layer made of $(Al_{0.1}Ga_{0.9})_{0.5}In_{0.5}P$.

As illustrated in FIG. 6, a portion including the lower spacer layer 104, the active layer 105 and the upper spacer layer 106 is called a resonator structure, which is configured to include an optical thickness of 1 wavelength. The active layer 105 is provided at a center of the resonator structure located corresponding to a position of a loop of a standing wave distribution of the electric field so as to obtain a high stimulated emission probability.

The upper semiconductor DBR 107 is stacked on a surface of the upper spacer layer 106 in the +Z direction. The upper semiconductor DBR 107 has 25 pairs of a low refractive index layer 107a made of p-$Al_{0.9}Ga_{0.1}As$ and a high refractive index layer 107b made of p-$Al_{0.3}Ga_{0.7}As$.

In the upper semiconductor DBR 107, a composition gradient layer is provided between the low refractive index layer 107a and the high refractive index layer 107b for reducing electric resistance. The composition gradient layer has a gradual compositional change from one composition to the other. Each of the low refractive index layer 107a and the high refractive index layer 107b includes half of the adjacent composition gradient layer, and an optical thickness of the corresponding refractive index layer including the half of the adjacent composition gradient layer is $\lambda/4$.

As illustrated in FIGS. 4A and 4B, a current constricting layer 108 having a thickness of 30 nm and made of p-AlAs is inserted in the low refractive index layer of the upper semiconductor DBR 107. The inserted position of the current constricting layer 108 is a third wave node from the active layer 105 in the standing wave distribution of the electric field. Note that after the mesa 110 is formed on the current constricting layer 108, a selective oxidation region 108a is formed in the periphery and a current constricting region 108b is formed in the center of the current constricting layer 108 by thermal oxidation.

The contact layer 109 is stacked on a surface of the upper semiconductor DBR 107 in the +Z direction and is made of p-GaAs.

Note that the substrate 101 on which the buffer layer 102, the lower semiconductor DBR 103, the lower spacer layer 104, the active layer 105, the upper spacer layer 106, the upper semiconductor DBR 107, and the contact layer 109 are stacked in layers is called a "stacked product" for convenience.

(Surface-Emitting Laser Fabrication Method)

Next, a fabrication method of the surface-emitting laser 100 is described with reference to FIGS. 7A to 12. Note that a desired polarization direction P (e.g., P polarization) indicates an X-axis direction.

Figure 7A:
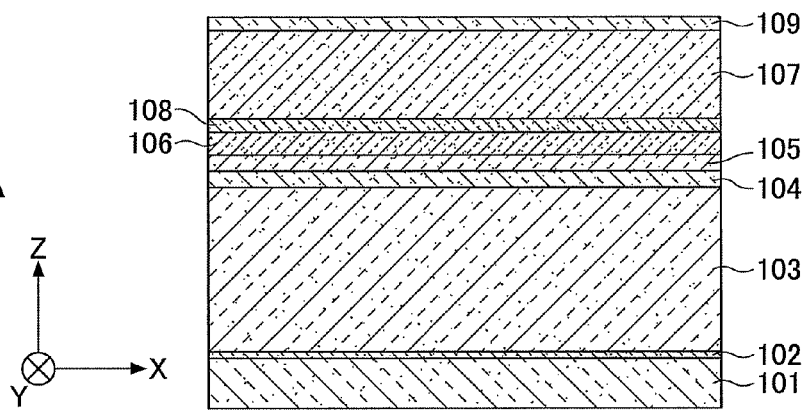
FIGS. 7A, 7B, and 7C are first process diagrams illustrating a method for fabricating the first example of the surface-emitting laser according to the first embodiment.

Initially, the above stacked product is formed in a crystal growth process induced by metal organic chemical vapor deposition (MOCVD) or molecular beam epitaxy (MBE), as illustrated in FIG. 7A. In the crystal growth process by MOCVD, trimethylaluminum, trimethylgallium (TMG), and trimethylindium (TMI) are used as raw materials for a III-Group, and phosphine ($PH_3$) and arsine ($AsH_3$) are used as raw materials for a V-Group. In addition, carbon tetrabromide ($CBr_4$) and dimethylzinc (DMZn) are used as p-type dopant materials, and hydrogen selenide ($H_2Se$) is used as an n-type dopant material.

Subsequently, a not-shown square resist pattern having 25 μm on a side is formed on the surface of the stacked product. Specifically, photoresist is coated on the surface of the stacked product, and the stacked product coated with the phtoresist then undergoes pre-baking, exposing and developing to thereby form a resist pattern.

Next, a portion of the stacked product where the resist pattern is not formed is removed by ECR etching utilizing a Cl2 gas. Note that in this process, the photoresist pattern is used as a photo mask. In this embodiment, the dry etching is carried out until the lower spacer layer 104 is exposed.

Figure 7B:
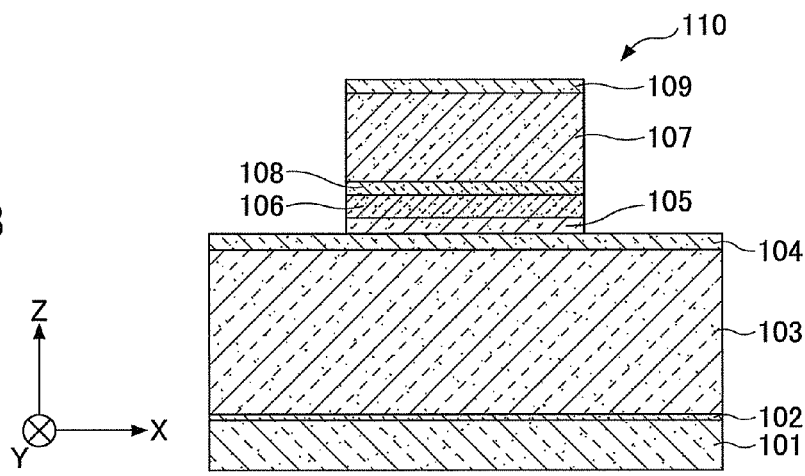

Subsequently, the photomasks M are removed as illustrated in FIG. 7B. A mesa structure (hereinafter simply called a "mesa") 110 having a rectangular prism shape is thus formed.

Figure 7C:
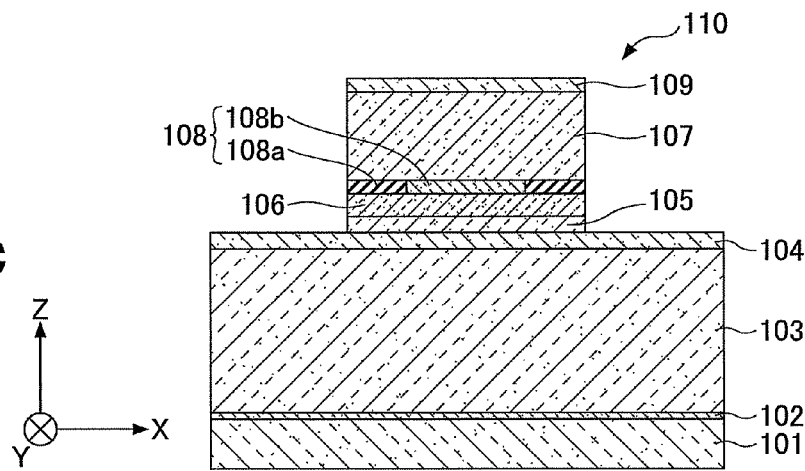

Next, the stacked product is thermally treated with steam as illustrated in FIG. 7C. With this thermal treatment, Al (aluminum) contained in the current constricting layer 108 is selectively oxidized from the periphery of the current constricting layer 108, which corresponds to a side surface of the mesa 110. Thus, the current constricting layer 108 includes the selective oxidation region 108a formed in the periphery of the current constricting layer 108 and the unoxidized current constricting region 108b formed in the center of the current constricting layer 108. A current constricting structure (oxidized constricting structure) is thus formed such that a region in which a current path is formed in the active layer 105 is limited to the central portion of the mesa 110. That is, a current flows in the unoxidized current constricting region 108b, however, does not flow in the selective oxidation region 108a. With this configuration, a current may selectively be caused to flow in the central portion of the mesa 110. The current constricting region 108b may be formed in an approximately square shape having a width range of 4 to 6 μm.

Figure 8A:
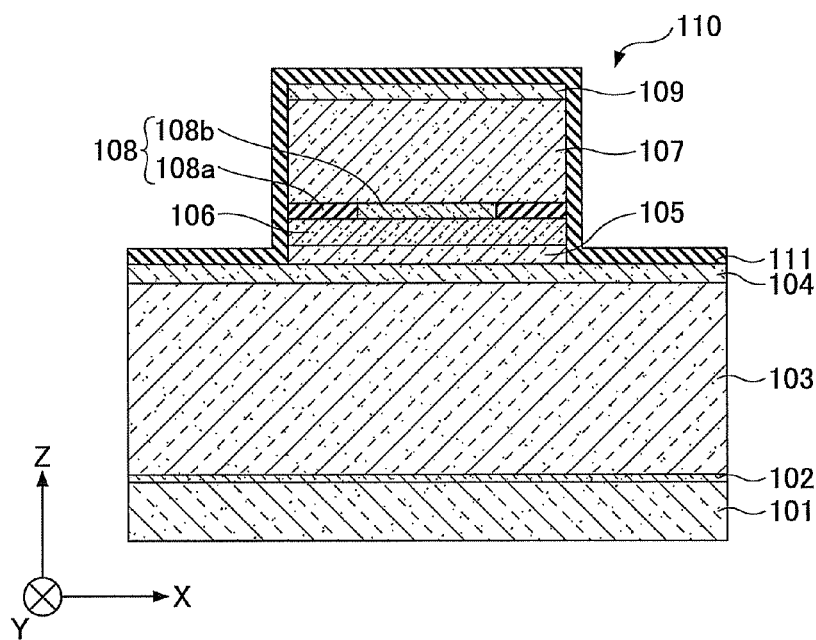
FIGS. 8A and 8B are second process diagrams illustrating the method for fabricating the first example of the surface-emitting laser according to the first embodiment.

Next, the protection layer 111 made of SiN is formed by chemical vapor deposition (CVD), as illustrated in FIG. 8A. In this embodiment, the protection layer 111 has an optical thickness of $\lambda/4$. Specifically, since a refractive index n of SiN is 1.86 and an oscillation wavelength $\lambda$ of SiN is 780 nm, the actual film thickness ($=\lambda/4$ n) of the protection layer 111 is determined as approximately 105 nm. Note that the protection layer 111 may be formed of a silicon oxide film or a silicon oxynitride film other than a SiN film.

Figure 8B:
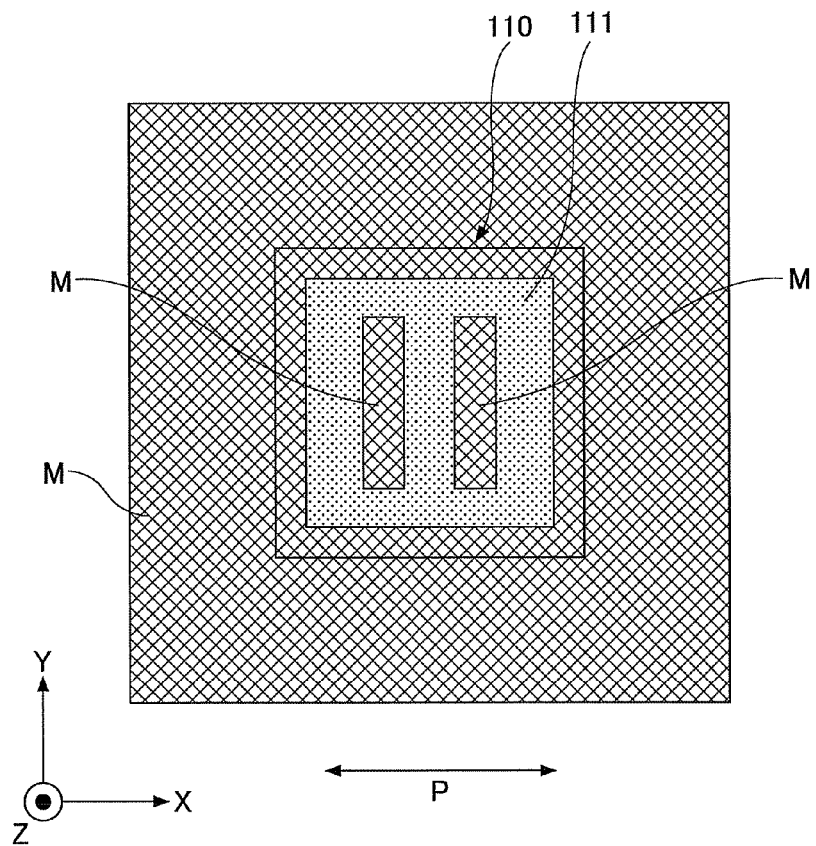
Figure 9:
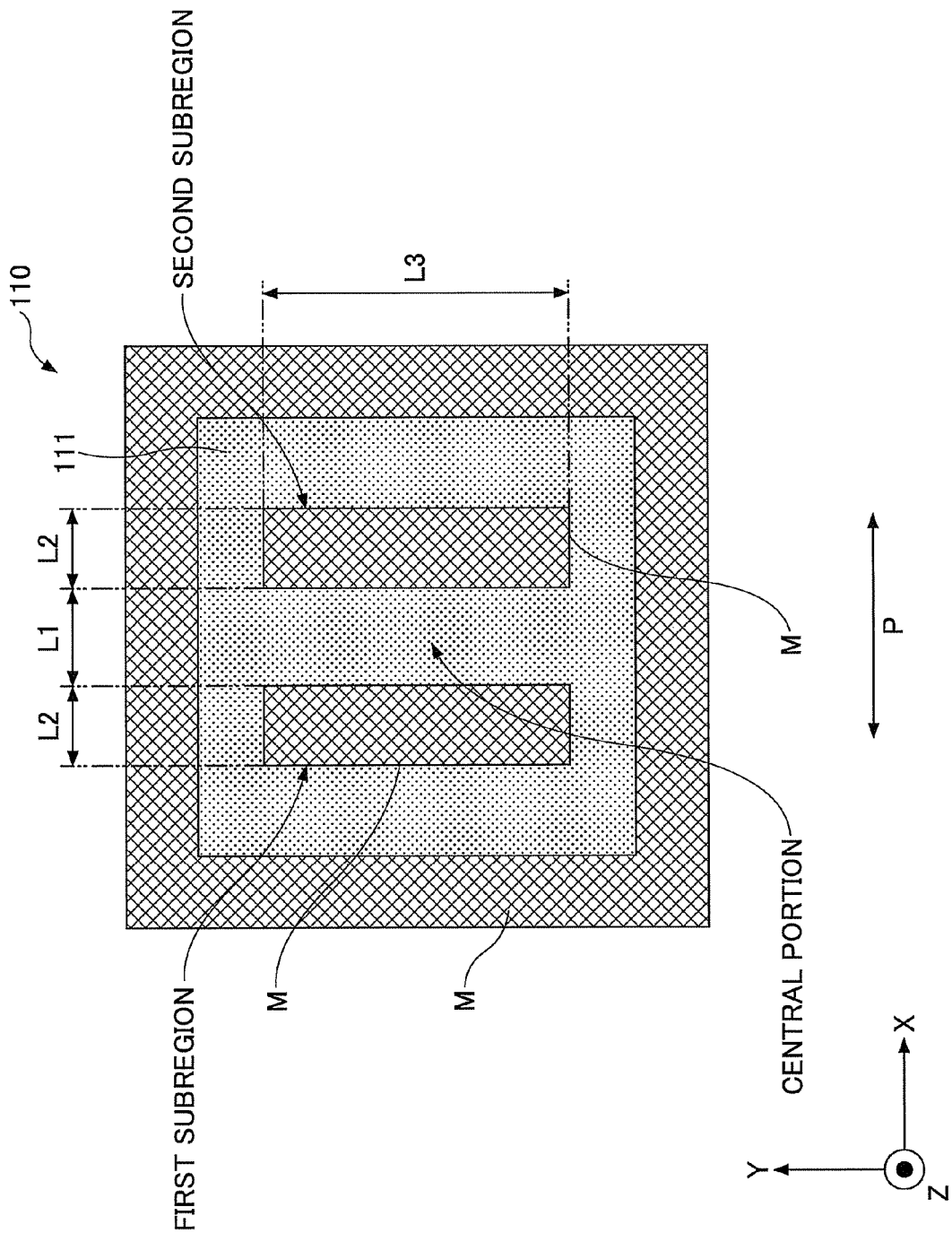
FIG. 9 is an enlarged diagram illustrating an upper surface of a mesa in FIG. 8B.

Subsequently, etching masks (hereinafter simply called a "mask M") are formed on the upper portion of the mesa 110, which is an emission surface of the laser light, to form an opening for the p-side electrode contact, as illustrated in FIG. 8B. In this process, the masks are formed in the periphery of the mesa 110, in the periphery of the upper surface of the mesa, and two subregions (i.e., first and second subregions) in the upper surface of the mesa such that these regions are not etched. The first subregion and second subregion have rectangular shapes that are extended in the Y-axis directions, and arranged such that the first subregion and second subregion mutually face in a direction in parallel with the desired polarization direction P (i.e., the X-axis direction in this case) via the central portion of the upper surface of the mesa. In the upper surface of the mesa, for example, an interval L1 between the first and second subregions (in the X-axis direction in parallel with the polarization direction P) is 5 μm, widths L2 of the first and second subregions are each 2 μm, and lengths L3 of the first and second subregions (in the Y-axis directions perpendicular to the polarization direction P) are each 8 μm, as illustrated in FIG. 9. Note that FIG. 9 is an enlarged diagram illustrating the upper surface of the mesa 110 in FIG. 8B. Note also that the masks M in this embodiment are formed of the resist pattern.

Next, the protection layer 111 is etched by buffered Hydrofluoric Acid (BHF) in regions where the masks M are not formed such that the protection layer 111 has an opening for the p-side electrode contact.

Figure 10A:
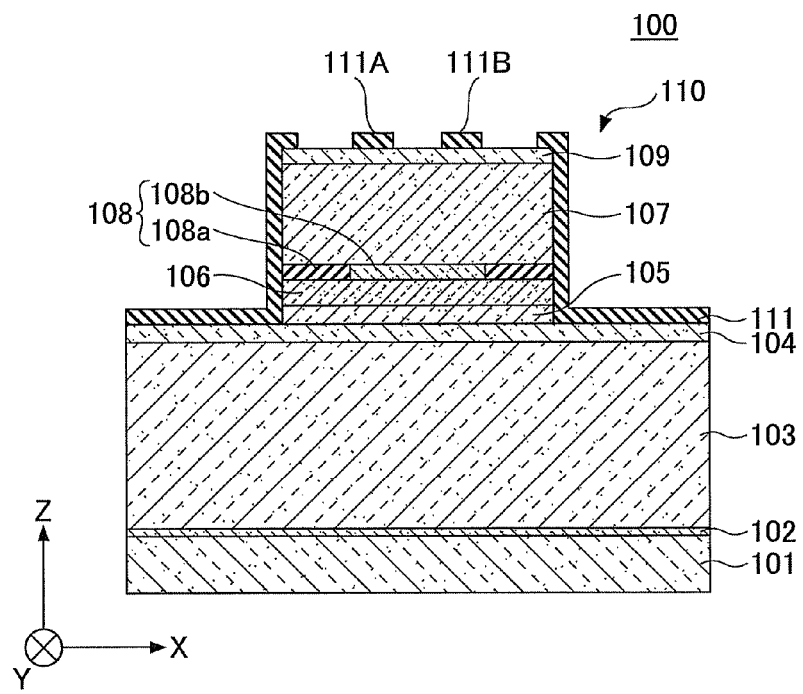
FIGS. 10A and 10B are third process diagrams illustrating the method for fabricating the first example of the surface-emitting laser according to the first embodiment.
Figure 10B:
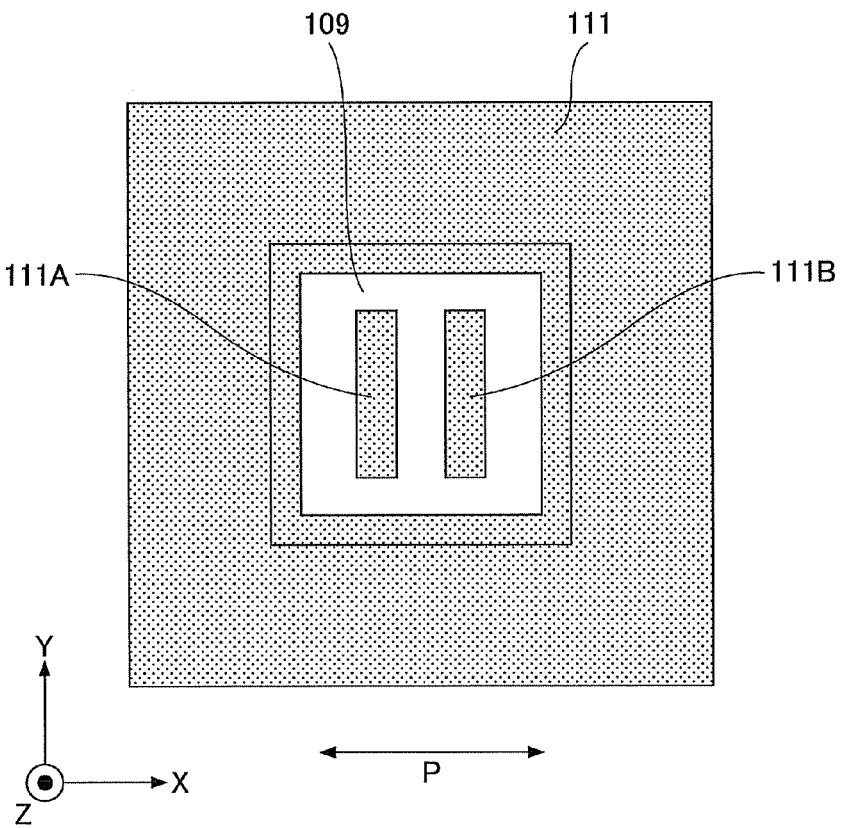

Subsequently, the photomasks M are removed as illustrated in FIGS. 10A and 10B. Note that FIG. 10A is a cross-sectional diagram illustrating an XZ plane of the surface-emitting laser 100, and FIG. 10B is a cross-sectional diagram illustrating an XY plane of the surface-emitting laser 100. As illustrated in FIG. 10B, a remaining portion (after etching) of the protection layer 111 in the first subregion is referred to as a "transparent layer 111A", and a remaining portion of the protection layer 111 in the second subregion is referred to as a transparent layer 111B. In the etching process, since the masks M are etched in a transverse direction while etching the protection layer 111, the transparent layers 111A and 111B have slanting side surfaces.

Next, a square resist pattern having 10 μm on a side is formed in a laser light-emitting portion (i.e., the opening in the metallic layer) of the upper surface of the mesa 110 and a p-side electrode material is then deposited in the laser light-emitting portion. Examples of the p-side electrode material include a multilayer film made of Cr/AuZn/Au or a multilayer film made of Ti/Pt/Au.

Figure 11:
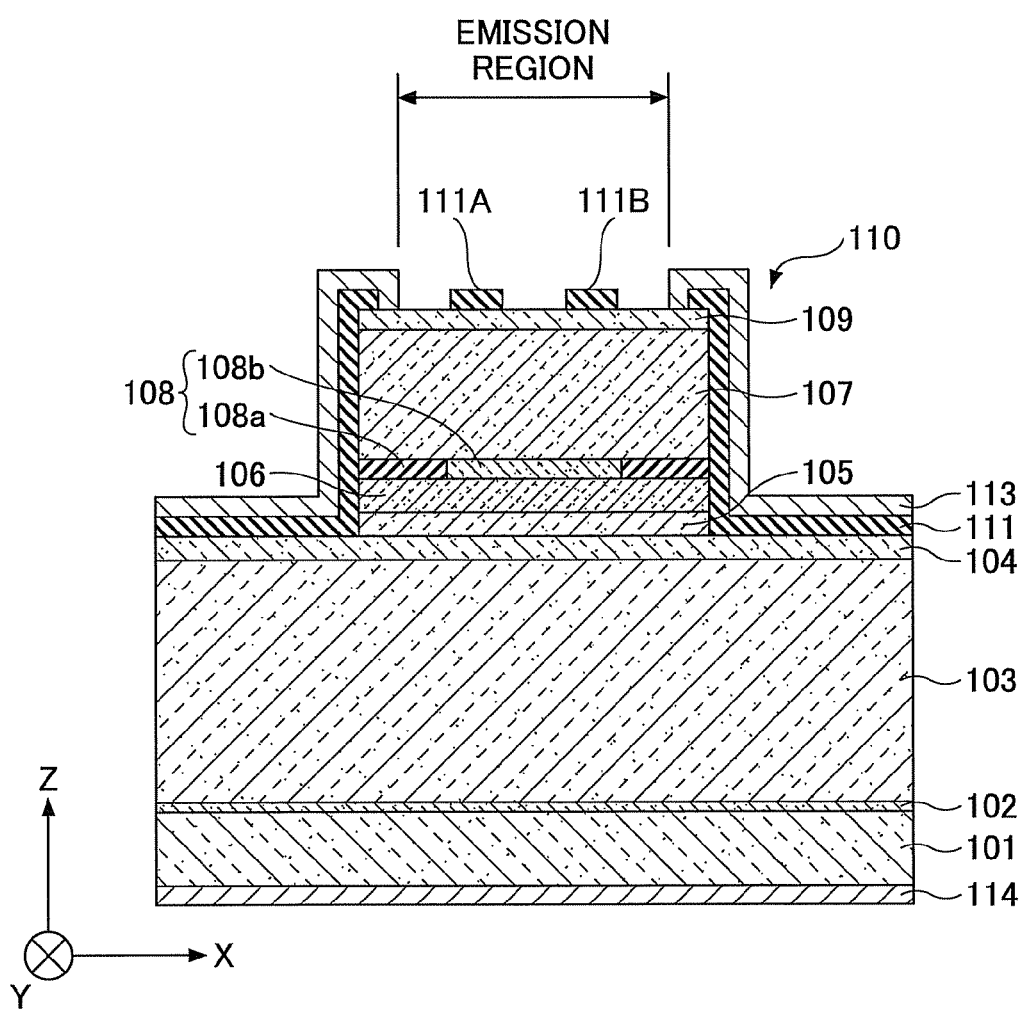
FIG. 11 is a fourth process diagram illustrating a method for fabricating the first example of the surface-emitting laser according to the first embodiment.
Figure 12:
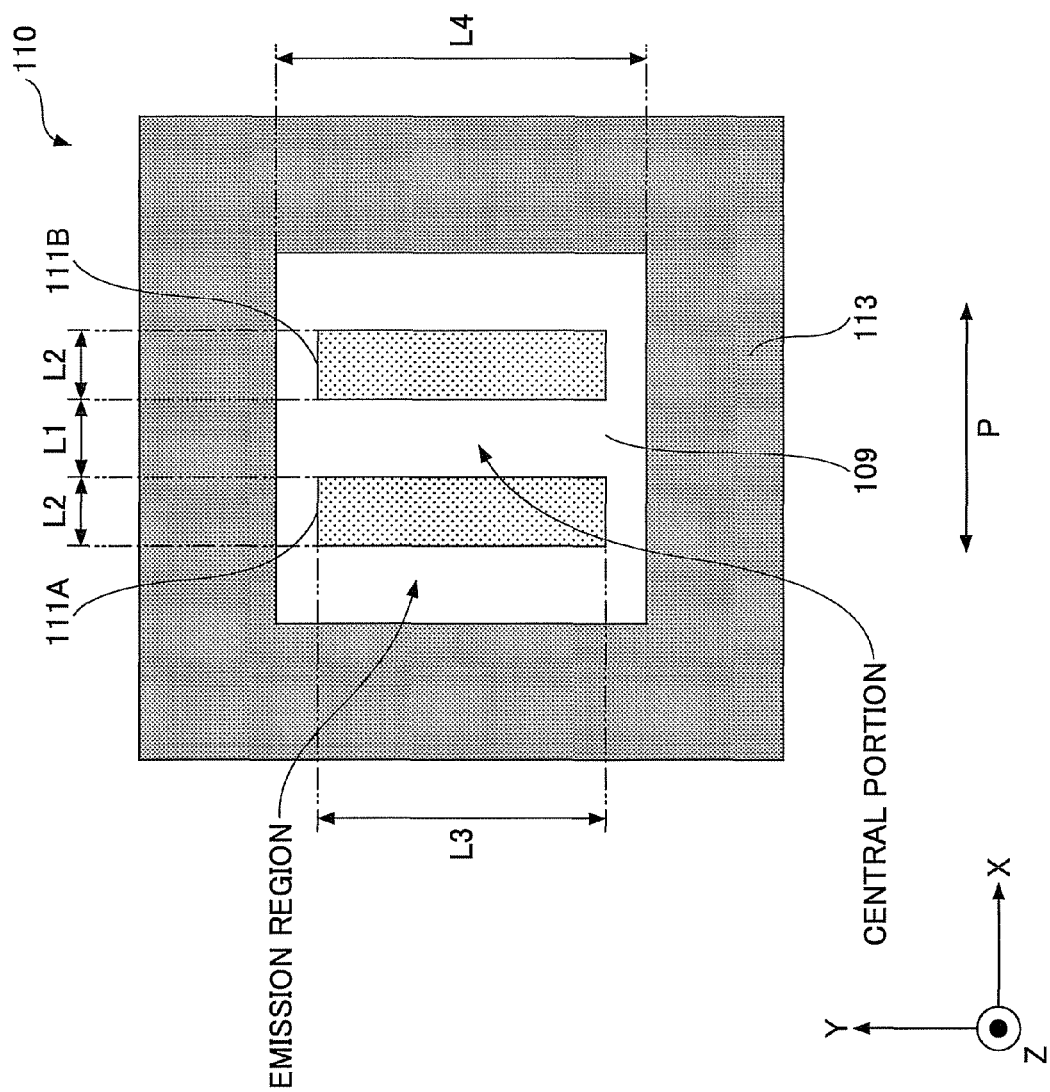
FIG. 12 is an enlarged diagram illustrating an upper surface of a mesa in FIG. 11.

Next, the electrode material deposited in the laser light-emitting portion (i.e., an emission region in FIG. 11) of the upper surface of the mesa 110 is lifted off so that a p-side electrode 113 is formed as illustrated in FIG. 11. The p-side electrode 113 includes a cross-sectional shape of a square tube and formed in the upper surface of the mesa 110. Note that the emission region corresponds to a region enclosed by the p-side electrode 113 having the cross-sectional shape of the square tube. Note that FIG. 12 is an enlarged diagram illustrating the upper surface of the mesa 110 in FIG. 11. The emission region has a square shape having a length L4 (e.g., 10 μm) on a side. In this embodiment, the transparent layers 111A and 111B are formed in the respective first and second subregions in the emission region as dielectric films made of SiN each having an optical thickness of $\lambda/4$. In this embodiment, the reflectance of the first and second subregions is lower than the central portion and the like of the emission region enclosed by the p-side electrode 113; that is, is lower than the region where the transparent layers 111A and 111B are not formed. Note that in this embodiment, the two subregions (i.e., the first and second subregions) having the reflectance lower than the central portion and the like of the emission region are also called "filter regions" or "filters".

Next, the rear surface of the substrate 101 is polished until the rear surface of the substrate 101 has a predetermined thickness (e.g., 100 μm), and the n-side electrode 114 is then formed on the polished rear surface of the substrate 101, as illustrated in FIG. 11. In this embodiment, the n-side electrode 114 is formed of a multilayer film made of AuGe/Ni/Au.

Subsequently, ohmic conductivities of the p-side electrode 113 and the n-side electrode 114 are obtained by annealing. Thus, the surface-emitting laser 100 having the mesa 110 as an emitting portion is formed.

Next, a surface-emitting laser array chip 40 is obtained by dicing the surface-emitting laser array chips 40 each having two-dimensionally arranged surface-emitting lasers 100 into chips.

Thus, the surface-emitting laser 100 having the X-axis direction as a polarization direction P is fabricated. The thus formed surface-emitting laser 100 has the X-axis direction as the polarization direction P, because the central region having high reflectance where the transparent layers 111A and 111B are not formed has a length L1 (i.e., an interval between the transparent layers 111A and 111B) in the X-axis direction shorter than the length L4 in the Y-axis direction. That is, a shorter one of the lengths in the X-axis direction and the Y-axis direction of the region having high reflectance is determined as the polarization direction P.

(Modification)

Next, Shapes of the Filters Formed in the First and second subregions are described. In the above embodiment, the first and second subregions have rectangular shapes extended in the Y-axis directions; however, the shapes of the first and second subregions are not limited to the rectangular shapes.

For example, if the desired polarization direction P is determined as the Y-axis direction as illustrated in FIG. 13, the shapes of the first and second subregions have rectangular shapes extended in the X-axis directions. That is, the transparent layers 111A and 111B are formed such that the transparent layers 111A and 111B have rectangular shapes extended in the X-axis directions.

Figure 14:
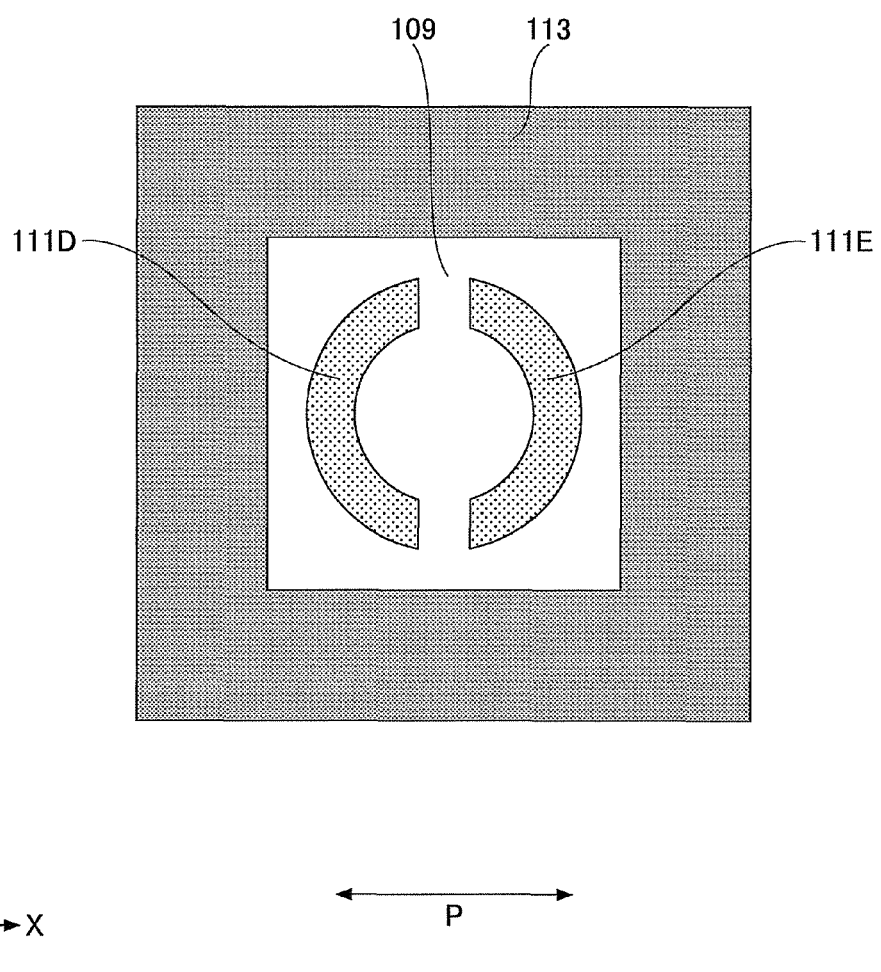
FIG. 14 is a second explanatory diagram illustrating the second example of the surface-emitting laser according to the first embodiment.

Further, if the desired polarization direction P is determined as the X-axis direction as illustrated in FIG. 14, the shapes of the first and second subregions have semicircular shapes, and semicircular transparent layers 111D and 111E are formed such that inside and outside of the semicircular transparent layers 111D and 111E are connected in the Y-axis direction. That is, the semicircular transparent layers 111D and 111E are formed such that a ring-shape formed by the semicircular transparent layers 111D and 111E is cut along the Y-axis direction.

Figure 15:
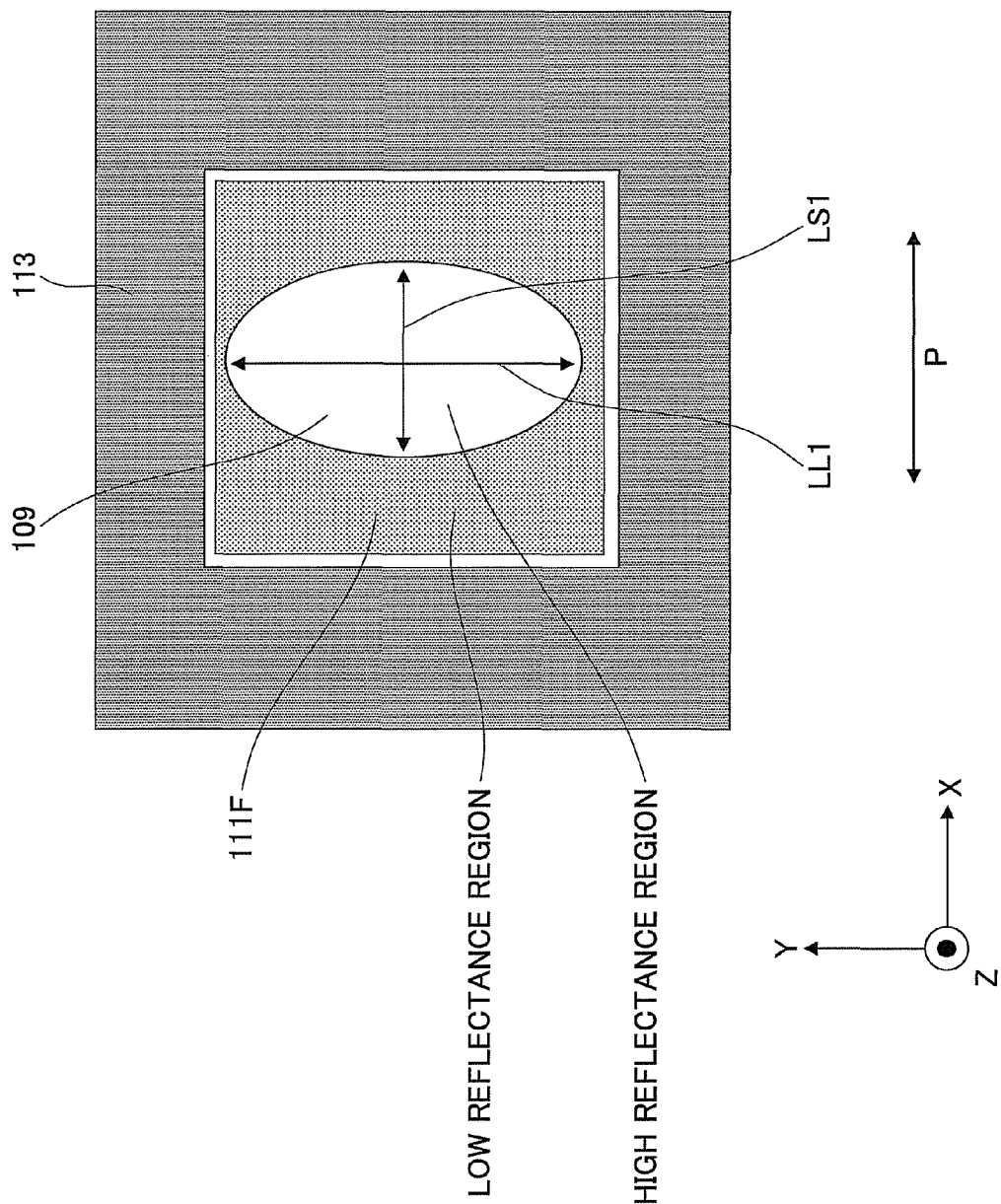
FIG. 15 is a third explanatory diagram illustrating the second example of the surface-emitting laser according to the first embodiment.

Moreover, if the desired polarization direction P is determined as the X-axis direction as illustrated in FIG. 15, a transparent layer 111F having an oval opening is formed in a central portion of the p-side electrode 113. Note that the oval opening of the transparent layer 11F includes a major diameter (i.e., a long diameter) LL1 in the Y-axis direction and a minor axis (i.e., a short diameter) LS1.

Figure 16:
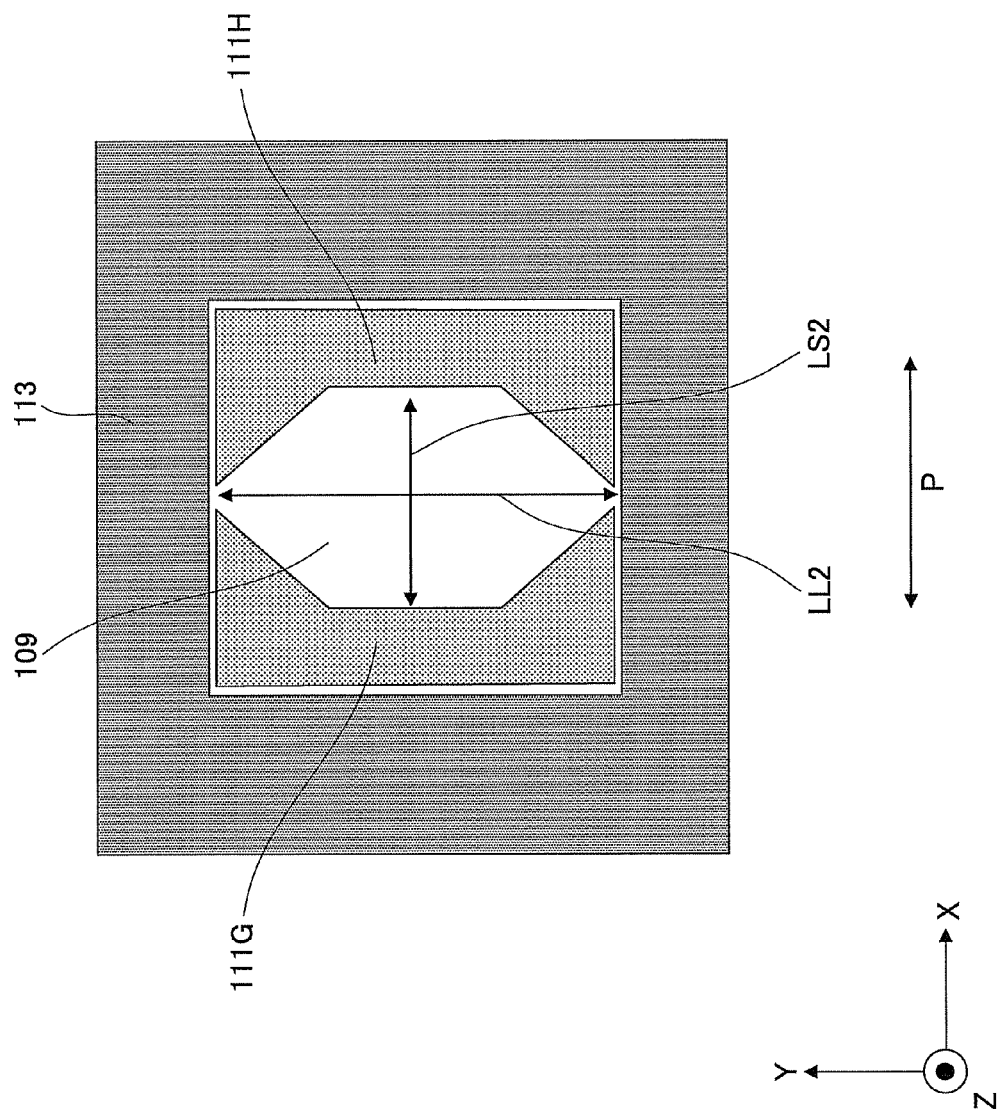
FIG. 16 is a fourth explanatory diagram illustrating the second example of the surface-emitting laser according to the first embodiment.

Further, if the desired polarization direction P is determined as the X-axis direction as illustrated in FIG. 16, transparent layers 111G and 111H having a hexagonal opening between the transparent layers 111G and 111H are formed in the central portion of the p-side electrode 113. Note that the transparent layers 111G and 111H are formed in the central portion of the p-side electrode 113 such that the hexagonal opening between the transparent layers 111G and 111H includes a length LL2 in the Y-axis direction longer than a length LS2 in the X-axis direction.

Figure 17:
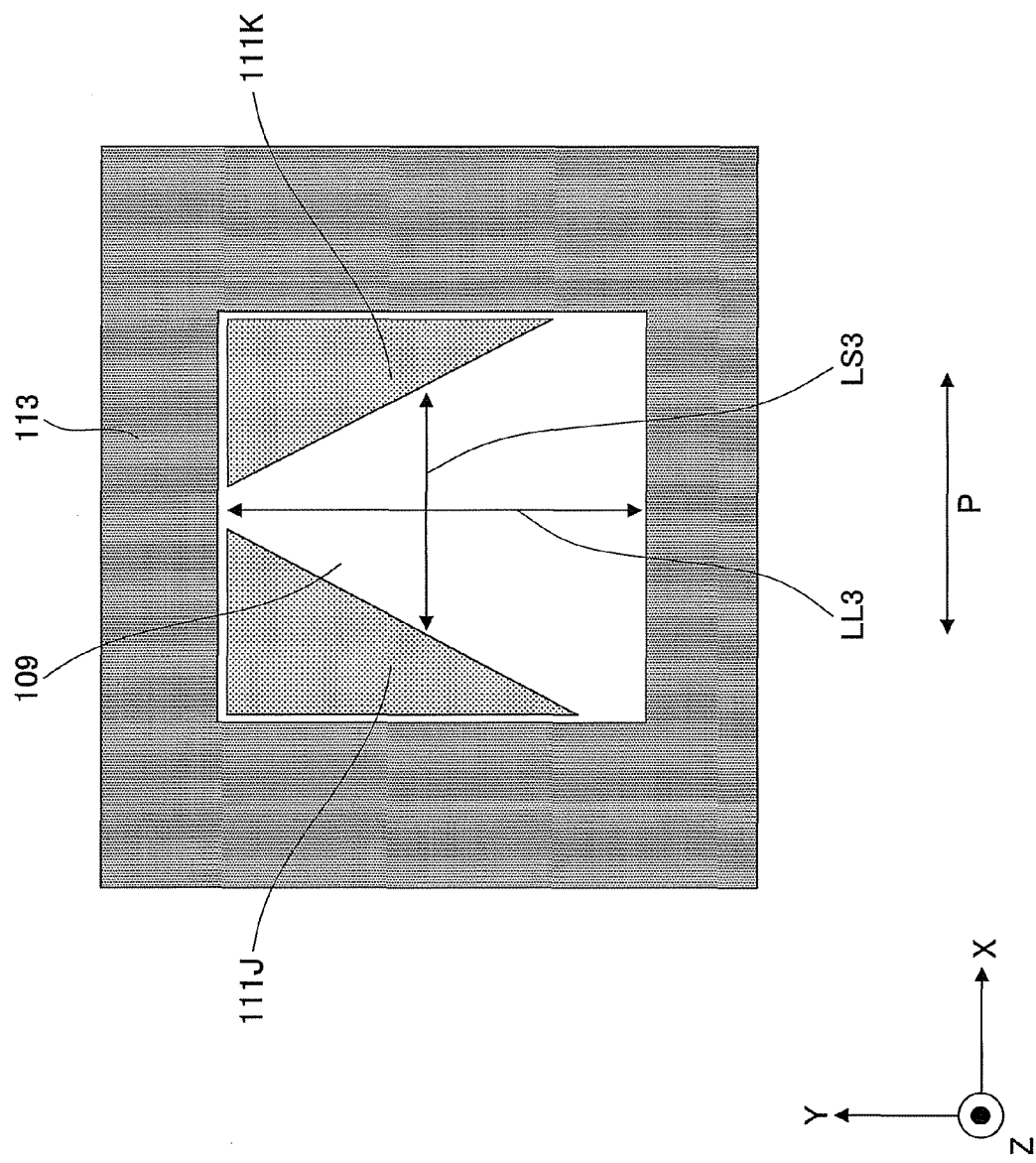
FIG. 17 is a fifth explanatory diagram illustrating the second example of the surface-emitting laser according to the first embodiment.

Moreover, if the desired polarization direction P is determined as the X-axis direction as illustrated in FIG. 17, triangular transparent layers 111J and 111K are formed at respective two corners of the p-side electrode 113. Note that the triangular transparent layers 111J and 111K are formed at the respective two corners of the p-side electrode 113 such that a length LL3 in the Y-axis direction of a high reflectance region where the triangular transparent layers 111J and 111K are not formed is longer than a length LS3 in the X-axis direction of the high reflectance region.

Figure 18:
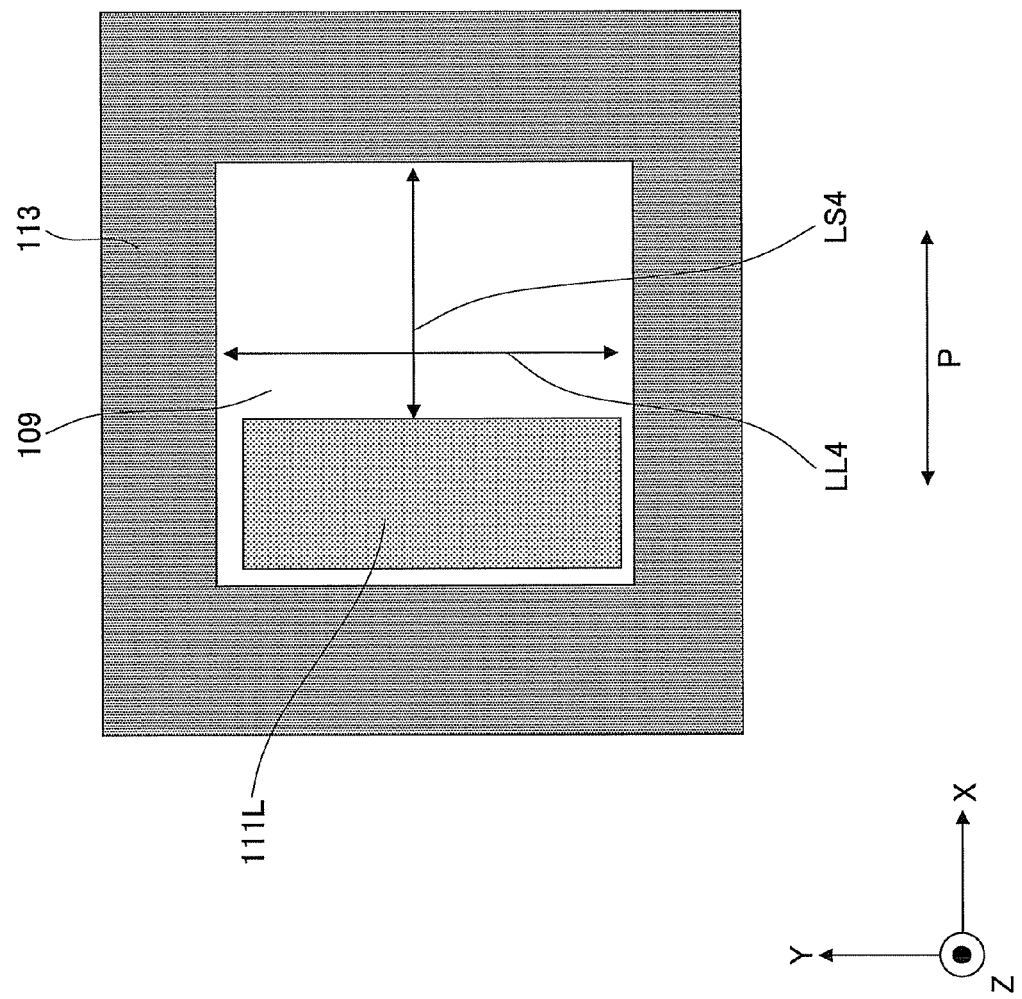
FIG. 18 is a sixth explanatory diagram illustrating the second example of the surface-emitting laser according to the first embodiment.

Further, if the desired polarization direction P is determined as the X-axis direction as illustrated in FIG. 18, a rectangular transparent layer 111L having a longitudinal axis in the Y-axis direction is formed along a side of the p-side electrode 113. Note that the rectangular transparent layer 111L is formed such that a length LL4 in the Y-axis direction of the high reflectance region where the rectangular transparent layer 111L is not formed is longer than a length LS4 in the X-axis direction of the high reflectance region. Accordingly, the X-axis direction is formed as the polarization direction P.

Figure 19:
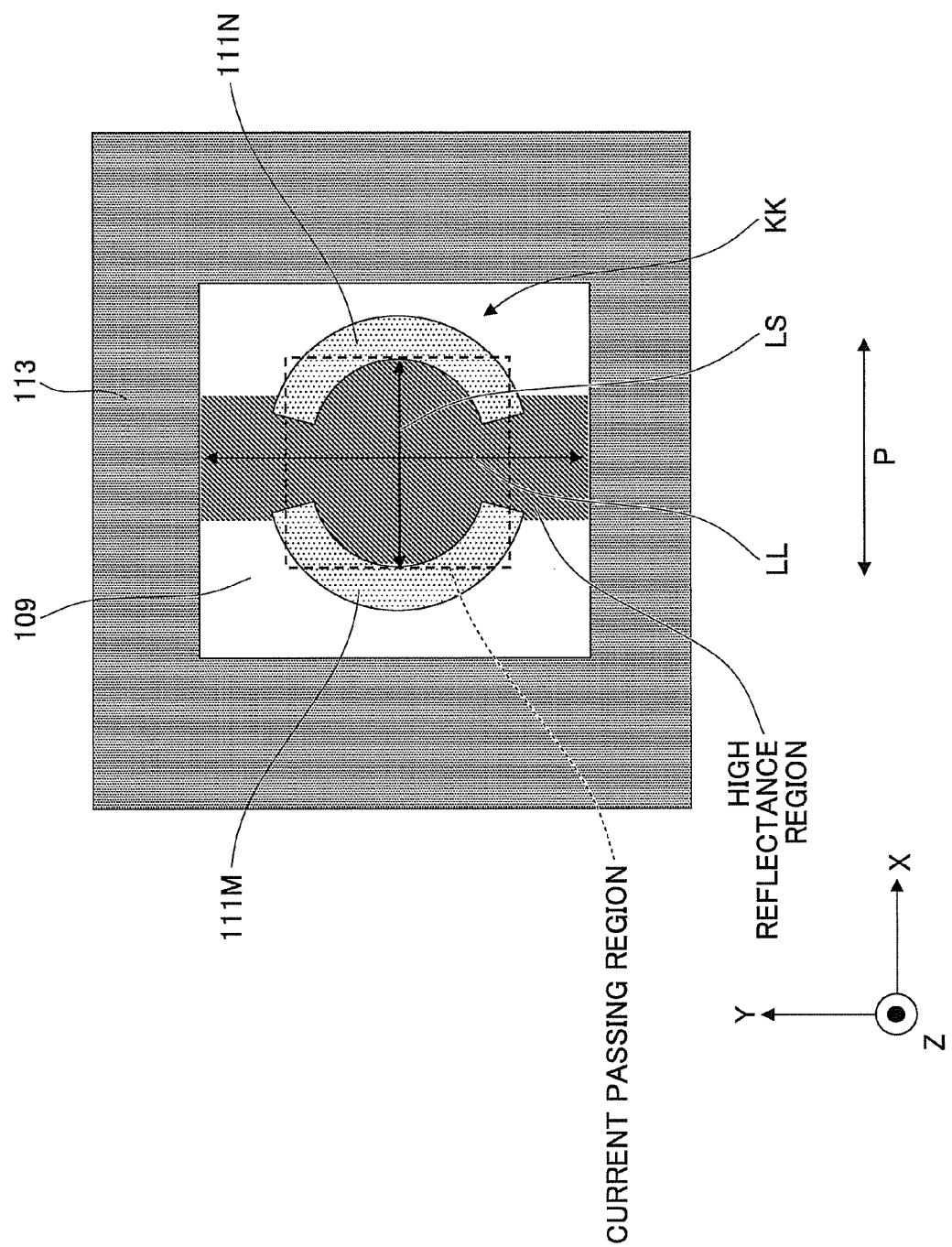
FIG. 19 is a seventh explanatory diagram illustrating the second example of the surface-emitting laser according to the first embodiment.

As illustrated in FIG. 19, if low reflectance regions 111M and 111N are formed in the emission region, the high reflectance region is formed in a region indicated by a shaded area in FIG. 19. The shaded region indicating the high reflectance region excludes the low reflectance regions formed of the first and second subregions. Peripheral portions of the first and second subregions indicated by KK (or KK portions) in FIG. 19 are also excluded from the high reflectance region. An oscillation mode in which the laser light oscillates in the current constricting region only spreads in the vicinity of the current constricting region. Thus, as illustrated in FIG. 19, an area in which the oscillation mode spreads appears to be in the high reflectance region, and the KK portions excluding the first and second subregions may be distant from the current constricting region so that the KK portions may have little effect on the oscillation mode. Note that a microstructure of the surface-emitting laser may not provide a significant effect on the laser light insofar as the microstructure is the wavelength level. Accordingly, the microstructure is defined as the structure on the order of several hundred nm or more. Thus, the high reflectance region may be defined as described above and the longitudinal axis and the short axis in the high reflectance region may also be defined.

Figure 20:
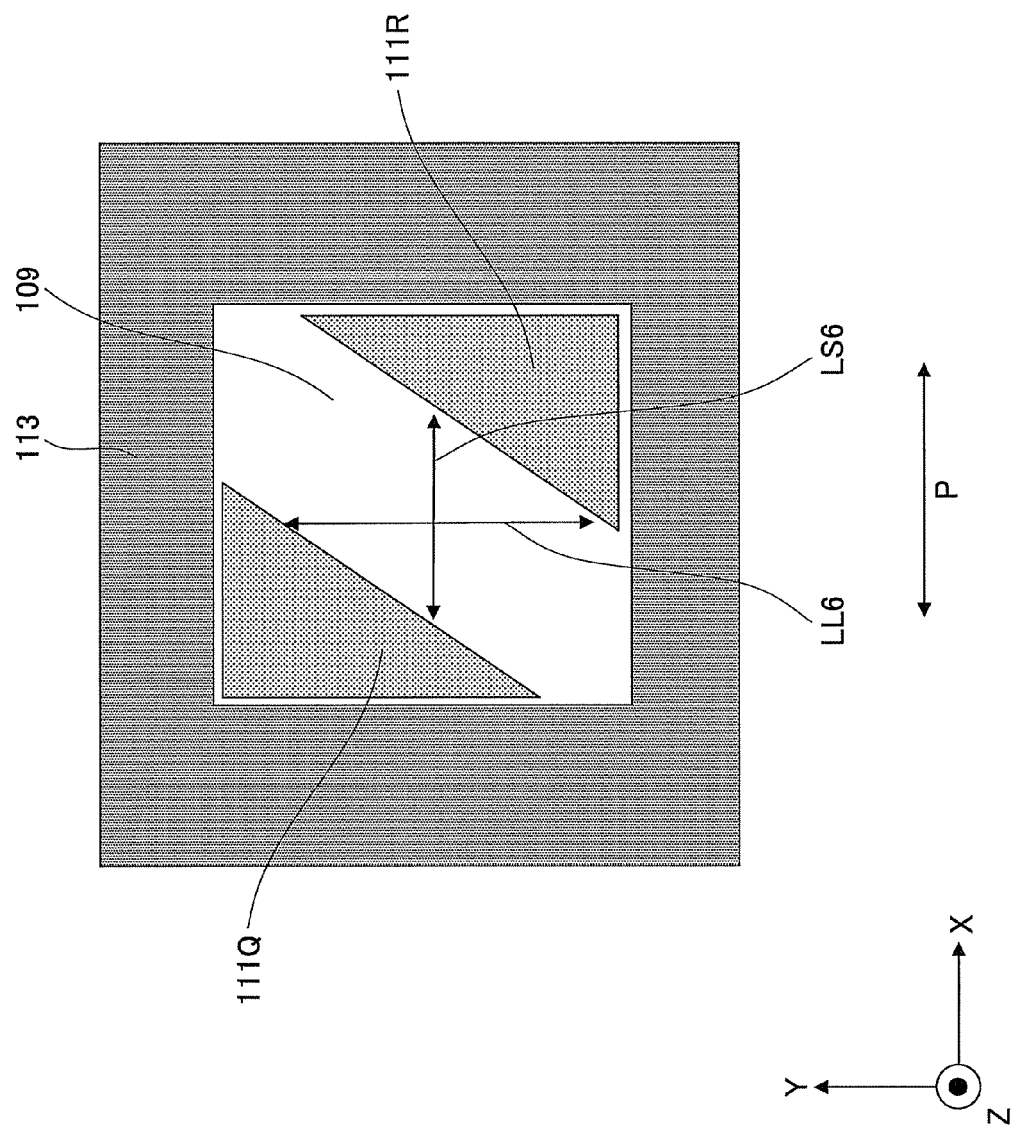
FIG. 20 is an eighth explanatory diagram illustrating the second example of the surface-emitting laser according to the first embodiment.

Further, if the desired polarization direction P is determined as the X-axis direction as illustrated in FIG. 20, triangular transparent layers 111Q and 111R are formed at respective two diagonally faced corners of the p-side electrode 113. Note that the triangular transparent layers 111Q and 111R are formed at the respective two diagonally faced corners of the p-side electrode 113 such that a length LL6 in the Y-axis direction of the high reflectance region where the triangular transparent layers 111Q and 111R are not formed is longer than a length LS6 in the X-axis direction of the high reflectance region.

Note that the transparent layers 111C, 111D, 111E, 111F, 111G, 111H, 111J, 111K, 111L, 111M, 111N, 111Q, and 111R are formed of the same material of the transparent layers 111A and 111B, and have the same optical thickness of the transparent layers 111A and 111B.

In the description of the above embodiment, the transparent layers 111A and 111B have the same material as the protection layer 111; however, the material of the transparent layers 111A and 111B may not be limited to the material of the protection layer 111.

Figure 21A:
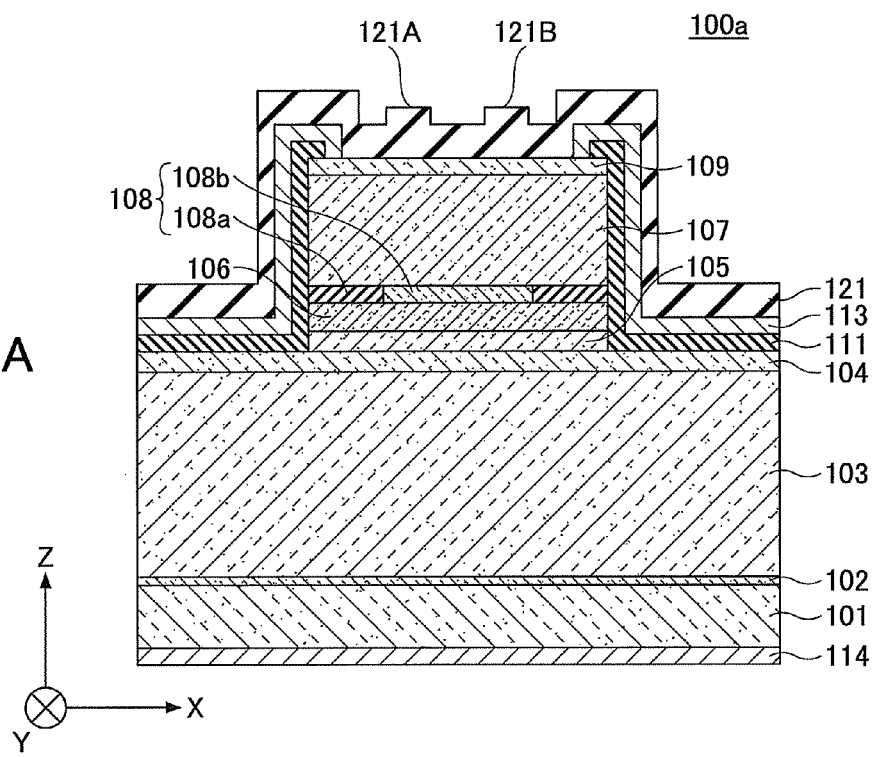
FIGS. 21A and 21B are ninth explanatory diagrams illustrating the second example of the surface-emitting laser according to the first embodiment.
Figure 21B:
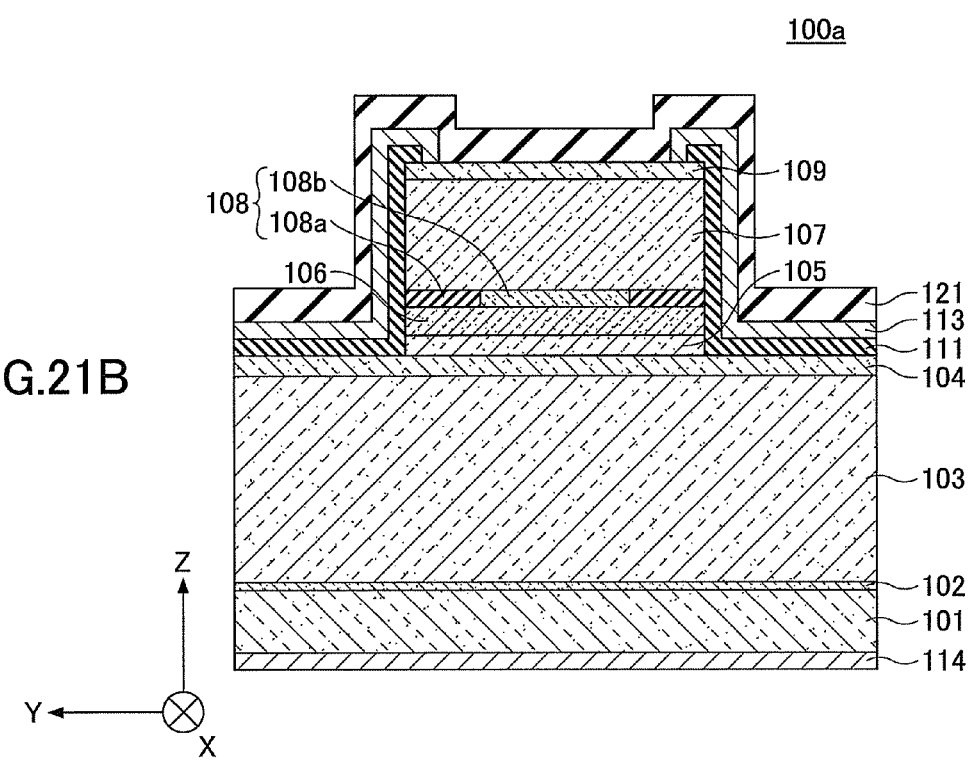

Further, in the description of the above embodiment, the optical thicknesses of the transparent layers 111A and 111B are $\lambda/4$; however, the optical thicknesses of the transparent layers 111A and 111B may not be limited to $\lambda/4$. For example, a surface-emitting laser 100a having transparent layers 121A and 121B may have an optical thickness of $3\lambda/4$ by forming a protection layer 121 in a region where the transparent layers 121A and 121B are formed as illustrated in FIGS. 21A and 21B. That is, the surface-emitting laser 100a may provide the similar effect obtained by the surface-emitting laser 100 if the optical thickness is an odd multiple of $\lambda/4$ in a region where the transparent layers 111A and 111B are formed or in a region where the transparent layers 121A and 121B are formed. Note that FIG. 21A is a cross-sectional diagram illustrating an XZ plane of the surface-emitting laser 100a, and FIG. 21B is a cross-sectional diagram illustrating a YZ plane of the surface-emitting laser 100a.

Figure 22A:
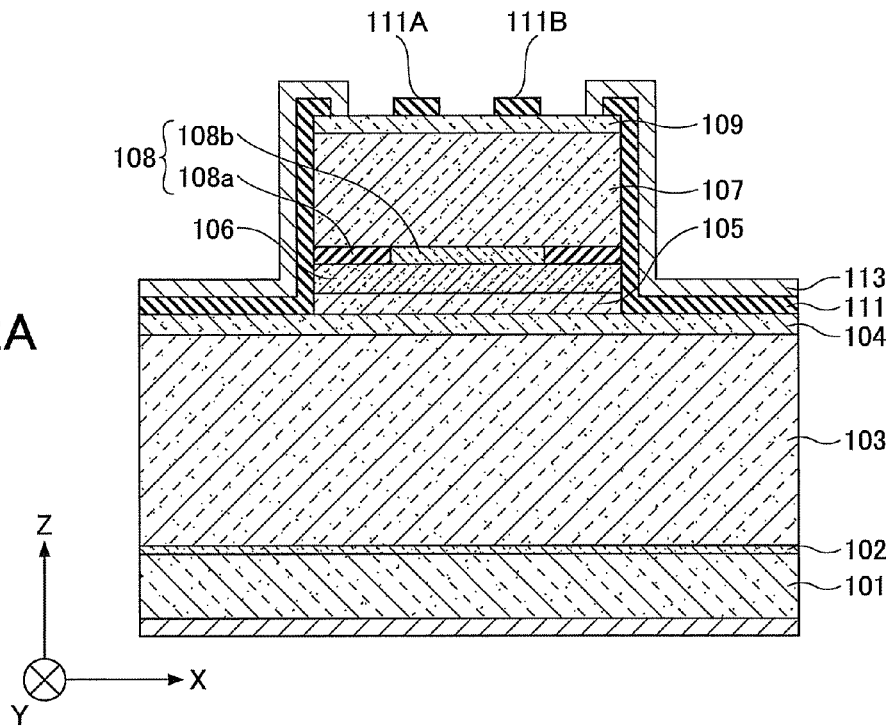
FIGS. 22A and 22B are first process diagrams illustrating a method for fabricating the second example of the surface-emitting laser according to the first embodiment illustrated in FIGS. 21A and 21B.
Figure 22B:
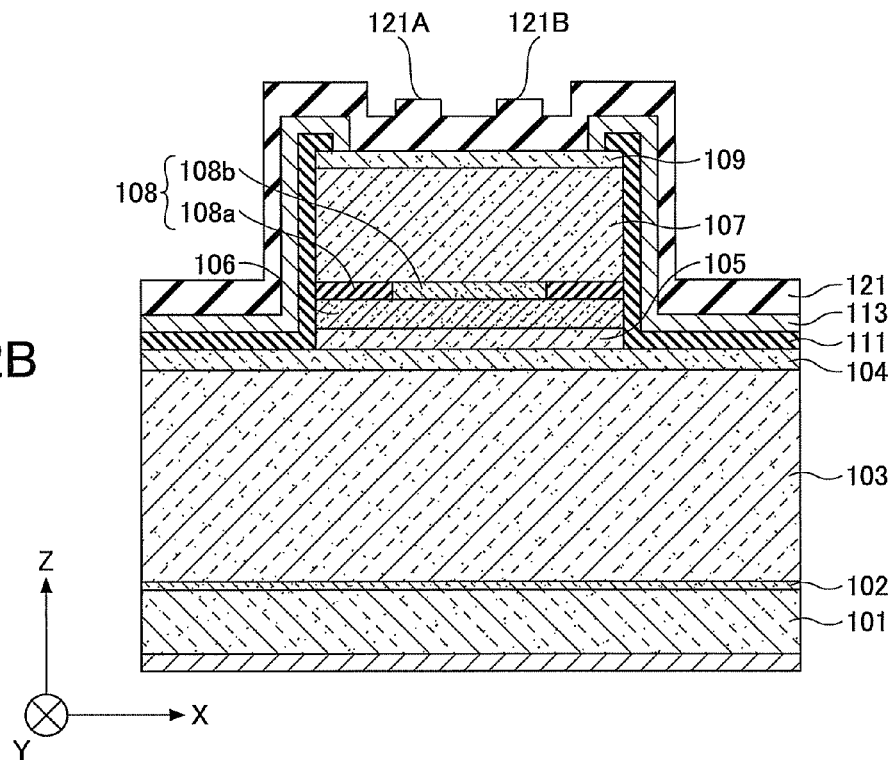
Figure 23:
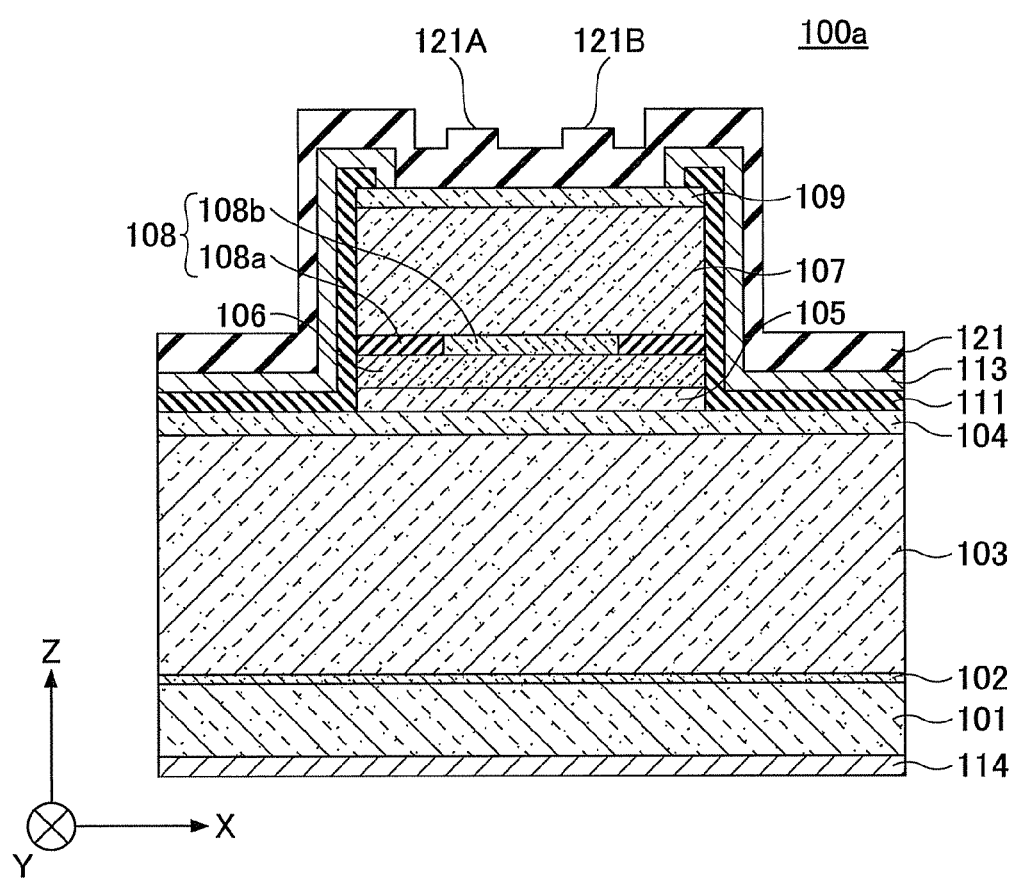
FIG. 23 is a second process diagram illustrating the method for fabricating the second example of the surface-emitting laser according to the first embodiment illustrated in FIGS. 21A and 21B.

Next, a fabrication method of the surface-emitting laser 100a is described with reference to FIGS. 22A to 23. Specifically, as illustrated in FIG. 22A, a p-side electrode 113 is formed in the similar manner as described in the fabrication of the surface-emitting laser 100, and a protection layer 121 made of SiN is subsequently formed by chemical vapor deposition (CVD) such that the optical thickness of the protection layer 121 is $2\lambda/4$ as illustrated in FIG. 22B. That is, since a refractive index n of SiN is 1.86 and an oscillation wavelength $\lambda$ of SiN is 780 nm, the actual film thickness ($=2\lambda/4n$) of the protection layer 121 is determined as approximately 210 nm. Subsequently, the rear surface of the substrate 101 is polished until the rear surface of the substrate 101 has a predetermined thickness (e.g., 100 μm), and the n-side electrode 114 is then formed on the polished rear surface of the substrate 101, as illustrated in FIG. 23. Thus, the surface-emitting laser 100a having the transparent layers 121A and 121B having the optical thickness of 3λ/4 is fabricated.

Note that the central portion of the emission region is coated with the protection layer (i.e., dielectric film) 121 having the optical thickness of 2λ/4. Further, the peripheral portions of the emission region excluding the two subregions (i.e., first and second subregions) are coated with the protection layer (i.e., dielectric film) 121 having the optical thickness of 2λ/4. With this configuration, the reflectance of the peripheral portions is partially lower than that of the central portion in the emission region.

Further, since the entire emission surface of the surface-emitting element 100a is coated with the protection layer (i.e., dielectric film) 121, oxidation and contamination of the emission surface may be suppressed. Note that the central portion of the emission region is coated with the protection layer (i.e., dielectric film) 121. However, since its optical thickness is an even multiple of the λ/2, the reflectance of the central portion may not be lowered. Thus, optical properties similar to those without the protection layer (i.e., dielectric film) 121 may be obtained.

(Evaluation of Properties of Surface-Emitting Laser Module)

Figure 24A:
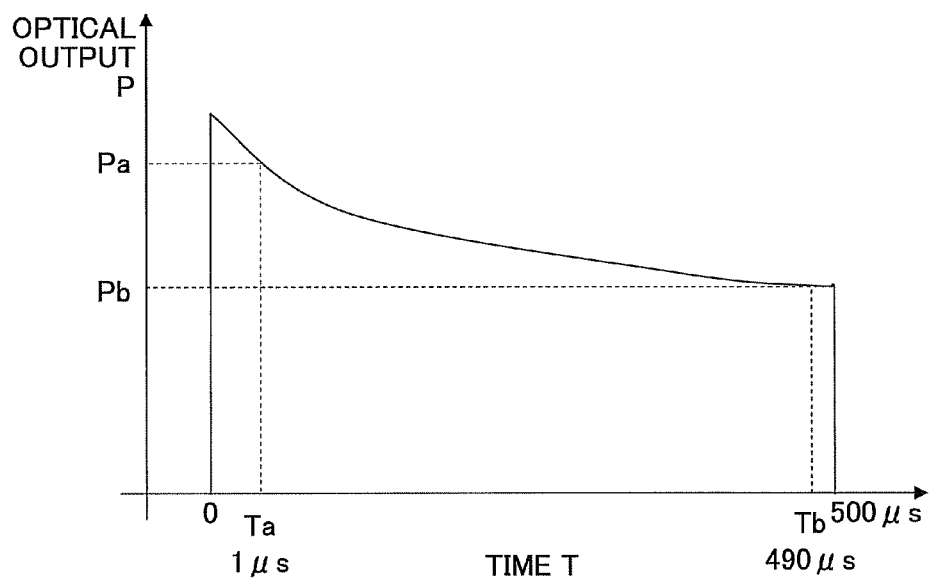
FIGS. 24A and 24B are characteristic diagrams illustrating an optical output of the surface-emitting laser.
Figure 24B:
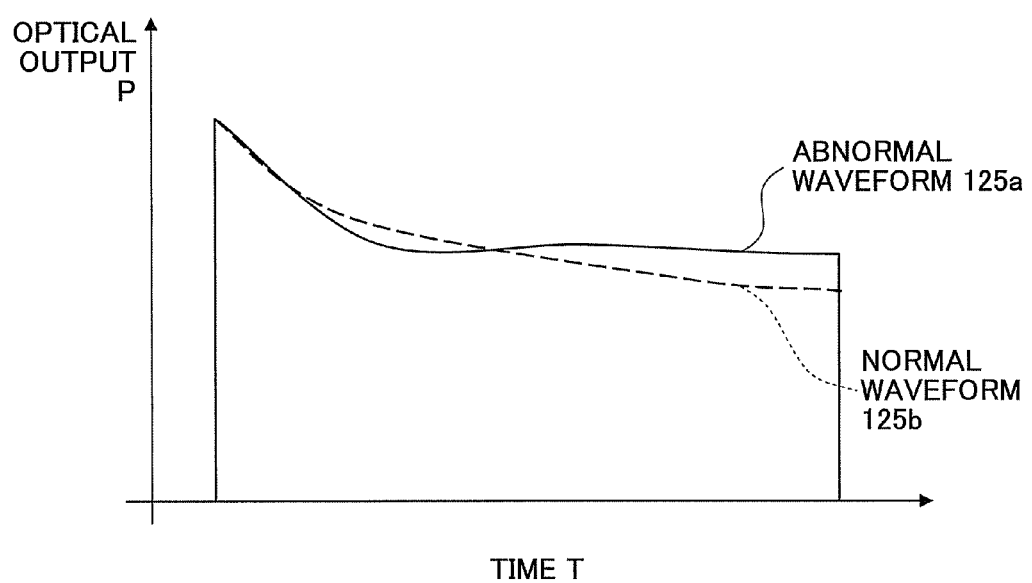

Next, properties of the surface-emitting laser module formed of the above-described surface-emitting lasers are described. The properties of the surface-emitting laser module and the illuminant unit (i.e., the light source) were evaluated by utilizing an optical system simulating the structure of the illuminant unit including the surface-emitting laser module illustrated in FIG. 1. The properties of the surface-emitting laser module are determined based on the amount of emitted light detected by a photodiode (PD). An ideal waveform to be obtained is illustrated in FIG. 24A. However, if the emitted light is affected by the feedback light, the amount of emitted light may become unstable and fluctuate. FIG. 24B schematically illustrates a comparison between an abnormal waveform 125a due to the light fluctuation and a normal waveform 125b without the light fluctuation. As illustrated in FIG. 24B, the abnormal waveform 125a generally includes an inflecting portion in, but not limited to, a front portion of the waveform, and the abnormal waveform 125a may also include the inflecting in a rear portion of the waveform. Further, the abnormal waveform 125a may also appear, for example, when the frequency of the waveform is 1 kHz or several hundred kHz to cause the wave fluctuation. In particular, if the waveform of 1 kHz is determined as a standard for stably drawing one line that is desirable for an image forming apparatus, the stability may be affected by the fluctuation of about 5%, depending on types of the image forming apparatuses. Here, as properties desirable for the image forming apparatus, a method for quantifying property values desirable for the image forming apparatus is described. The property values desirable for the image forming apparatus are parameters for evaluating the laser light fluctuation based on heat and generally used as droop values. Specifically, the difference between the amount of laser light in a laser rise time period and the amount of laser light in a period sufficiently elapsed from the laser rise time is obtained, as illustrated in FIG. 24A. Note that FIG. 24A illustrates the waveform having the duty rate of 50% at 1 KHz as one example.

$$Dr=(Pa-Pb)/Pa$$

Pa: optical output in time Ta
Pb: optical output in time Tb
Dr obtained by the above equation indicates a droop value. In this embodiment, the duty rate is 50% at 1 kHz, Ta is a position of 1 μs at 1 kHz, and Tn is a position of 490 μs. An optical output is 1.4 mW, and a measuring temperature is set at 25° C. The optical output and the measuring temperature are used as examples in this embodiment and not limited to the above values. The condition including the above frequency, the duty rate, and Ta and Tb may be necessary for the image forming apparatus to form high precision images.

If a surface-emitting laser array is formed of plural surface-emitting lasers arranged in array form and the droop values of the surface-emitting lasers are not matched, the visual quality of the images may be severely degraded. The difference between the maximum droop value and the minimum droop value (the difference is hereinafter called "variability") may need to be reduced as one of the properties of such a surface-emitting laser array. However, the variability is increased with the generation of the abnormal waveform 125a (see FIG. 24B). Thus, the following condition needs to be satisfied for the variability of the droop values.

Droop variability (%)=$Dr(\max)-Dr(\min)$

Dr(max): Maximum Dr value among those of the elements
Dr(min): Minimum Dr value among those of the elements
If an image is formed while the droop variability in the above condition exceeds 3%, the visual quality of the image may be drastically degraded. The image degradation obtained due to a large droop value of one element may similarly be observed in the surface-emitting laser array having the plural laser elements.

(Surface-Emitting Laser Module)

Next, the surface-emitting laser module according to the first embodiment is described with reference to FIGS. 25A to 25B. The surface-emitting laser module according to the first embodiment indicates the surface-emitting laser 100 having the mesa 110 that includes the rectangular transparent layers 111A and 111B formed in the upper part of the mesa 110 and the X-axis direction as the polarization direction P. Specifically, in the high reflectance region in the upper portion of the mesa 110 of the surface-emitting laser 100, the transparent layers 111A and 111B are formed such that an interval LL7 between the transparent layers 111A and 111B in the Y-axis direction is longer than an interval LS7 between the transparent layers 111A and 111B in the X-axis direction. Accordingly, the polarization direction P corresponds to the X-axis direction.

Figure 25A:
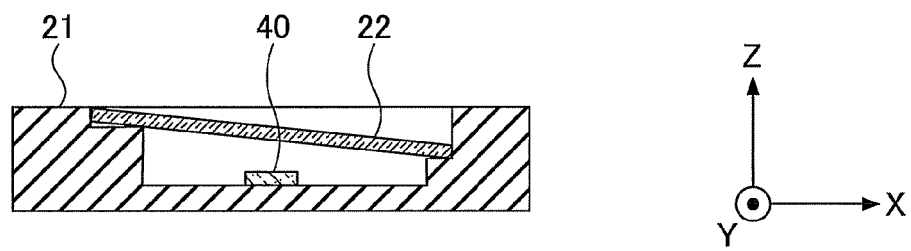
FIGS. 25A and 25B are configuration diagrams illustrating a surface-emitting laser module according to the first embodiment.

The surface-emitting laser array chip 40 that is the surface-emitting laser element having plural surface-emitting lasers 100 is contained inside the package 21 (see FIG. 25A). The glass cover 22 arranged on the upper portion of the package 21 is in parallel with the surface of the surface-emitting laser array chip 40 in the Y-axis direction, and the glass cover 22 arranged on the upper portion of the package 21 is slanted to the surface of the surface-emitting laser array chip 40 in the X-axis direction. Note that FIG. 25A is a diagram illustrating a configuration of the surface-emitting laser module, and FIG. 25B is a diagram illustrating an upper surface of the mesa 110 of the surface-emitting laser in the surface-emitting laser module.

Figure 25B:
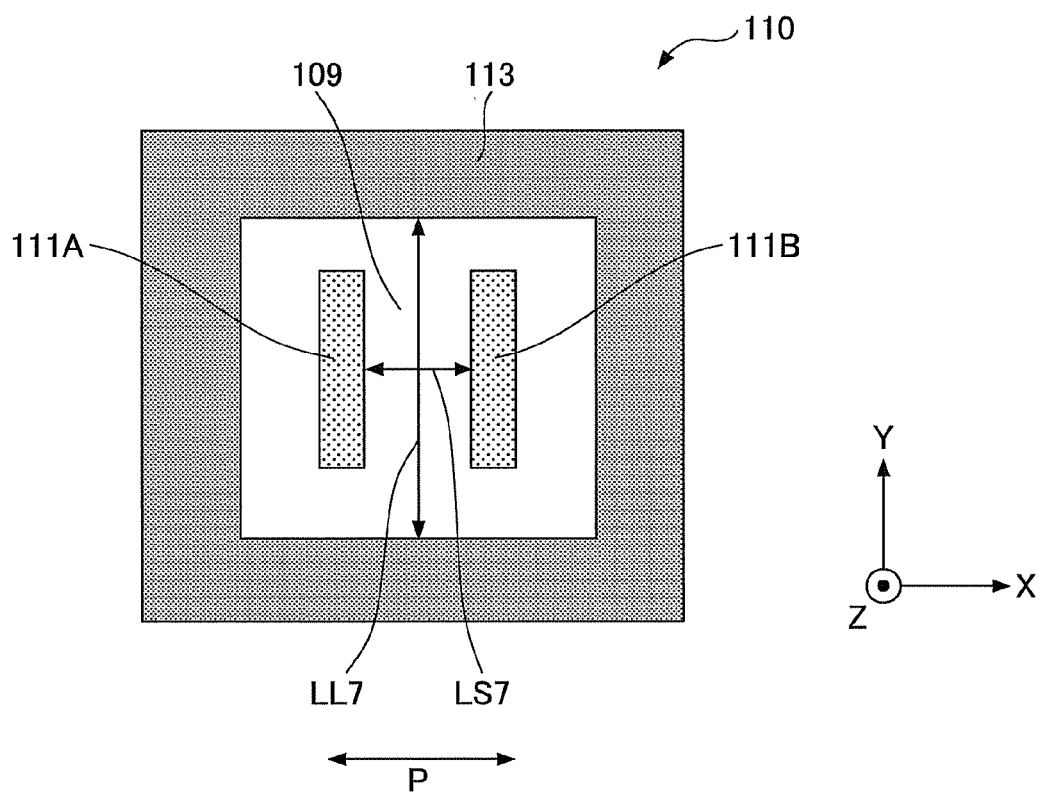
Figure 26A:
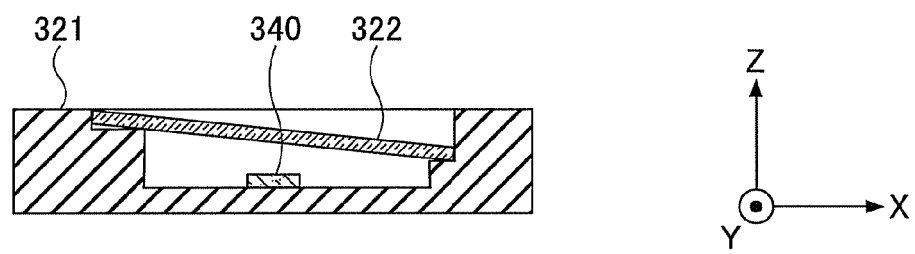
FIGS. 26A and 26B are configuration diagrams illustrating a comparative example of the surface-emitting laser module according to the first embodiment.
Figure 26B:
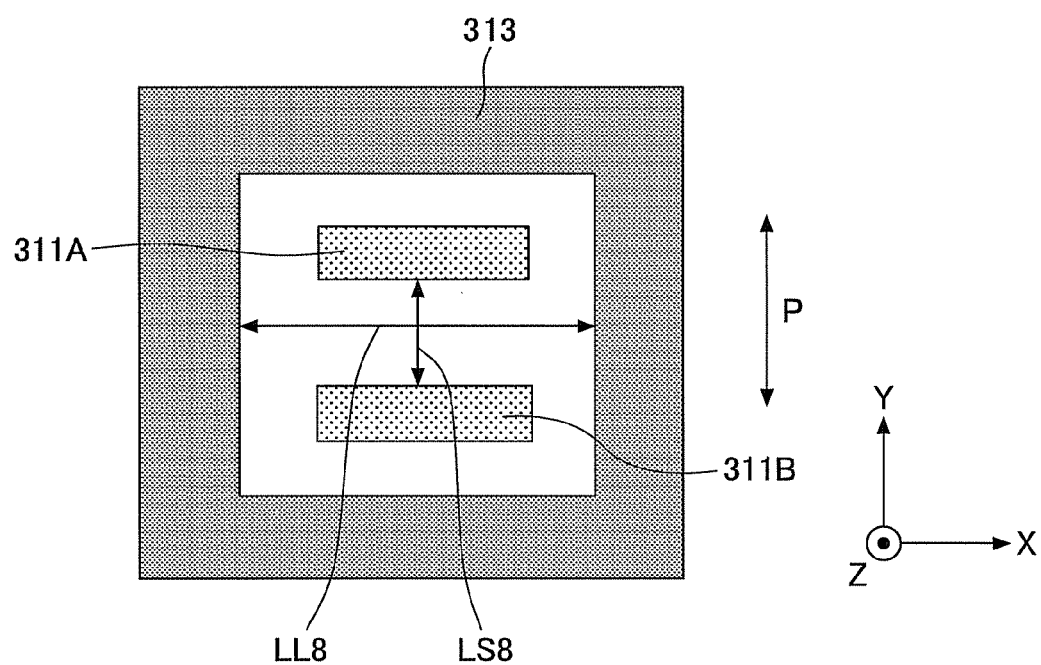

FIGS. 26A and 26B are diagrams illustrating a comparative example of a surface-emitting laser module. In the comparative surface-emitting module illustrated in FIGS. 26A and 26B, transparent layers 311A and 311B are arranged at positions where the transparent layers 111A and 111B illustrated in FIGS. 25A and 25B are rotated at 90 degrees. Specifically, the rectangular transparent layers 311A and 311B are arranged in the p-side electrode 313 such that the longitudinal directions of the rectangular transparent layers 311A and 311B are in parallel with in the X-axis direction. Specifically, in the high reflectance region in the upper portion of the mesa of the surface-emitting laser, the transparent layers 311A and 311B are formed such that an interval LL8 between the transparent layers 311A and 311B in the X-axis direction is longer than an interval LS8 between the transparent layers 311A and 311B in the Y-axis direction. Accordingly, the polarization direction P corresponds to the Y-axis direction.

The surface-emitting laser array chip 340 having plural surface-emitting lasers is contained inside the package 321 (see FIG. 26A). The glass cover 322 arranged on the upper portion of the package 321 is in parallel with the surface of the surface-emitting laser array chip 340 in the Y-axis direction, and the glass cover 322 arranged on the upper portion of the package 321 is slanted to the surface of the surface-emitting laser array chip 340 in the X-axis direction. Note that FIG. 26A is a diagram illustrating a configuration of the surface-emitting laser module, and FIG. 26B is a diagram illustrating an upper surface of the mesa of the surface-emitting laser in the surface-emitting laser module.

The waveform fluctuation is observed in the surface-emitting laser module illustrated in FIGS. 25A and 25B and the comparative surface-emitting laser module illustrated in FIGS. 26A and 26B. The result shows that there is a difference in the waveform fluctuation between the surface-emitting laser module illustrated in FIGS. 25A and 25B and the comparative surface-emitting laser module illustrated in FIGS. 26A and 26B. The difference may result from the abnormal waveform due to the feedback light observed in the comparative surface-emitting laser module illustrated in FIGS. 26A and 26B. Specifically, if the length LS7 in the X-axis direction is shorter than the length LL7 in the Y-axis direction as illustrated in FIG. 25B, that is, if the X-axis direction corresponds to the polarization direction P, the appearance of the abnormal waveform may be suppressed by arranging the glass cover 22 such that the glass cover 22 is slanted to the X-axis direction.

Thus, if the surface-emitting laser module having the surface-emitting laser array composed of the plural surface-emitting lasers arranged in array has the configuration illustrated in FIGS. 25A and 25B, the variability in the droop values may be set at 3% or lower. Further, an image forming apparatus including such surface-emitting lasers may form high quality images.

Next, the difference in the configuration between the surface-emitting laser module illustrated in FIGS. 25A and 25B and the comparative surface-emitting laser module illustrated in FIGS. 26A and 26B is described.

Generally, an optical output in the basic transverse mode may be the highest near the center of the emission region and be gradually lowered toward the periphery of the emission region. Conversely, an optical output of the higher-order transverse mode may be high in the peripheral portion of the emission region and be gradually lowered toward the center of the emission region. In the first embodiment, since the reflectance of the first and second subregions provided in the peripheral portion of the emission region is lower than the reflectance of the central portion of the emission region, the oscillation of the higher-order transverse mode may be controlled by lowering the reflectance of the higher-order transverse mode without lowering the reflectance of the basic transverse mode.

Figure 27:
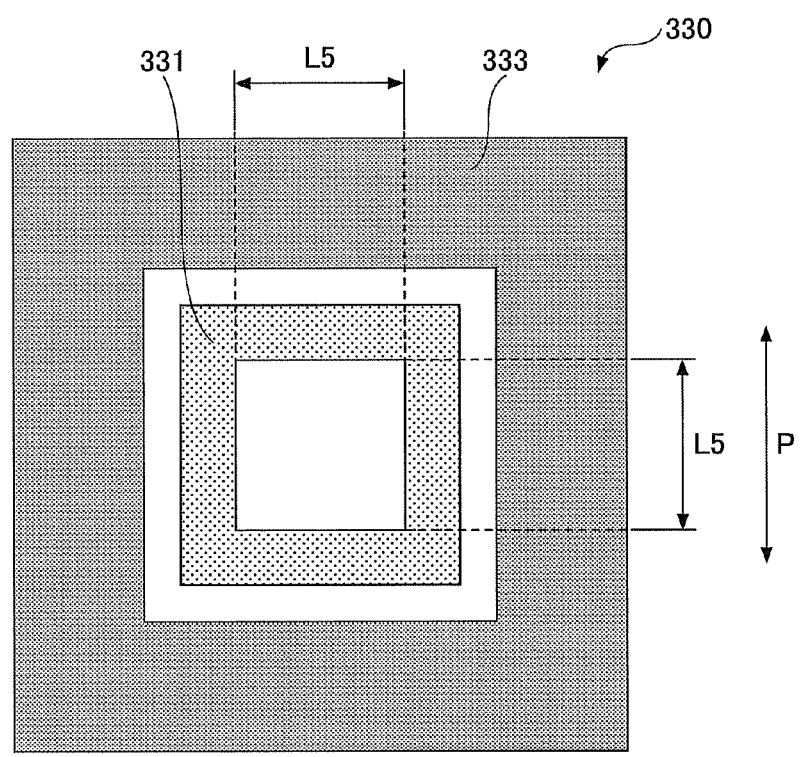
FIG. 27 is a configuration diagram illustrating another comparative example of the surface-emitting laser according to the first embodiment.

FIG. 27 is a configuration diagram illustrating another comparative example of the surface-emitting laser according to the first embodiment.

Figure 28:
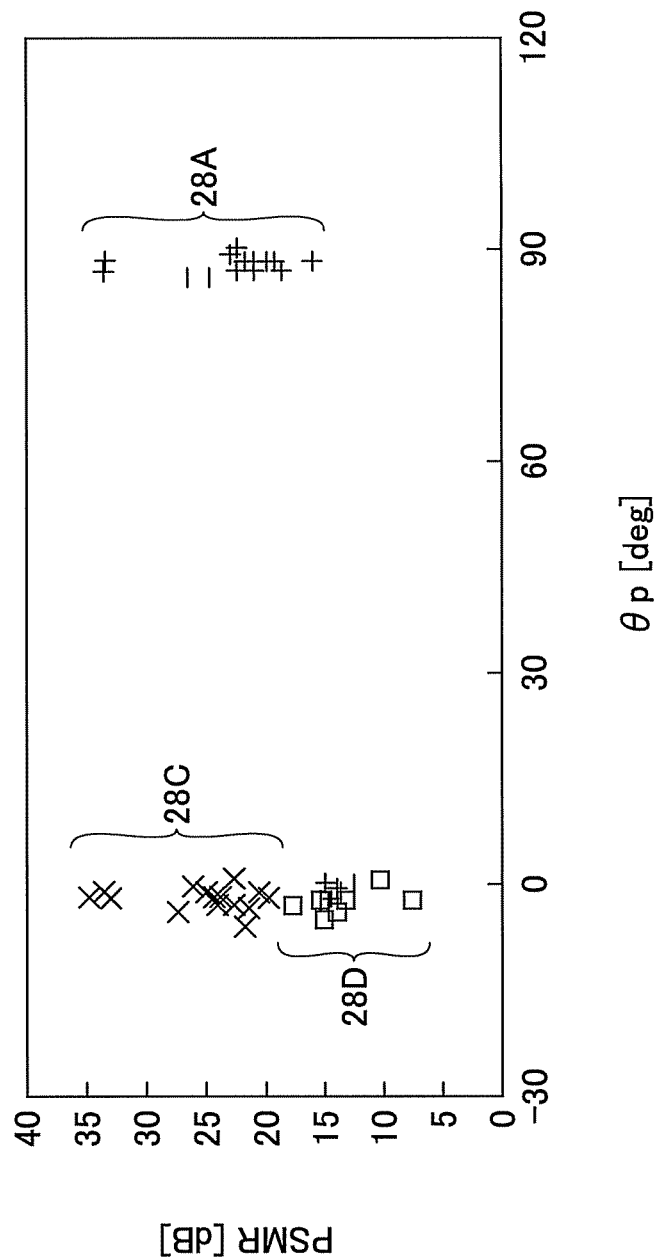
FIG. 28 is a characteristic diagram illustrating a polarization mode suppression ratio.

FIG. 28 is a diagram illustrating a relationship between a polarization mode suppression ratio (PMSR) and a polarization angle θp in the surface-emitting laser 100 and a surface-emitting laser having a configuration illustrated in FIG. 27. Note that the polarization mode suppression ratio PMSR is a ratio of light intensity in a desired polarization direction of laser light to light intensity in a direction perpendicular to the desired polarization direction of laser light. A typical polarization mode suppression ratio PMSR required for a copier or the like may be approximately 20 dB. In this case, the polarization angle θp in the Y-axis direction is 0 degrees, and the polarization angle θp in the X-axis direction is 90 degrees.

In FIG. 28, "28A" indicates the configuration illustrated in FIG. 12, where the two transparent layers extended in the Y-axis directions are formed in the first and second subregions. Further, "28C" indicates the configuration illustrated in FIG. 13, where the two transparent layers extended in the X-axis directions are formed in the first and second subregions. Moreover, "28D" indicates the configuration illustrated in FIG. 27, where the transparent layer 331 having a cross-sectional shape of a square tube is formed in a corresponding subregion. More specifically, in the surface-emitting laser illustrated in FIG. 27, the subregion is formed of the transparent layer 331 having the cross-sectional shape of the square tube, where widths in the X-axis and the Y-axis directions of an internal square opening of the transparent layer 331 are equally L5. Note that the transparent layer is formed of a dielectric film having an optical thickness of λ/4.

The polarization of the surface-emitting laser is generally controlled by crystalline anisotropy of the slanted substrate to cause an active layer of a strained quantum well to generate gain anisotropy, thereby determining the polarization direction. Since the surface-emitting laser module according to the first embodiment includes the slanted substrate, the polarization in a surface-emitting laser having no filter structure may be the X-axis direction due to the effect of the slanted substrate. However, if the surface-emitting laser includes an isotropic filter illustrated in FIG. 27, the stability of the polarization may be degraded, and the polarization may be rotated in the Y-axis direction.

In the surface-emitting laser having the configuration (i.e., "28A" in FIG. 28) illustrated in FIG. 12, the polarization is stable in the X-axis direction whereas in the surface-emitting laser having the configuration (i.e., "28C" in FIG. 28) illustrated in FIG. 13, the polarization is stable in the Y-axis direction. Further, the surface-emitting laser having the configuration of 28A and 28C may exhibit the PMSR approximately 5 dB higher than the PMSR obtained in the surface-emitting laser having the configuration of 28D. Meanwhile, the PMSR of the surface-emitting laser having the configuration of 28D illustrated in FIG. 27 is stable in the Y-axis direction; however, there are some cases where the obtained PMSR is less than 10 dB to exhibit unstable polarization direction.

Further, one of the factors that may have improved polarization stability by dividing a region into plural subregions where the transparent dielectric films having an optical thickness of λ/4 are formed may be the anisotropy generated in an optical confinement effect in two mutual orthogonal directions (i.e., X-axis and Y-axis directions in this case). That is, as illustrated in FIG. 12, light having a polarization direction corresponding to the X-axis direction induces an optical confinement effect in the central portion having a reflectance higher than that of the peripheral portion within the emission region, and has an oscillation threshold lower than an oscillation threshold of light having a polarization direction corresponding to the Y-axis direction. As a result, the polarization mode suppression ratio PMSR may be improved.

Figure 29:
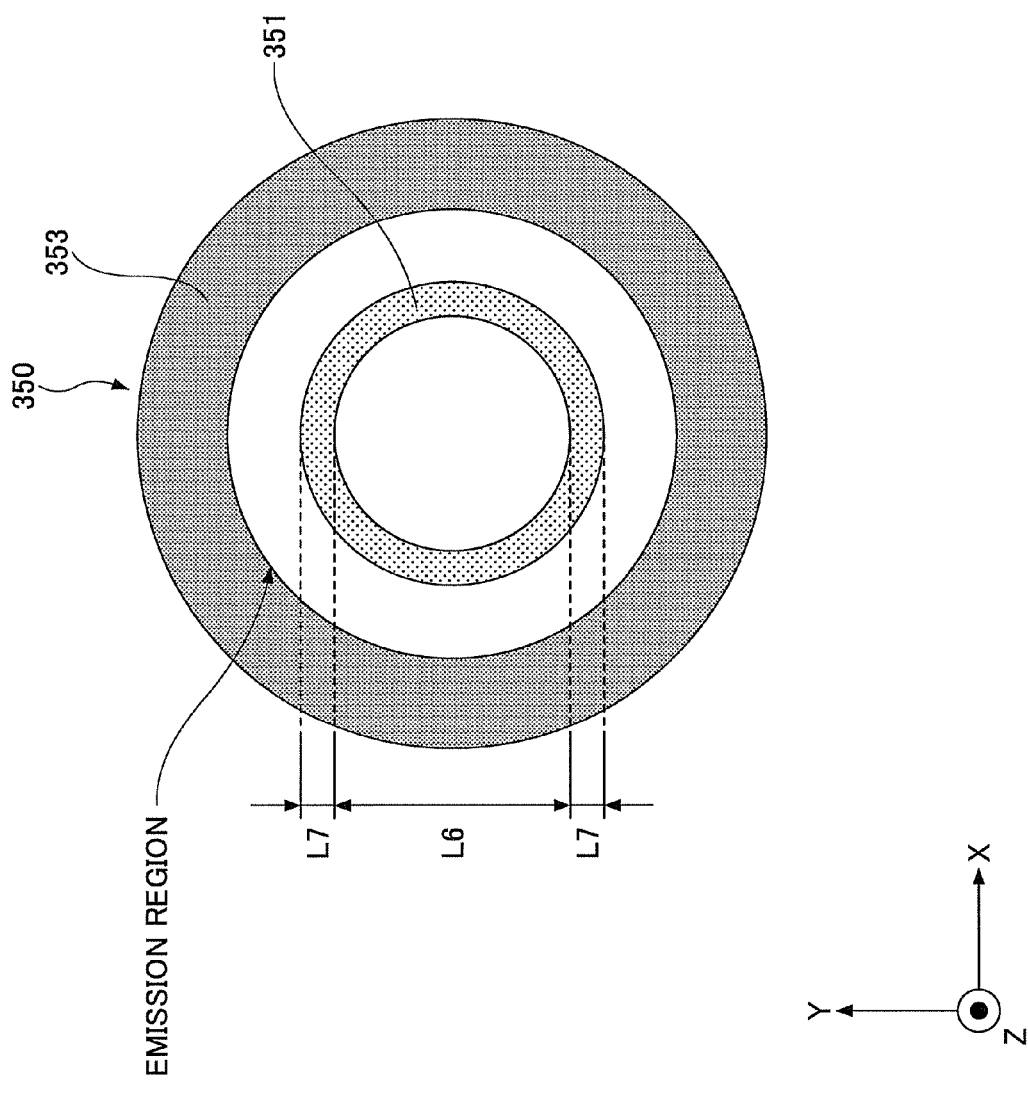
FIG. 29 is a top diagram illustrating the surface-emitting laser having a round mesa shape utilized for examining its characteristics.

FIG. 29 illustrates an example of a surface-emitting laser having a ring-shaped p-side electrode 353. In the ring-shaped p-side electrode 353, a transparent dielectric film having an optical thickness of λ/4 is formed in one ring-shaped subregion 351 formed in an upper portion of a cylindrical mesa 350 that encloses a central portion of a circular emission region. In the surface-emitting laser having such a configuration (computational model of the surface-emitting laser), an oscillation mode distribution is computed based on a fixed width L7 of the subregion of 3 μm, and a variable inner diameter L6 of the subregion. Note that a diameter of a current passing region is set as 4.5 μm in the computational model.

Figure 30:
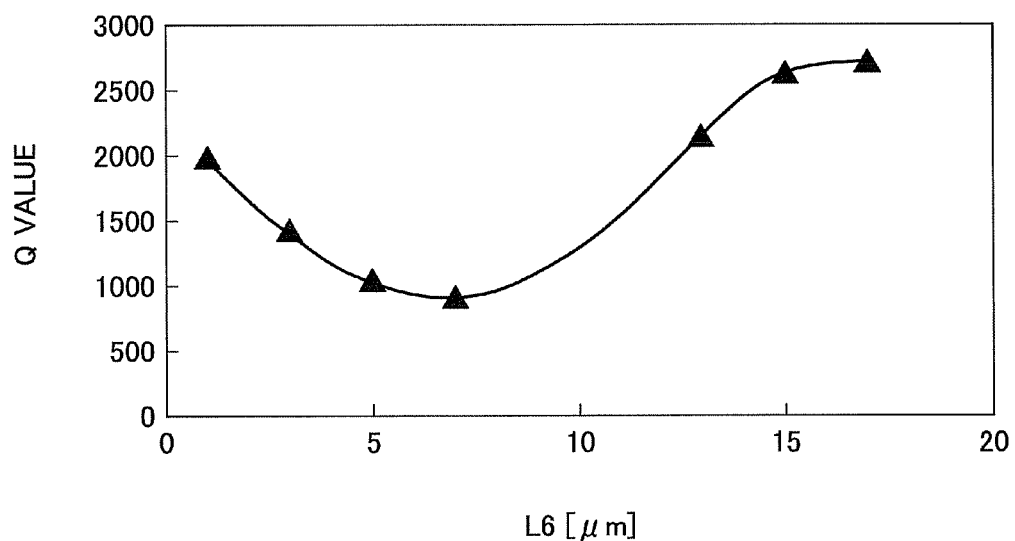
FIG. 30 is a characteristic diagram of a Q value.

FIG. 30 is a diagram illustrating a relationship between the inner diameter L6 of the subregion obtained in the computational model and a Q value in the high-order oscillation transverse mode in the surface-emitting laser having the configuration illustrated in FIG. 29. As illustrated in FIG. 30, if the value of L6 is increased from 1 μm, the Q value is significantly lowered. This may result from the fact that a portion having high light intensity of the high-order transverse mode overlaps the subregion, thereby suppressing the oscillation of the high-order transverse mode of laser light. Specifically, if L6 is set in a range of 5 to 9 μm, the oscillation of the high-order transverse mode of laser light may be significantly suppressed.

Figure 31:
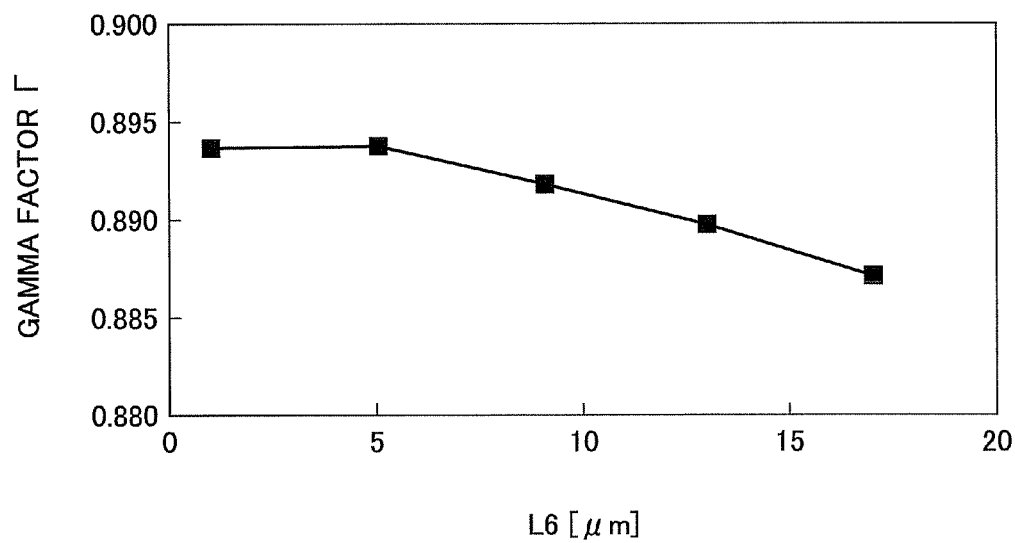
FIG. 31 is a characteristic diagram of a gamma factor.

Further, FIG. 31 is a diagram illustrating a relationship between the inner diameter L6 of the subregion in the computational model and an optical confinement factor Γ in a transverse direction of the basic transverse mode of laser light. The result shows that a higher optical confinement effect in the transverse direction is obtained when the inner diameter L6 is 5 μm or less, whereas a lower optical confinement effect in the transverse direction is obtained when the inner diameter L6 is greater than 5 μm. Thus, it is possible to provide anisotropy for the optical confinement effect in the transverse direction by dividing the subregion into plural subregions to introduce anisotropy into the interval between the subresions. Accordingly, the polarization component in a direction where the polarization component exhibits the high optical confinement effect is more easily oscillated than the polarization component in a direction where the polarization component exhibits a low optical confinement effect. As a result, the polarization direction may be controlled in the direction where the polarization component exhibits the high optical confinement effect.

Thus, with reference to FIGS. 28 thorough 31, the polarization direction may be stabilized by controlling anisotropy of the filters. Note that the polarization direction to be controlled and stabilized is a direction in which the two subregions mutually face (i.e., the X-axis direction) as illustrated in FIG. 28. This may be clear from the computational model illustrating that the factor Γ or the Q value largely depend on the inner diameter L6. That is, if the inner diameter L6 has anisotropy, the polarization direction is stabilized in the smaller inner diameter L6. That is, in the emission region enclosed by the p-side electrode provided in the upper portion of the mesa, light is confined within a high reflectance region including the central portion other than the subregion, and the polarization is stabilized when the high reflectance region has anisotropy.

Figure 32:
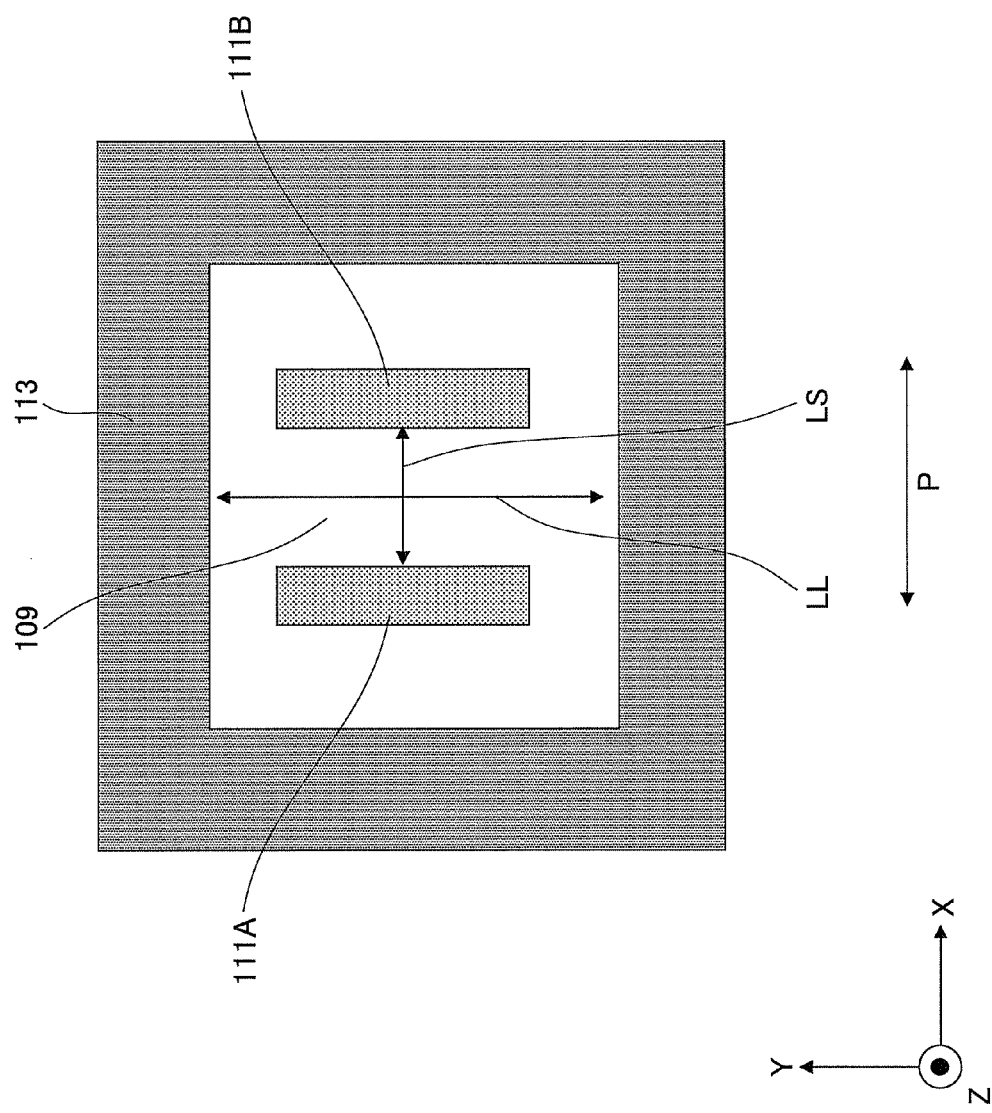
FIG. 32 is a second explanatory diagram illustrating the first example of the surface-emitting laser according to the first embodiment.

Thus, the direction in which the polarization is stabilized may be the short X-axis direction (LS) in the high reflectance region having shorter length than the long Y-axis direction (LL) in a case where the transparent layers 111A and 111B are formed in the opening of the p-side electrode 113 as illustrated in FIG. 32. Accordingly, if the high reflectance region has a predetermined shape while the filters have various structures, the high reflectance region may acquire anisotropy. For example, as illustrated in FIG. 15, if there is one subregion, the longitudinal axis and the short axis may be defined in the high reflectance region. In this case, the polarization direction is stabilized in the short axis direction (LS1) (see FIG. 15).

Note that the region where the surface-emitting laser emits laser light is approximately limited to the central portion of the mesa. This is because the laser emitting center (or emission center) is the unoxidized current passing region in the current constricting structure. Note that since oxidation may occur in an isotropic manner, the emission center may be approximately the center of the mesa. The emission state of the surface-emitting laser may be determined based on a relative relationship between the emission center and the high reflectance region. Accordingly, the polarization direction may be determined based on the relative relationship between the emission center and the high reflectance region.

For example, as illustrated in FIGS. 17 and 18, the polarization stability is also examined in a case where the geometric center in the high reflectance region is shifted from the geometric center of the current constricting region. The emission center that corresponds to the geometric center in the current constricting region is slightly shifted by receiving an effect in the high reflectance region. However, the longitudinal axis direction and the short axis direction may be defined based on an area ratio of the high reflectance region. Accordingly, the polarization direction P is approximately stabilized in the short axis direction. This result approximately matches the result obtained in the computational model illustrated in FIGS. 30 and 31. Accordingly, the definitions of the longitudinal axis direction and the short axis direction may be determined based on the area ratio of the high reflectance region having the geometric center as the emission center.

As illustrated in FIG. 19, if transparent layers 111M and 111N that are low reflectance regions reside within the emission region, the high reflectance region is formed in a region indicated by the shaded area in FIG. 19. The shaded region excludes the low reflectance regions formed of the first and second subregions, and the shaded region also excludes outer portions (peripheral regions indicated by KK in FIG. 19) of the first and second subregions in the high reflectance region. An oscillation mode formed of laser light that oscillates from the center of the current constricting region is only spread in the vicinity of the current constricting region. Accordingly, an area providing some effect on the oscillation mode may be the high reflectance region indicated by the shaded area in FIG. 19. Meanwhile, the outer portions (peripheral regions) of the first and second subregions (indicated by KK in FIG. 19) are distant from the center of the current passing region, and hence the outer portions of the first and second subregions may provide little effect on the oscillation mode. Note that a microstructure of the surface-emitting laser may not provide a significant effect on the laser light insofar as the microstructure is the wavelength level. Accordingly, the microstructure is defined as the structure on the order of several hundred nm or more.

Note also that in the surface-emitting laser having the configuration illustrated in FIG. 20, the polarization direction P is only stabilized in the short axis direction (indicated by LS6 in FIG. 20), that is, in the X-axis direction. With this configuration, the shape of the current passing region is analogous to the shape of the mesa structure, which is an approximately square shape having sides in parallel with the X-axis direction and the Y-axis direction. Since the polarization direction P is affected by the shape of the current passing region, one of the X-axis or Y-axis directions may be selected as the polarization direction P. In the surface-emitting laser having the configuration illustrated in FIG. 20, since the polarization direction P is stabilized in the short axis direction that is the X-axis direction, the X-axis direction may be selected as the polarization direction P.

As illustrated in FIGS. 4A and 4B, the surface-emitting laser 100 according to the first embodiment includes the substrate 101, on which the buffer layer 102, the lower semiconductor DBR 103, the lower spacer layer 104, the active layer 105, the upper spacer layer 106, the upper semiconductor DBR 107 and the contact layer 109 are stacked. The surface-emitting laser element 100 according to the first embodiment further includes the p-side electrode 113 that encloses the emission region, and the n-side electrode 114 on the rear side of the substrate 101. Further, in the emission region of the surface-emitting laser element 100 according to the first embodiment, the transparent layers 111A and 111B formed of optically transparent dielectric films and having the optical thickness of λ/4 are provided in the two subregions (i.e., the first and second subregions) located off the central portion of the emission region such that the reflectance in the two subregions is lower than the reflectance in the central portion of the emission region.

With this configuration, the optically transparent layers 111A and 111B formed on the surface of the emission region may allow the reflectance of the peripheral portion within the emission region to be relatively lower than the reflectance of the central portion within the emission region. Thus, the oscillation of the higher-order transverse mode may be suppressed without lowering the optical output of the basic transverse mode.

Further, the optically transparent layers 111A and 111B formed on the surface of the emission region may also provide anisotropy in the two orthogonal directions in the high reflectance region corresponding to the central portion of the emission region. Accordingly, anisotropy may be systematically generated for the optical confinement effect in the transverse direction, and hence, the stability in the polarization direction may be improved.

That is, the polarization direction may be stabilized while controlling the oscillation of the higher-order transverse mode.

(Glass Cover Implication)

Next, the polarization direction P of the surface-emitting laser, a slanting direction of the glass cover 22 placed on the upper portion of the package 21, and change in the reflectance are described. Note that the surface-emitting lasers are located in parallel with an XY plane.

Figure 33:
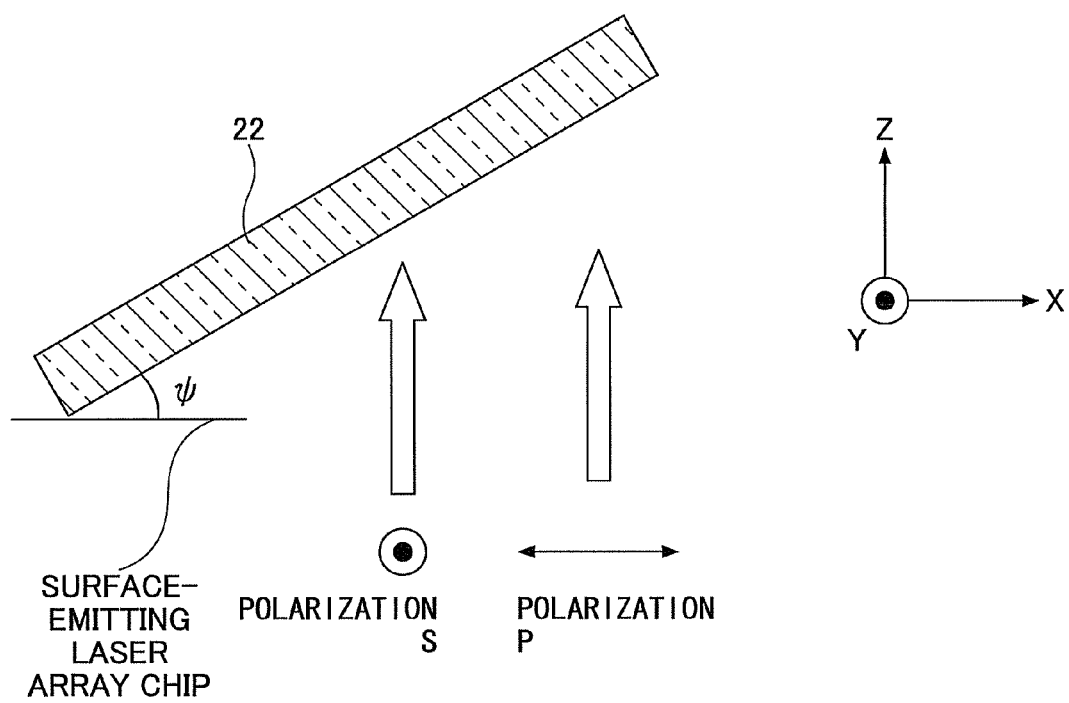
FIG. 33 is an explanatory diagram illustrating a glass cover arrangement position.

The reflection of light on the surface of the glass cover 22 varies based on an incident angle and polarization of laser light. For example, the glass cover 22 is slanted at ψ degrees with respect to the X-axis direction in an XY plane as illustrated in FIG. 33. In this example, light having the polarization direction in the X-axis direction is defined as a P polarization, and light having the polarization direction in Y-axis direction is defined as an S polarization. Note that in general, the reflectance of the P polarization is computed based on the following equation (1), and the reflectance of the S polarization is computed based on the following equation (2). Note that n in the equations (1) and (2) has a relationship represented by the following equation (3).

$$R_y = \left( \frac{n^2 \cos\phi_1 - \sqrt{n^2 - \sin^2\phi_1}}{n^2 \cos\phi_1 + \sqrt{n^2 - \sin^2\phi_1}} \right)^2 \quad (1)$$

$$R_s = \left( \frac{\cos\phi_1 - \sqrt{n^2 - \sin^2\phi_1}}{\cos\phi_1 + \sqrt{n^2 - \sin^2\phi_1}} \right)^2 \quad (2)$$

$$n = \frac{n_2}{n_1} \quad (3)$$

In the above equations, n1 represents the refractive index of air, n2 represents the refractive index of the glass cover, and φ1 represents the incident angle.

Figure 34:
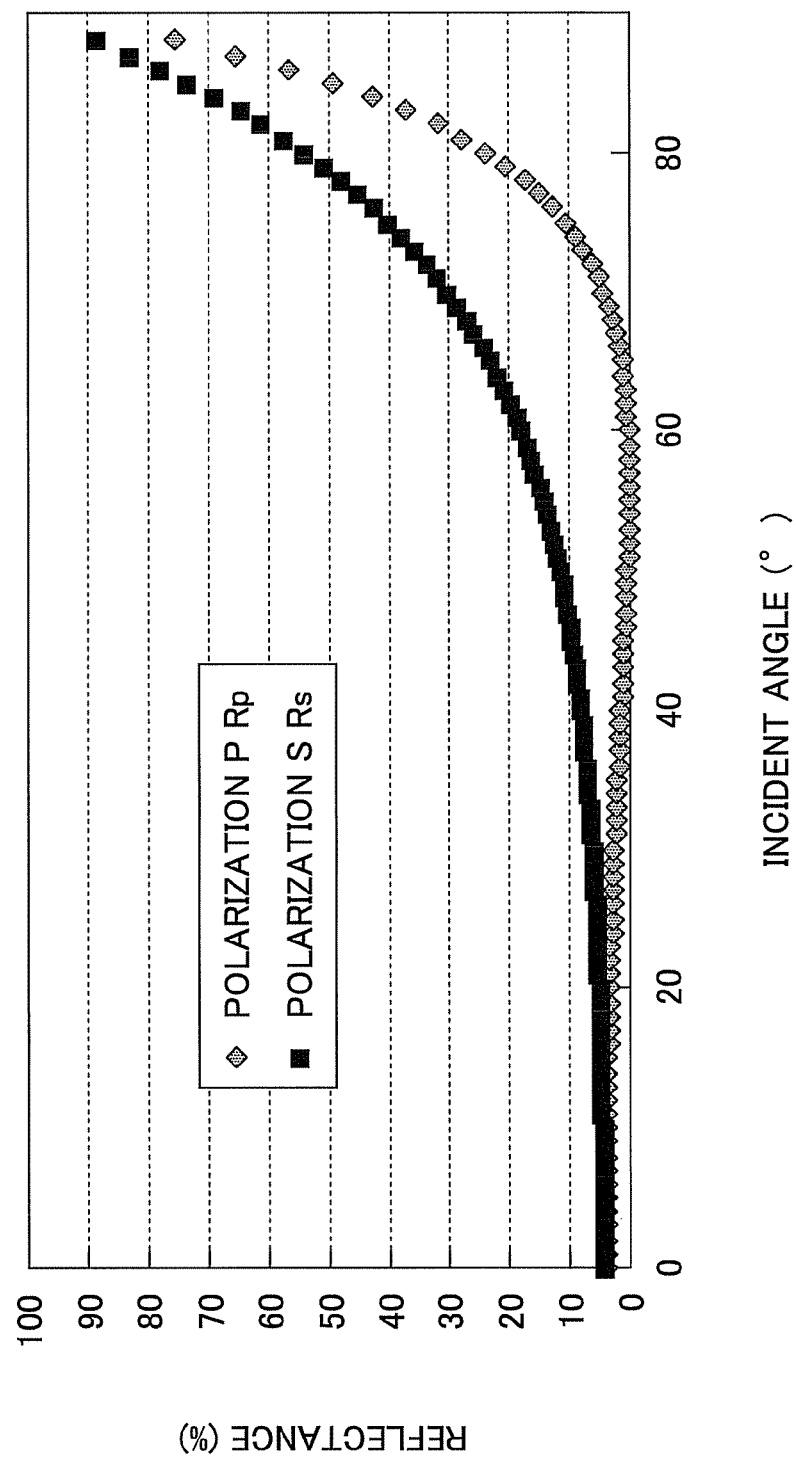
FIG. 34 is a first correlation diagram between an incident angle and reflectance.
Figure 35:
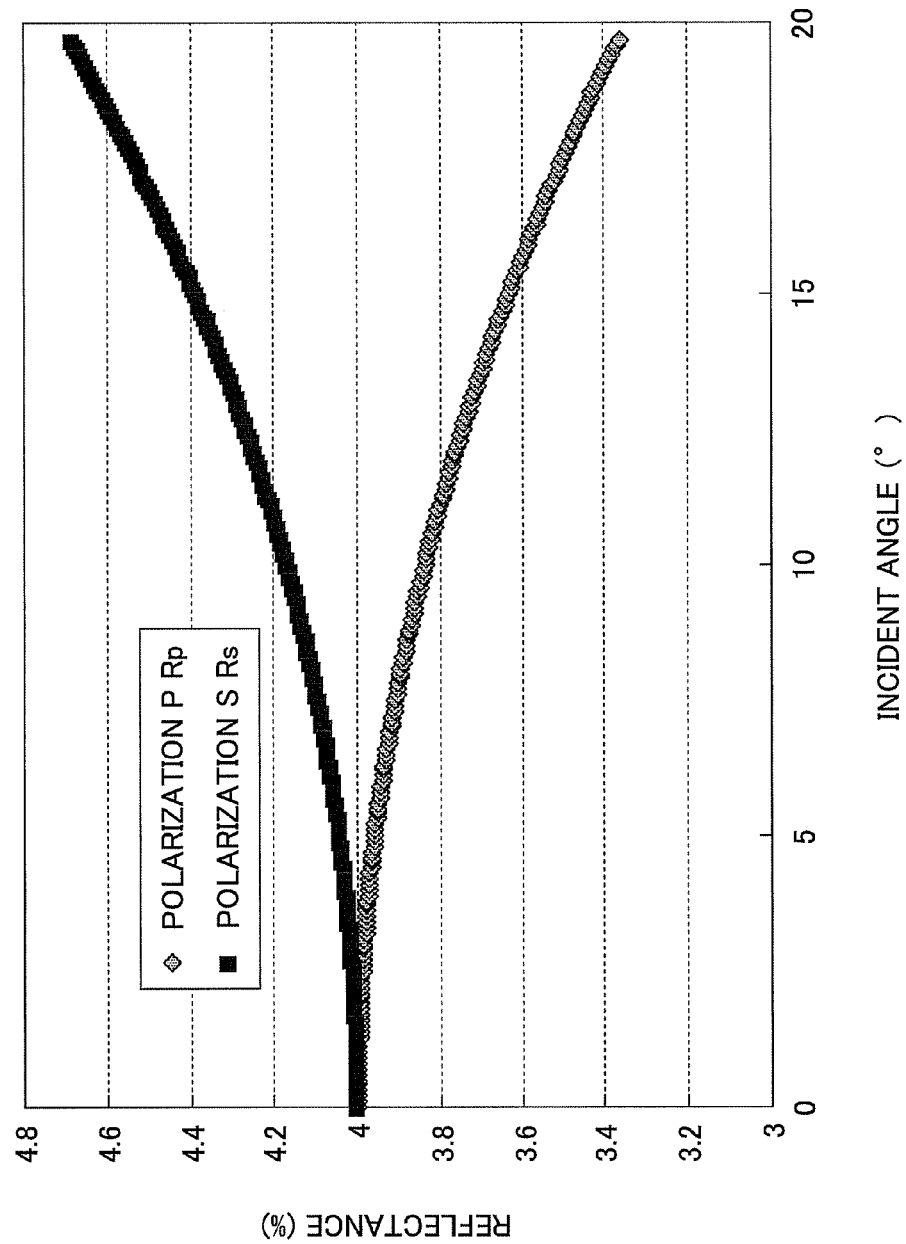
FIG. 35 is a second correlation diagram between an incident angle and reflectance.

The refractive index of an optical glass of 1.5168 is substituted into the equation (3), and the reflectance of the P polarization and S polarization is computed based on the equations (1) and (2). The results of the reflectance of the P polarization and S polarization are illustrated in FIGS. 34 and 35. FIG. 34 is a graph illustrating the results with the slanting angle range or the incident angle range of 0 to 90 degrees, and FIG. 35 is a graph illustrating the results with the incident angle range of 0 to 20 degrees that is partially enlarged portion of FIG. 34.

As illustrated in FIG. 34, the reflectance of the S polarization uniformly increases with an increase in the slanting angle of the glass cover 22, and the reflectance of the P polarization once decreases to 0 and then increases again thereafter with an increase in the slanting angle of the glass cover 22. That is, as illustrated in FIG. 35, there appear to be a subtle difference in the reflectance between the P polarization and S polarization with the slanting angle of approximately 10 degrees, and also an approximately 0.8% difference in the reflectance between the P polarization and S polarization with the slanting angle of approximately 15 degrees. In this embodiment, since the surface-emitting laser array formed of the surface-emitting lasers arranged in array is susceptible of the feedback light, the abnormal waveform caused by low feedback light may need to be eliminated. In this case, the reflectance of 0.8% may largely affect the laser light of the surface-emitting laser array.

In this embodiment, an antireflective film formed of a multilayered dielectric film is formed on the surface of the glass cover 22 to reduce the reflectance of the glass cover 22 to the minimum. The antireflective film is formed of a stacked layer having several layers by alternately stacking a high refractive index film made of a high refractive index material and a low refractive index film made of a low refractive index material each having a film thickness of a ¼ optical wavelength. In this embodiment, the high refractive index film employs the high refractive index material is made of $TiO_2$ and the low refractive index film employs the low refractive index material is made of $SiO_2$. The antireflective film is formed by stacking two or more of these refractive index films. More specifically, a $TiO_2$ film, an $SiO_2$ film, a $TiO_2$ film, and an $SiO_2$ film are sequentially formed in this order on the surface of the glass cover 22. A $SiO_2$ film is formed as an outermost surface of the glass cover 22 to lower the reflectance of the glass cover 22.

Further, the low refractive index film is generally made of $MgF_2$ instead of $SiO_2$. However, $MgF_2$ is a fluorine compound that exhibits low adhesive properties. Thus, the adhesiveness to adhere the glass cover 22 to the package 21 may be lowered, which may cause low sealing properties of the package 21. In particular, the low refractive index material made of $MgF_2$ has exhibited insufficient sealing properties in an environmental test under a high temperature/high humidity condition. Further, $CaF_2$ and $AlF_3$ are also used as the low refractive index material other than $MgF_2$ in the environmental test under a high temperature/high humidity condition; however, the result also has shown insufficient sealing properties.

Next, the reflectance of the glass cover 22 utilized in the surface-emitting laser module in the first embodiment is measured. In this embodiment, since the antireflective film is formed on the surface of the glass cover 22, which exhibits an extremely low reflectance, the reflectance of the glass cover 22 may need to be measured by a high precision spectroscope. Thus, absolute reflectance measurement systems V7300 and VAR7030 (manufactured by JASCO Corporation) are used as measuring devices to measure the reflectance of the glass cover 22.

Figure 36:
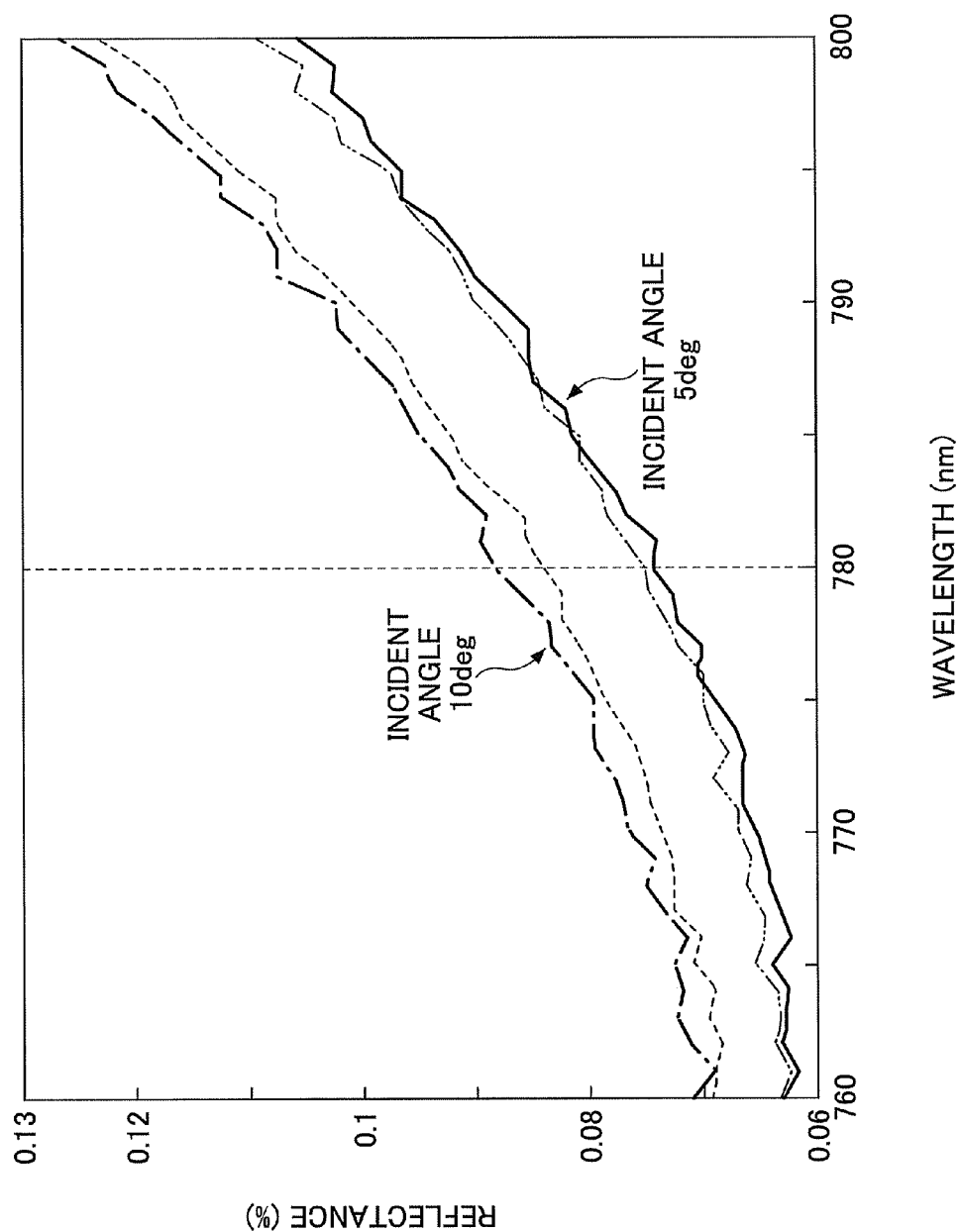
FIG. 36 is a correlation diagram between wavelength and reflectance of the glass cover to which an antireflective film is applied.

FIG. 36 is a diagram illustrating a relationship between the reflectance (%) and the wavelength (nm) measured when the incident angles are 5 degrees and 10 degrees. In FIG. 36, two samples are measured each with the incident angle of 5 degrees and that of 10 degrees, and hence a total of four plotted lines are thus illustrated. In comparing the results of four samples illustrated by the four plotted ones at the surface-emitting laser oscillation wavelength of 780 nm, the reflectance with the incident angle of 5 degrees indicates approximately 0.07%, while the reflectance with the incident angle of 10 degrees indicates approximately 0.08%. Thus, the difference in the reflectance between the two incident angles is approximately 0.01%.

Further, in the above measurement, since the S polarization is used as the polarization direction of light, the reflectance with the greater incident angle of 10 degrees exhibits higher reflectance. That is, even if the antireflective film is formed on the glass cover, the reflectance may be raised in the S polarization. The result may be also clear from FIG. 35. Similarly, if the P polarization is used as the polarization direction of light and the reflectance with the incident angle of 5 degrees and that with the incident angle of 10 degrees are compared, the reflectance with the incident angle of 10 degrees may be lower than that with the incident angle of 5 degrees. Further, there seems to be a greater difference in the reflectance between the P polarization and the S polarization with the incident angle of 10 degrees. That is, even if antireflection coating (AR coat) is applied to the glass cover 22, approximately the same results as those illustrated in FIG. 35 may be obtained. Note that although the reflectance of 0.01% is a subtle difference, it may become the feedback light to provide an adverse effect on the surface-emitting lasers.

(Surface-Emitting Laser Array)

Next, the surface-emitting laser array according to the first embodiment is described. The surface-emitting laser array according to the first embodiment is formed by arranging two or more the above-described surface-emitting lasers two dimensionally.

Figure 37:
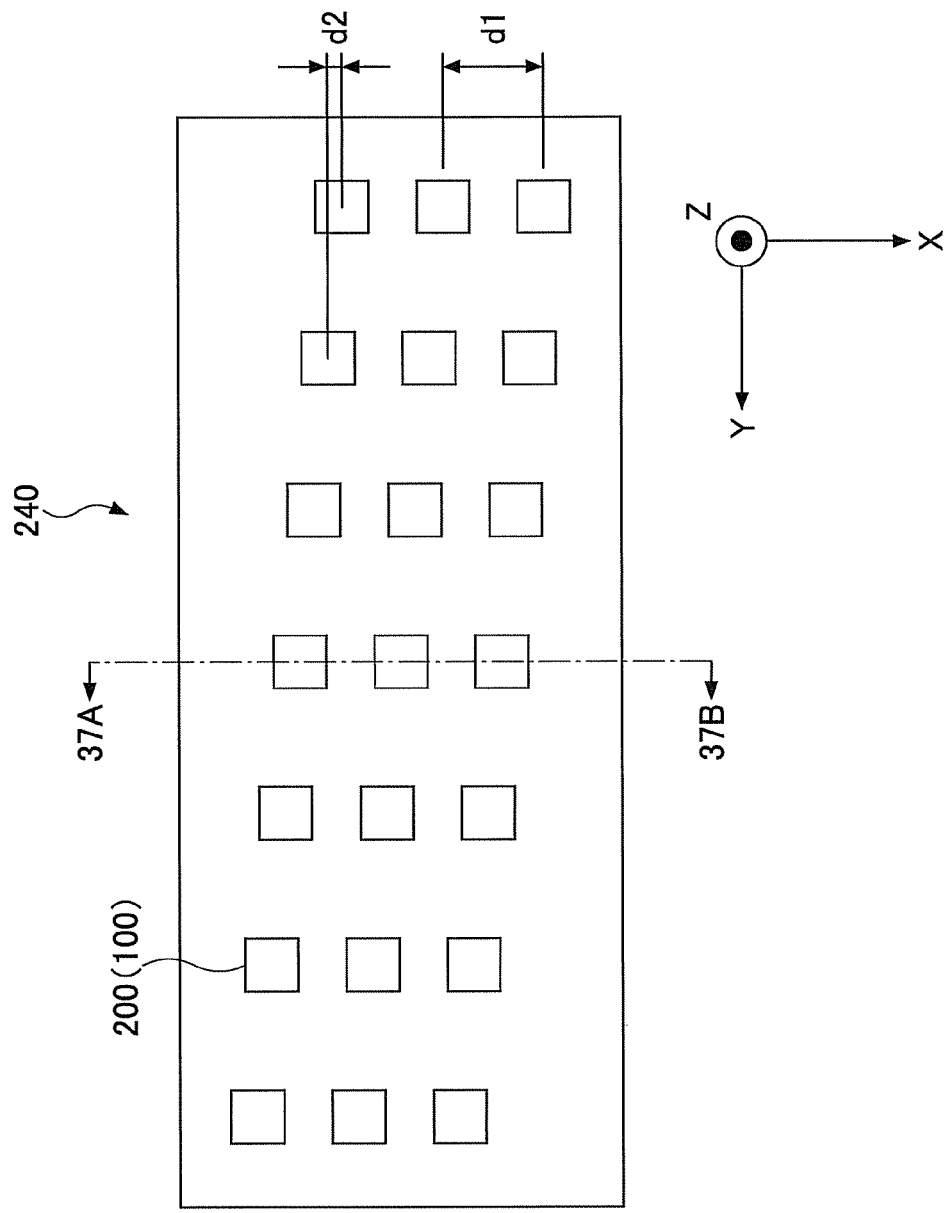
FIG. 37 is a configuration diagram illustrating a surface-emitting laser array according to the first embodiment.

A surface-emitting laser array 240 according to the first embodiment is described with reference to FIG. 37. The surface-emitting laser array 240 includes plural light-emitting portions 200 (21 in this case) that are the surface-emitting lasers arranged on the same substrate. Note that in FIG. 37, the X-axis direction is a sub-scanning direction, and the Y-axis direction is a main-scanning direction. The plural light-emitting portions 200 are arranged at equal intervals d2 when all the light-emitting portions 200 are orthogonally projected in a virtual line extending in the X-axis direction. That is, 21 light-emitting portions 200 are two dimensionally arranged in array. Note that in this specification, a "light-emitting portion interval" indicates a center-to-center distance between the two light-emitting portions 200. Further, FIG. 37 illustrates an example of the surface-emitting laser array having the 21 light-emitting portions 200; however, the number of light-emitting portions 200 is not limited to 21. For example, the number of light-emitting portions 200 may be 40.

Figure 38:
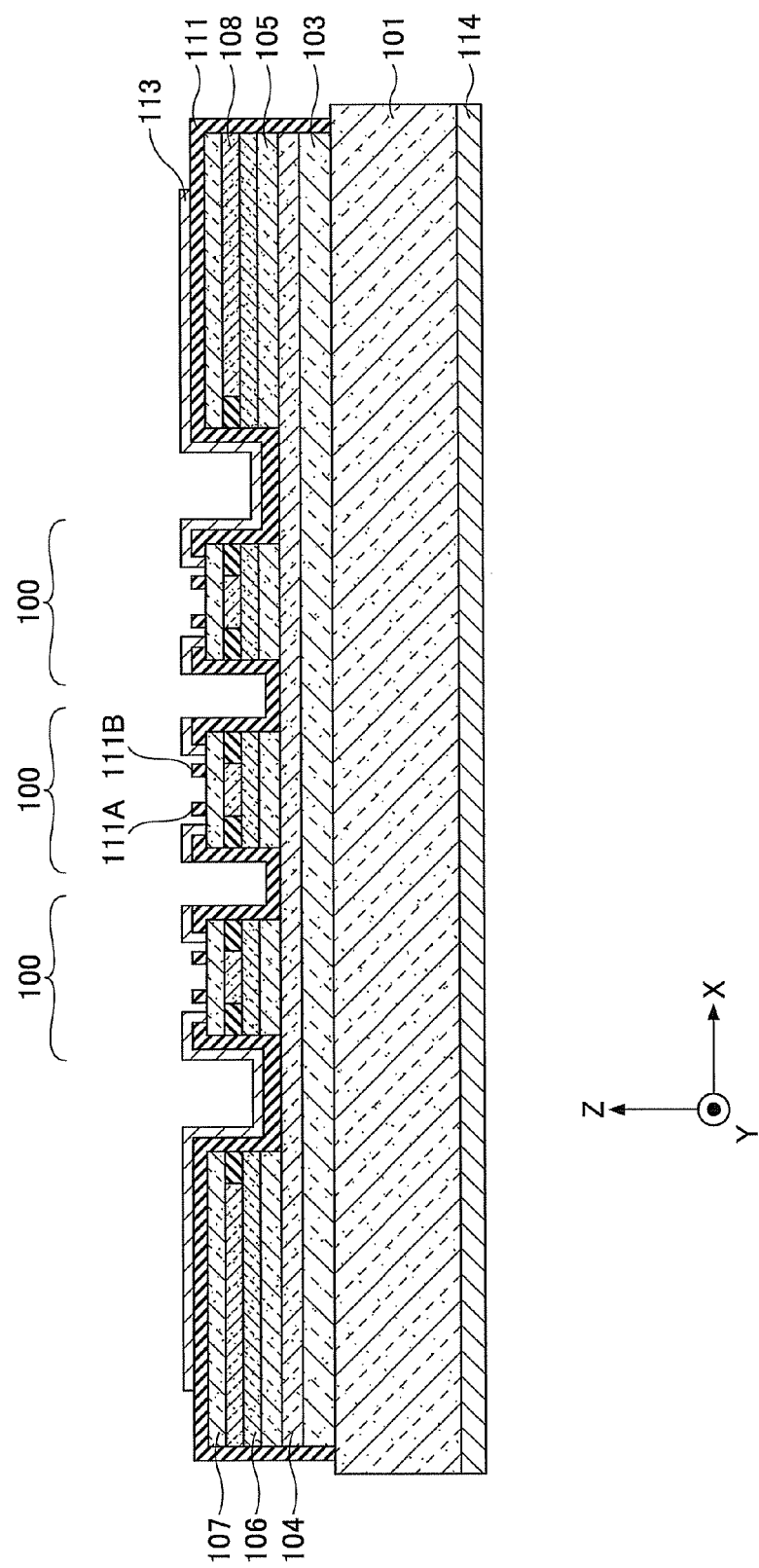
FIG. 38 is a cross-sectional diagram illustrating the surface-emitting laser array in FIG. 37.

FIG. 38 is a cross-sectional diagram cut along a dash-dot line 37A and 37B in FIG. 37. In the surface-emitting laser array 240 according to the first embodiment, the light-emitting portion 200 is formed of the surface-emitting laser 100. Thus, the surface-emitting laser array 240 may be fabricated in the same manner as the fabrication method of the surface-emitting laser 100. In this manner, the surface-emitting laser array 240 capable of emitting single basic transverse modes of plural laser beams having a uniform polarization direction between the light-emitting portions 200 may be fabricated.

The thus fabricated surface-emitting laser array 240 may simultaneously form 21 (or 40) densely arranged round minute optical spots on the later-described photoreceptor drum.

Further, in the surface-emitting laser array 240, since the light-emitting portions 200 are arranged at equal light-emitting portion intervals d2 when all the light-emitting portions 200 are orthogonally projected in the virtual line extending in the sub-scanning direction, the later-described photoreceptor drum may have the same configuration as the light-emitting portions 200 arranged at equal light-emitting portion intervals d2 on its surface in the sub-scanning direction by adjusting light-emitting timing of laser beams.

Thus, if the above light-emitting portion interval d2 is 2.65 μm, and the magnification of the optical scanner device 1010 is doubled (2×), the later-described optical scanner device may write an image with high-density resolution of 4800 dpi (dot/inch). Note that if the number of the light-emitting portions 200 is increased, if the light-emitting portions 200 are arranged in an array configuration where the intervals d2 are decreased by narrowing pitches d1 in the sub-scanning direction, or if the magnification of the optical system is reduced, the later-described optical scanning device may write an image with even higher-density resolution, thereby printing the image with high quality. Note that the writing intervals in the main-scanning direction may be easily controlled by the illuminating timing of the light-emitting portions 200.

In the surface-emitting laser array 240 according to the first embodiment, a preferable groove size between the adjacent light-emitting portions 200 may be 5 μm or more for electrically and specially separating the adjacent light-emitting portions 200. If the groove size between the adjacent light-emitting portions 200 is too narrow, etching control may become difficult during the fabrication of the surface-emitting laser array 240. Moreover, a preferable size (length for each side) of the mesa 110 may be 10 μm or more. If the size of the mesa 110 is too small, the properties of the surface-emitting laser array 240 may be degraded.

Further, a surface-emitting laser array having one dimensionally arranged surface-emitting lasers 100 may be used in place of the surface-emitting laser array 240 having the two dimensionally arranged surface-emitting lasers 100 in array.

Further, in the first embodiment, the normal direction of the main surface of the substrate 101 is slanted at 15 degrees toward the crystal orientation [1 1 1]A direction from the crystal orientation [1 0 0] direction; however, the slant of the normal direction of the main surface of the substrate 101 is not limited to 15 degrees. The normal direction of the main surface of the substrate 101 may be slanted toward one direction of the crystal orientation [1 1 1]A from one direction of the crystal orientation [1 0 0]. Moreover, in the first embodiment, the oscillation wavelength of the light-emitting portion 200 is 780 nm band; however, the oscillation wavelength of the light-emitting portion 200 may not be limited to 780 nm. The oscillation wavelength of the emitting portion 200 may be changed based on properties of the photoreceptor drum. Further, the surface-emitting laser 100 may be used for apparatuses or devices other than the image forming apparatus described in the first embodiment. In such cases, the oscillation wavelength may be 650 nm band, 850 nm band, 980 nm band, 1.3 μm band, or 1.5 μm band based on its application purposes. In this case, a mixed crystal semiconductor material may be used for the active layer formed of a semiconductor material. For example, if the oscillation wavelength is 650 nm band, AlGaInP series mixed crystal semiconductor material is used. If the oscillation wavelength is 980 nm band, InGaAs series mixed crystal semiconductor material is used.

If the oscillation wavelength is 1.3 μm band or 1.5 μm band, GaInNAs(Sb) series mixed crystal semiconductor material is used.

Moreover, a material of each reflecting mirror and a configuration of the reflecting mirror may be selected based on the oscillation wavelength. Accordingly, an emission portion having a desired oscillation wavelength may be formed. For example, the emission portion may be formed of a mixed crystal semiconductor material, such as AlGaInP mixed crystal semiconductor material, other than AlGaAs mixed crystal semiconductor material. Note that a preferable combination of the low refractive index layer and the high refractive index layer may be the combination that may be transparent for the oscillation wavelength and may have the significant difference between the low refractive index layer and the high refractive index layer.

Moreover, the surface-emitting laser module 20 according to the first embodiment includes the surface-emitting lasers 100. The surface-emitting laser includes the high reflectance region having anisotropy within the emission region of the surface-emitting laser 100. The surface-emitting laser module 20 according to the first embodiment further includes the surface-emitting laser array chip 40 and the glass cover 22 that is slanted to the surface of the surface-emitting laser array chip 40 in the short axis direction (i.e., the direction having shorter width or length) of the high reflectance region. With this configuration, the feedback light emitted from the surface-emitting laser array 240 and reflected off the surface of the glass cover 22 or the like may be controlled, thereby decreasing the variability of the droop values. Thus, the surface-emitting laser module 20 according to the first embodiment may emit stable laser light without having the abnormal waveform.

Figure 39:
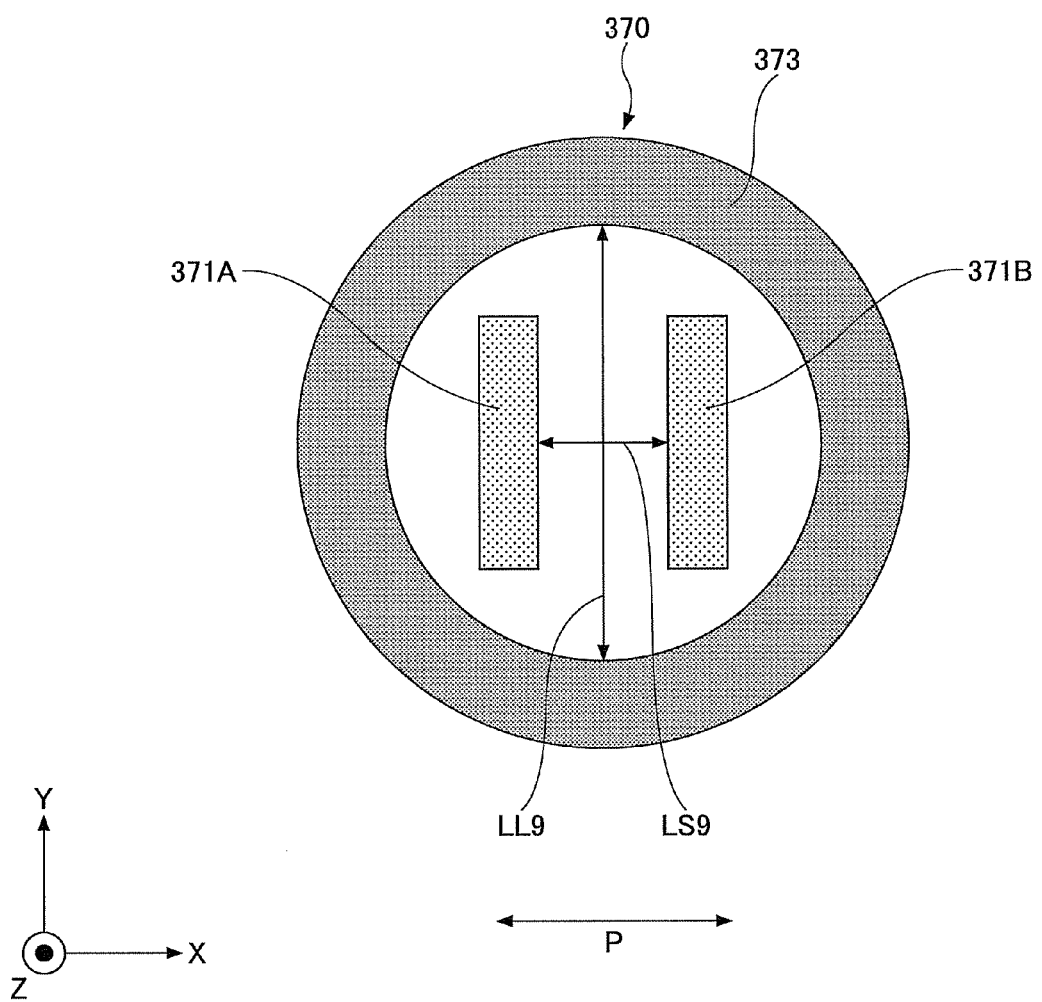
FIG. 39 is a tenth explanatory diagram illustrating the second example of the surface-emitting laser according to the first embodiment.

Note that in the above description, the shape of the mesa is described as the approximately square shape. However, similar effects may be obtained if the mesa has a circular shape. For example, as illustrated in FIG. 39, a mesa 370 may have a circular shape and a ring-shaped p-side electrode 373 is formed in the mesa 370. In the ring-shaped p-side electrode 373, rectangular transparent layers 371A and 371B are formed such that longitudinal directions of the transparent layers 371A and 371B are in the Y-axis direction. In this case, in the high reflectance region where the rectangular transparent layers 371A and 371B are not formed, an interval LS9 between the rectangular transparent layers 371A and 371B in the X-axis direction is shorter than a length LL9 in the Y-axis direction. Accordingly, the polarization direction P is the X-axis direction. In the surface-emitting laser having the circular mesa, effects similar to those obtained in the surface-emitting laser having the approximately square shape may be obtained by slanting the glass cover 22 in the X-axis direction.

In the surface-emitting laser module 20 according to the first embodiment, the glass cover 22 is slanted only in the short axis direction (i.e., in the direction having a shorter width or shorter length of the high reflectance region) of the two orthogonal axis directions, that is, the glass cover 22 is slanted only in the LS direction and is not slanted in the LL direction orthogonal to the LS direction (i.e., in parallel with the substrate surface of the surface-emitting laser array chip). However, if the glass cover 22 is slanted in the LS direction, the glass cover 22 may be slanted in the LS and LL directions.

[Second Embodiment]

Next, a surface-emitting laser module according to a second embodiment is described. As already described above, the surface-emitting laser module having plural surface-emitting lasers may require numerous wiring arrangements, and in this case, a preferable material for the package 21 may be ceramics. However, ceramics generally exhibits large variability in the fabrication process, and hence, the packages 21 may be non-uniformly fabricated with slightly different shapes if ceramics is used for the fabrication of the packages 21. If the packages 21 are non-uniformly fabricated as they have slightly different shapes, the positions of the glass cover 22 may vary. As a result, laser light emitted from the surface-emitting lasers may reach slightly different positions as they are slightly shifted from the original (expected) positions. Accordingly, the surface-emitting laser module according to the second embodiment is devised to adjust such laser emitting positions.

The adjustment of the laser emitting positions is described below in more detail. Note that a package for the optical element may be made of various materials; however, metal appears to be the most frequently used material. Since ceramics has excellent insulating properties, ceramics is frequently used as a material for the optical elements such as a charge coupled device (or a CCD) that usually require numerous wiring arrangements, and thus considered to be indispensable material for the surface-emitting laser module having plural surface-emitting lasers. Accordingly, ceramics is used as a material for the package 21 of the surface-emitting laser module used in the embodiments.

However, the package 21 made of ceramics has variability in its shape, and may not have desired optical properties when it is used in the surface-emitting laser module that needs to have highly precise optical properties. Thus, ceramics is, in general, not used as a material for the elements that require high precision such as semiconductor lasers.

Specifically, the package 21 made of ceramics is formed by baking ceramics at high temperatures of 1000° C. or more, and the ceramics shrinks at several tens of percent in the baking process. Thus, it may be difficult to satisfy the accuracy of a shape of the package 21 made of ceramics at a level of several tens of percent. Specifically, in the package 21 made of ceramics, some error of about 100 μm may be observed in a portion having several mm in height. However, such a large error may not be allowed in the surface-emitting laser module. Further, projections or chipping portions having several hundred μm in height or depth may frequently be observed in the package 21 made of ceramics. Thus, ceramics is not generally used as a package material for implementing the high precision elements.

Figure 40:
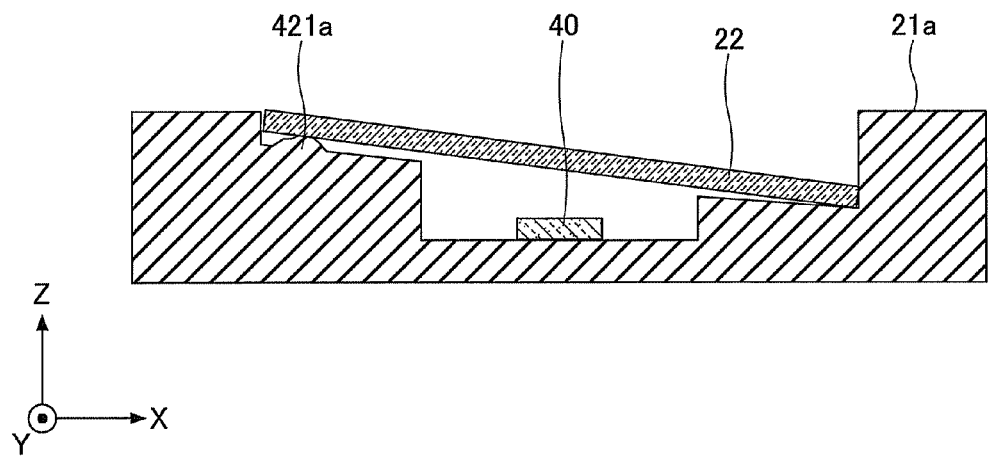
FIG. 40 is a first explanatory diagram illustrating a surface-emitting laser module.
Figure 41:
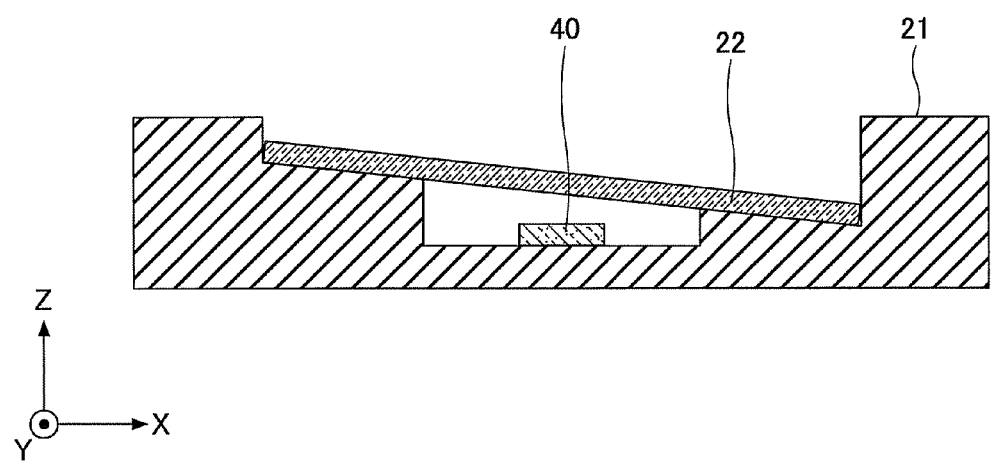
FIG. 41 is a second explanatory diagram illustrating a surface-emitting laser module.

For example, FIG. 40 illustrates a case where a package 21a includes a projection 421a. If the glass cover 22 is placed on the projection 421a, the glass cover 22 is slanted at an angle differing from a proper (expected) angle. That is, the angle at which the glass cover 22 is slanted illustrated in FIG. 41 differs from an ideal angle at which the glass cover 22 is slanted illustrated in FIG. 41. In this case, laser beams emitted from the surface-emitting lasers of the surface-emitting laser array chip 40 may form light spots at positions differing from predetermined positions.

Figure 42:
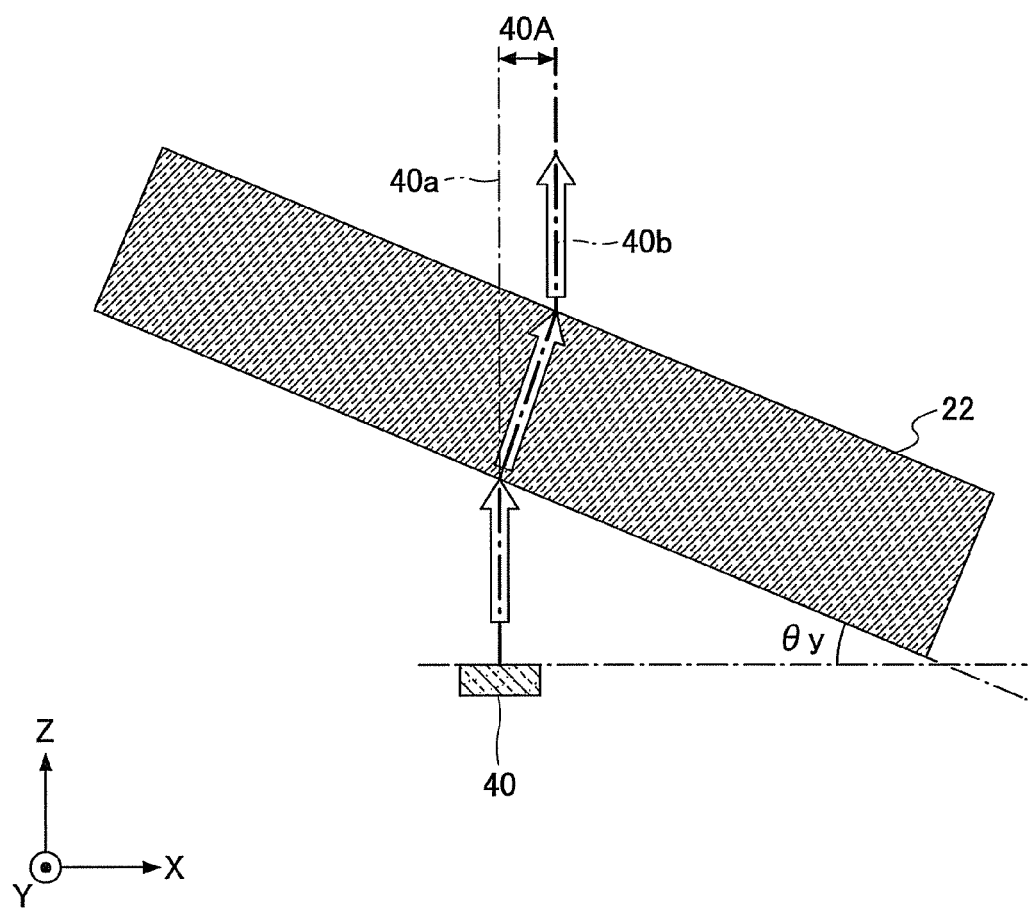
FIG. 42 is an explanatory diagram illustrating an optical path of laser light emitted from the surface-emitting laser module according to the first embodiment.
Figure 43:
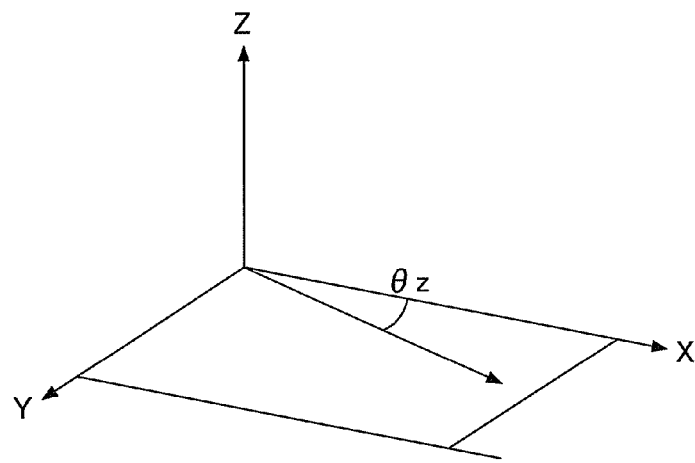
FIG. 43 is an explanatory diagram illustrating a definition of the orientation.

FIG. 42 illustrates a case where the surface of the glass cover 22 is not arranged at an angle perpendicular to an optical axis 40a of the laser light emitted from the surface-emitting lasers of the surface-emitting laser array chip 40. In this case, since the light emitted from the surface-emitting lasers of the surface-emitting laser array chip 40 is refracted in an interface of the glass cover 22, an optical path of the light refracted in the interface is deflected. Accordingly, the light emitted from the surface-emitting lasers of the surface-emitting laser array chip 40 acquires an optical path 40b at a position 40A deviated in length from an optical axis 40a. FIG. 42 illustrates a case where the length 40A changes with a slanting angle θy to the surface of the surface-emitting laser array chip 40. In this case, if the glass cover 22 is arranged at a predetermined angle in a predetermined position, the optical paths of the laser beams emitted from the surface-emitting lasers of the surface-emitting laser array chip 40 are largely deviated from their predetermined positions. As a result, the laser beams emitted from the surface-emitting lasers of the surface-emitting laser array chip 40 may not form the light spots in the corresponding predetermined positions. Thus, the surface-emitting laser module capable of emitting uniform lasers may not be fabricated in this case. Note that FIG. 42 illustrates the example where the slanting angle θy is obtained by turning based on the Y-axis is described; however, a similar effect may be obtained with an example where a not shown slanting angle θx is obtained by turning based on the X-axis. Note that the slanting angle θx is an angle obtained by turning based on the X-axis, the slanting angle θy is an angle obtained by turning based on the Y-axis, and the later-described slanting angle θz is an angle obtained by turning based on a Z-axis. FIG. 43 illustrates an example where the slanting angle θz is obtained by turning based on the Z-axis.

In the surface-emitting laser array chip 40, the surface-emitting lasers are densely arranged at pitches of several tens of μm. Thus, if the optical paths of the laser beams emitted from the surface-emitting lasers are largely changed based on the slanting angle of the glass cover 22, the light spots may not be formed in the predetermined positions.

(Surface-Emitting Laser Module)

Figure 44:
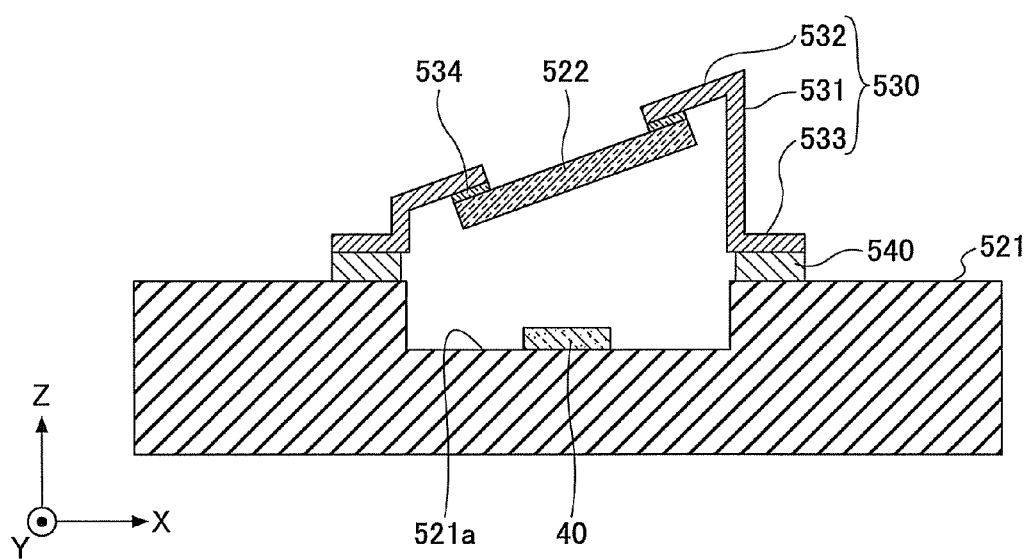
FIG. 44 is a configuration diagram illustrating a surface-emitting laser module according to a second embodiment.

Next, the surface-emitting laser array according to the second embodiment is described. As illustrated in FIG. 44, the surface-emitting laser array according to the second embodiment includes a package 521, a cap 530 including a glass cover 522, and a ring 540 connecting the package 521 and the cap 530.

The package 521 is made of ceramics and is a flat package called a ceramic leaded chip carrier (or CLSS). The package 521 includes a recess formed in an XY plane, and the surface-emitting laser array chip 40 is placed on a bottom 521a of the recess in the XY plane. The package 521 has a multilayer structure formed of ceramic layers and metallic wires. The metallic wires are connected to not shown respective metallic casers on outer side surfaces, and are radially formed from the center to the periphery of the bottom 521a of the package 521. The package 521 may be mass-produced; however, since the package 521 is made of ceramics, the fabrication tolerance of the package 521 may be approximately several percent. If the packages 521 are mass-produced from an identical lot, the variability may be relatively low; however, if the packages 521 are mass-produced from different lots, the variability may become high.

The glass cover 522 includes antireflective films made of a dielectric film or a dielectric multilayer film on both its sides such that the transmittance of the glass cover 522 is 99% or more. Note that the surfaces of the glass cover 522 are planarized by polishing or the like such that the surface smoothness of the glass cover 522 is λ/4 or less. Further, since the glass cover 522 is configured to transmit high quality laser light, the glass cover 522 may have little refractive index dispersion or defect.

Figure 45:
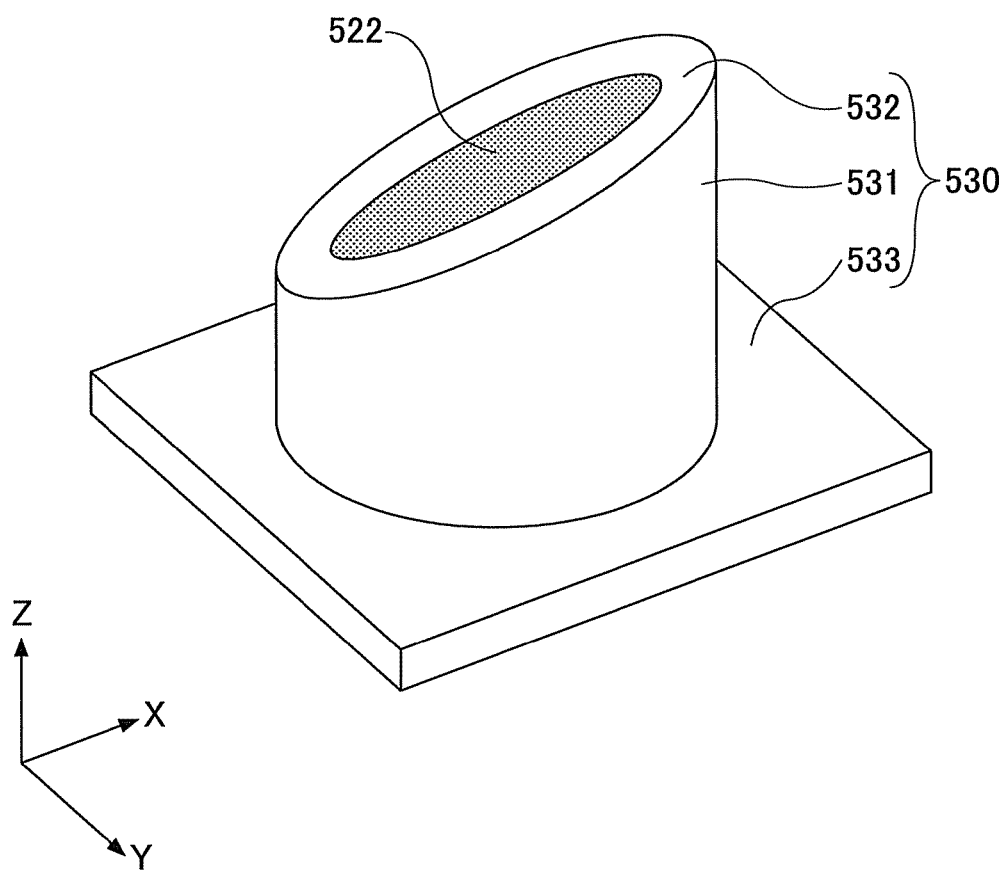
FIG. 45 is a perspective diagram illustrating a cap of the surface-emitting laser module according to the second embodiment.

The cap 530 includes a main body 531 made of kovar and having an approximately cylindrical shape (see FIG. 45), a top portion 532 formed on a side of the main body 531 such that the glass cover 522 is attached at a predetermined angle, and a bottom portion 533 connected to the package 521 via a ring 540. The cap 530 is formed into a predetermined structure by a drawing process. Since the drawing process is capable of forming a high precision cap 530, the processing accuracy of the cap 530 may be significantly high compared to that of the ceramics.

The glass cover 522 is attached to the top portion 532 of the cap 530 via low-melting point glass 534 such that the glass cover 522 is slanted at a predetermined angle to the light-emitting surface of the surface-emitting laser array ship 40. The glass cover 522 is fixed to the top portion 532 of the cap 530 with low-melting point glass 534 at temperatures of 500° C. or lower to prevent the glass cover 522 from deforming due to heat. Note that since the low-melting point glass 534 generally softens at temperatures of 500° C. or lower, the low-melting point glass 534 may be used as adhesive. In addition, the low-melting point glass 534 has significantly high sealing force against moisture compared to that of ultraviolet (UV) curable resin.

The surface-emitting laser array chip 40 is arranged such that the light emitting surface of the surface-emitting laser array chip 40 is an XY plane, and the glass cover 522 is fixed to the cap 530 such that the slanting angle of the glass cover 522 is 20 degrees based on the Y-axis of the XY plane. If the glass cover 522 is fixed to the cap 530 at this angle, the surface-emitting lasers of the surface-emitting laser array chip 40 may emit laser light without light fluctuation. Further, in the surface-emitting laser module 20 according to the second embodiment, the tolerance of the slanting angle of 20 degrees is set at 1 degree.

It is possible to fix the glass cover 522 to the top portion 532 of the cap 530 via the low-melting point glass 534 with an accuracy of less than 1 degree, and the same accuracy level may be maintained while fixing the glass cover 522 to the top portion 532 of the cap 530 via the low-melting point glass 534 on mass production lines.

Figure 46:
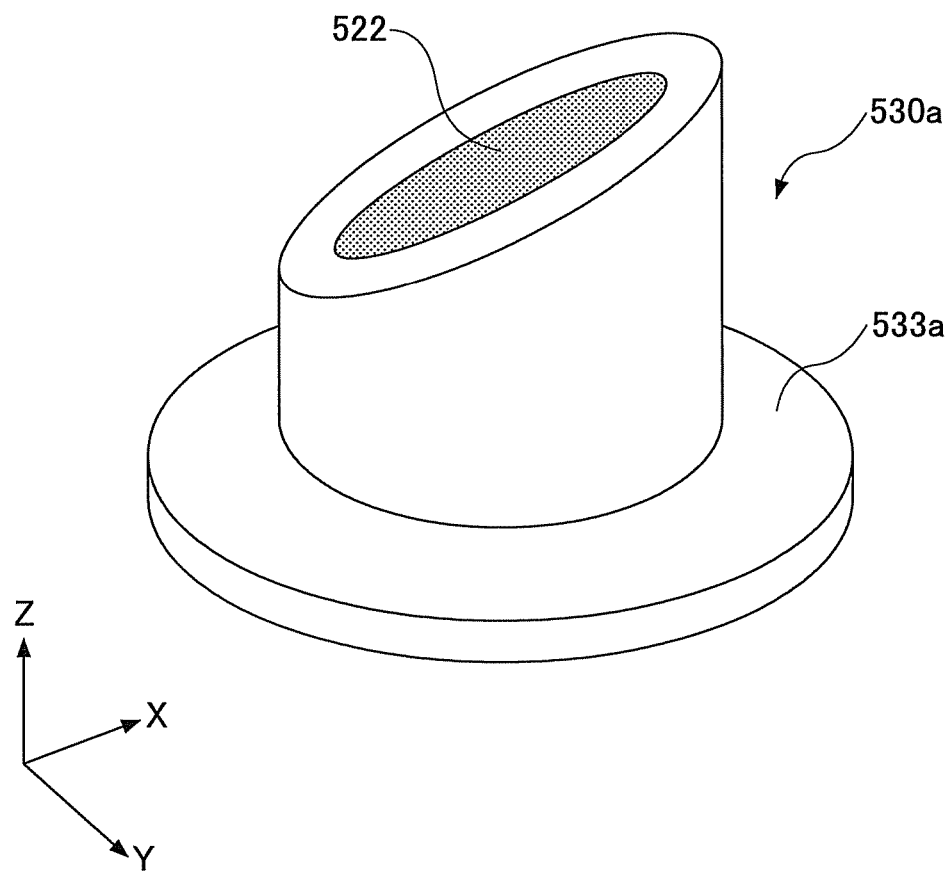
FIG. 46 is a perspective diagram illustrating another cap of the surface-emitting laser module according to the second embodiment.

It is preferable that an opening of the top portion 532 of the cap 530 to which the glass cover 522 is fixed have a circular shape or an oval shape. By forming the opening with the circular shape or the oval shape, mechanical vignetting may be reduced compared to a rectangular opening formed in the top portion 532 of the cap 530. Further, in the second embodiment, the bottom portion 533 of the cap 530 has a rectangular shape or a square shape. Accordingly, sides of the rectangular or square bottom portions 533 of the cap 530 and sides of the bottom 521a of the package 521 may be easily aligned with high accuracy so that the cap 530 is connected to the desired position. That is, by forming the bottom 521a of the package 521 analogous with the bottom portions 533 of the cap 530, the bottom 521a of the package 521 may be aligned in the bottom portions 533 of the cap 530 with high accuracy. FIG. 46 illustrates another cap 530a that includes a bottom portion 533a having an approximately circular shape.

Figure 47:
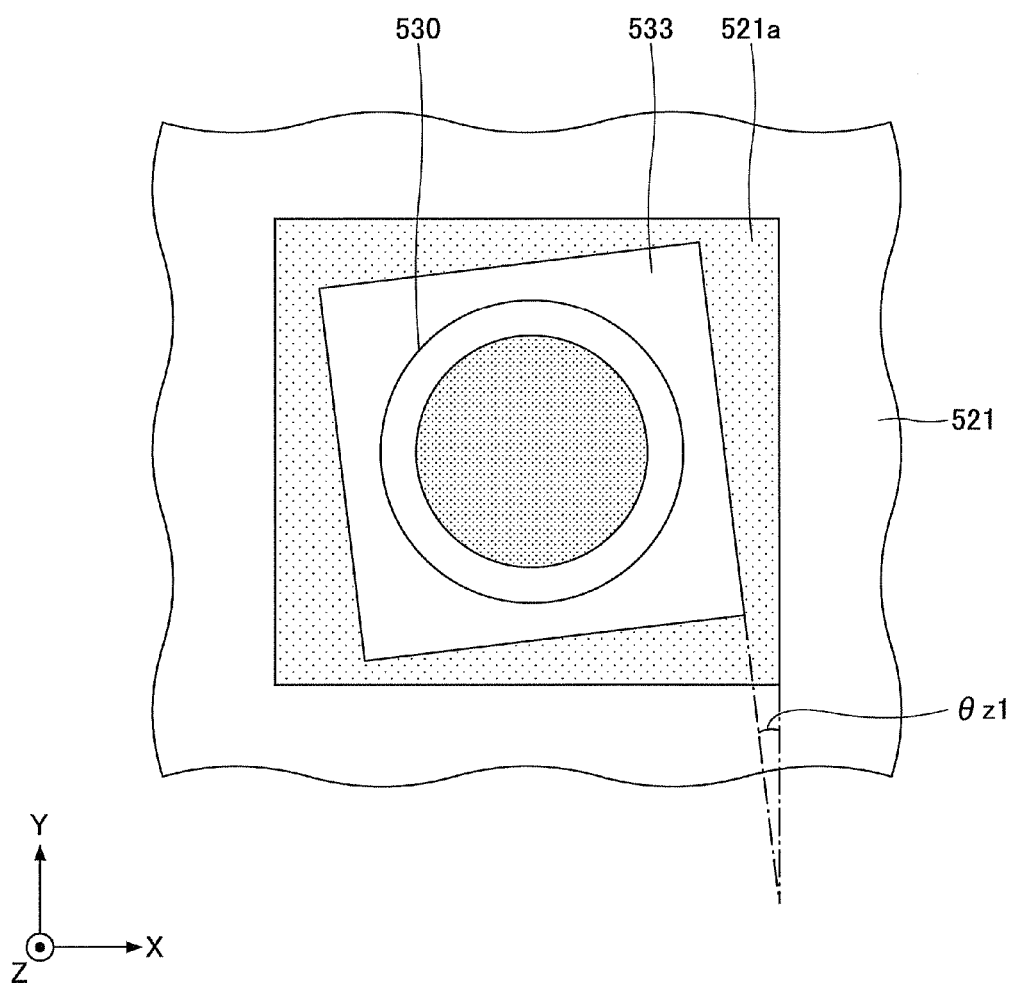
FIG. 47 is a first explanatory diagram illustrating alignment of the cap of the surface-emitting laser module according to the second embodiment.

Next, the connection between the package 521 and the cap 530 is described with reference to FIG. 47. The bottom 521a of the package 521 has an approximately rectangular shape, and the sides of the bottom 521a are arranged in parallel with the corresponding one of the X-axis and the Y-axis. The bottom portion 533 of the cap 530 has an approximately rectangular shape, and the sides of the bottom portion 533 are arranged in parallel with the corresponding one of the X-axis and the Y-axis. That is, in the surface-emitting laser module according to the second embodiment, the sides of the bottom 521a of the package 521 and the sides of the bottom portion 533 of the cap 530 are aligned in parallel with one another. Accordingly, an angle error θz1 may be reduced to approximately 0 degrees and hence, the cap 530 may be easily attached in the predetermined position. However, since the bottom portion 533a of the cap 530a illustrated in FIG. 46 has an approximately circular shape, the bottom portion 533a of the cap 530a may not be aligned with the bottom 521a of the package 521 in the same manner as the alignment illustrated in FIG. 47.

The ring 540 (see FIG. 44) is made of kovar for seam welding, and is attached to the periphery of the bottom 521a of the package 521 with silver solder. The ring 540 may be bonded to the package 521 by a high temperature bonding method before the surface-emitting laser array chip 40 is fixed to the package 521. Further, the ring 540 may be bonded to the predetermined position of the package 521 while the package 521 is fixed by a package holder and the ring 540 is fixed by a ring holder. Accordingly, the ring 540 may be accurately bonded to the predetermined position of the package 521. In the second embodiment, the package 521 and the ring 540 are bonded with silver solder at a temperature of 750° C. The silver solder used for bonding contains 40% silver, and is hence completely melted at a temperature of 750° C. Note that the ring 540 is bonded to the predetermined position of the package 521 while the package 521 is fixed by a package holder and the ring 521 is fixed by a ring holder. Accordingly, the surface of the package 521 and a bottom surface of the ring 540 may be bonded in parallel with each other with high accuracy.

Thereafter, the ring 540 bonded to the package 521 and the bottom portion 533 of the cap 530 are sealed by a seam welding machine (Origin Electric Co., Ltd.). Specifically, the cap 530 is placed on the ring 540 such that the bottom portion 533 is in contact with the ring 540 to which the package 521 is bonded. An approximately 90 A current is applied to a contact portion where a Au layer formed on the surface of the ring 540 is in contact with a Ni layer formed on the surface of the bottom portion 533 of the cap 530. As a result, Joule heat is generated by contact resistance induced by the contact portion, so that the bottom portion 533 of the cap 530 and the ring 540 are welded with a eutectic alloy of Au and Ni. Accordingly, the cap 530 to which the glass cover 522 is fixed is connected to the package 521 via the ring 540.

In the seam welding of the ring 540 and the cap 530, heat is generated from a local contact portion where the ring 540 is in contact with the cap 530. Accordingly, the amount of the generated heat is too small to be transmitted to the glass cover 522, and hence, the glass cover 522 may not deform due the heat generated in the seam welding. Further, the cap 530 is bonded to the package 521 by seam welding while the package 521 to which the ring 540 is welded is held by the package holder and the cap 530 is held by a cap holder. Accordingly, the heat generated by the seam welding may be transmitted to the cap holder having a large heat capacity, and hence, the transfer of the heat generated by the seam welding may be prevented.

Figure 48:
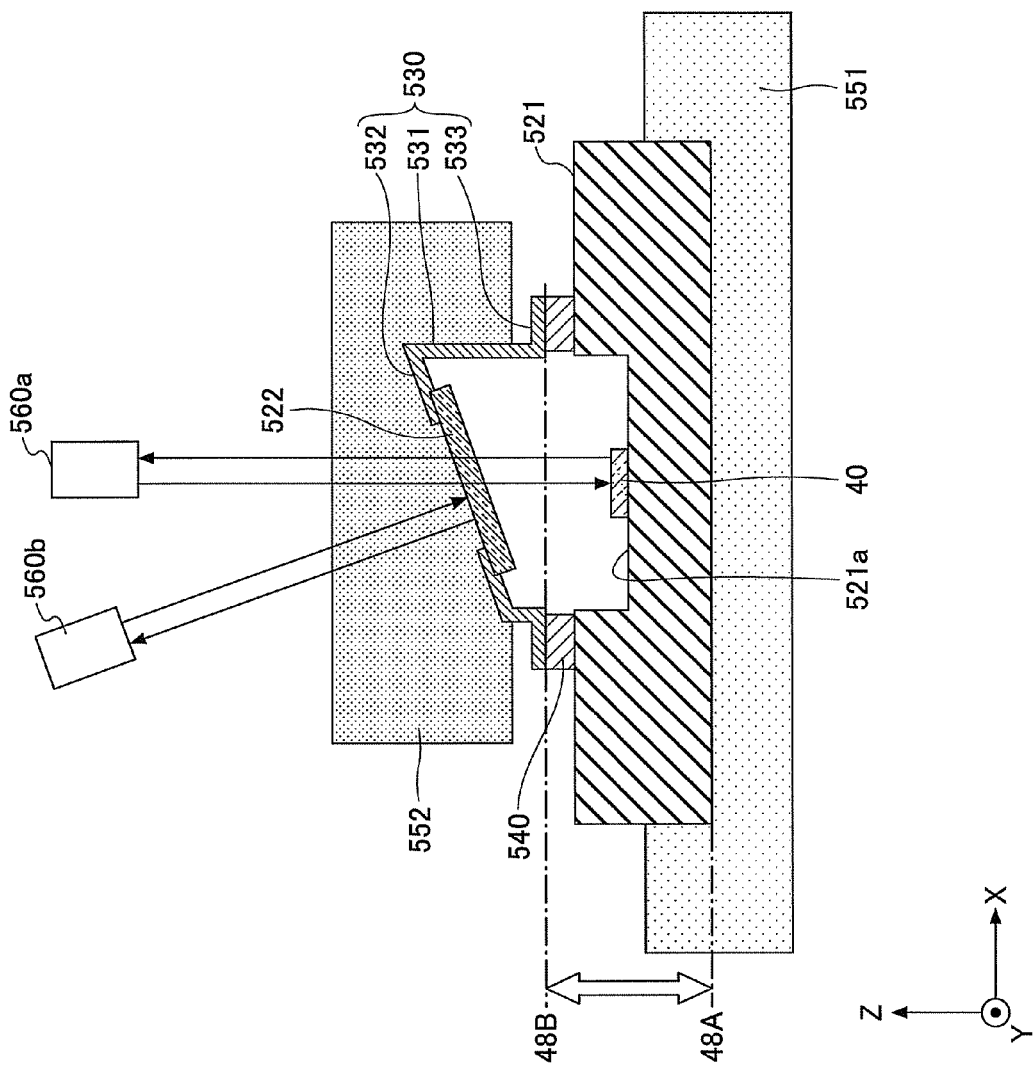
FIG. 48 is a second explanatory diagram illustrating alignment of the cap of the surface-emitting laser module according to the second embodiment.

FIG. 48 is a diagram illustrating alignment of the cap 530 of the surface-emitting laser module according to the second embodiment to increase the accuracy of the location of the glass cover 522. As illustrated in FIG. 48, the package 521 is fixed by a package holder 551 and the cap 530 is fixed by a cap holder 552. The package 521 fixed by the package holder 551 and the cap 530 fixed by the cap holder 552 are then aligned such that the rear surface of the package 521 and the bottom portion 533 of the cap 530 are in parallel with each other. Thereafter, the cap 530 fixed by the cap holder 552 is seam welded to the package 521 fixed by the package holder 551 while the bottom portion 533 of the cap 530 and the rear surface of the package 521 are in parallel with each other. That is, after a dash-dot line 48A and a dash-dot line 48B illustrated in FIG. 48 are aligned approximately in parallel with each other, the cap 530 fixed by the cap holder 552 is seam welded to the package 521 fixed by the package holder 551. The ring 540 is welded to the cap 530 in this manner. Note that the rear surface and the bottom 521a of the package 521 are formed approximately in parallel with each other.

Note that the seam welding is performed after the following adjustments. That is, the slanting angle of the package 521 is adjusted by moving the package holder 551 such that the surface-emitting laser array chip 40 is slanted at a predetermined angle that is determined by a laser light source 560a, and the slanting angle of the glass cover 522 is adjusted by moving the cap holder 552 such that the glass cover 522 is slanted at a predetermined angle that is determined by a laser light source 560b. After these adjustments, the cap 530 fixed by the cap holder 552 is seam welded to the package 521 fixed by the package holder 551. Accordingly, the glass cover 522 is fixed to the cap 530 with high accuracy such that the glass cover 522 has the predetermined angle. Note that the laser light source 560a and the laser light source 560b may not be separately prepared and one laser light source may be used as the laser light source 560a and the laser light source 560b by moving it for different adjustments.

[Third Embodiment]

Next, a third embodiment is described. The third embodiment is an image forming apparatus that includes the surface-emitting laser module according to the first or the second embodiment. In the image forming apparatus according to the third embodiment, a laser printer 100 is used as an example.

Figure 49:
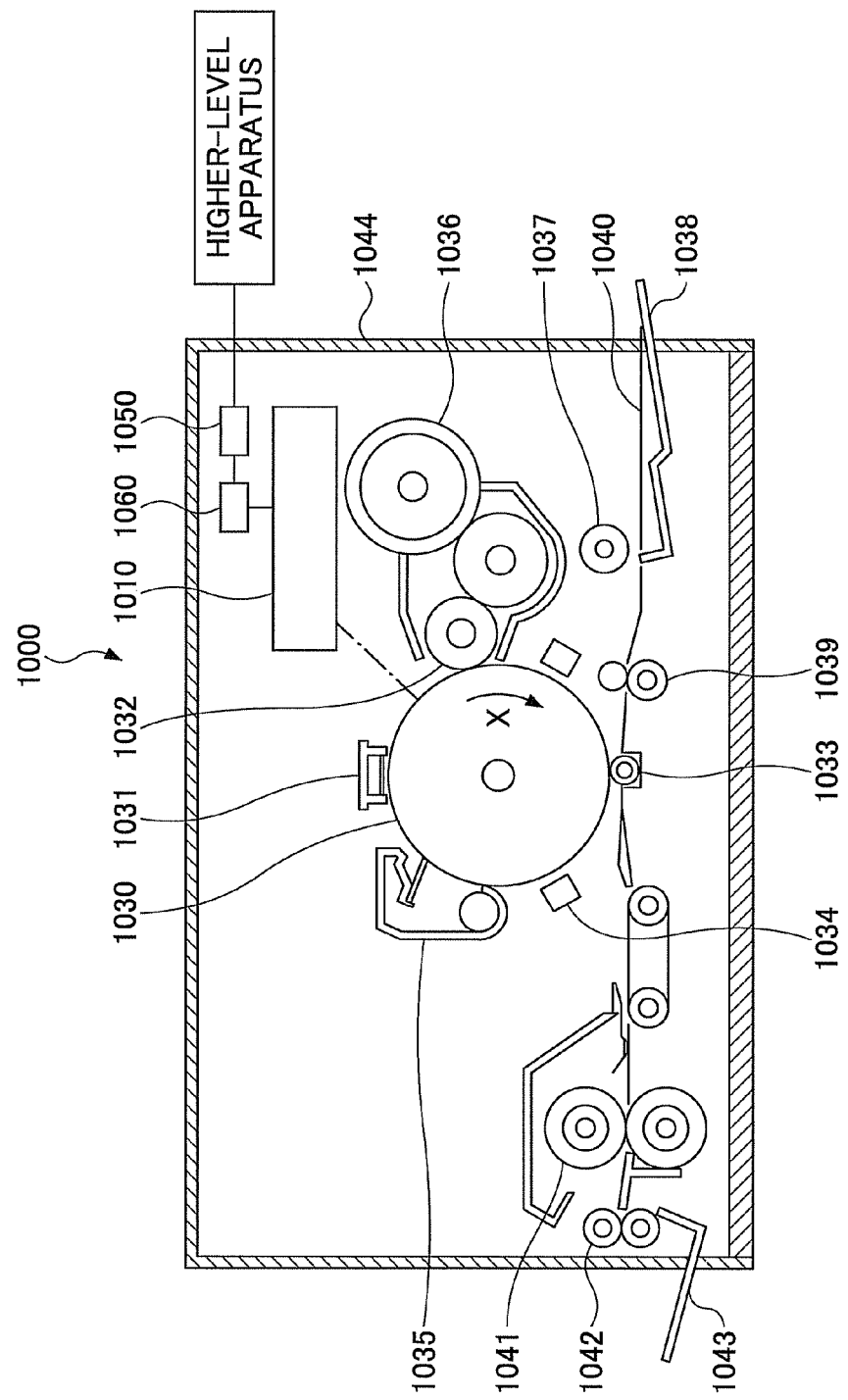
FIG. 49 is a configuration diagram illustrating a laser printer according to a third embodiment.

The laser printer 1000 as the image forming apparatus according to the third embodiment is described with reference to FIG. 49. The laser printer 1000 includes an optical scanner device 1010, a photoreceptor drum 1030, an electrostatic charger 1031, a developing roller 1032, a transfer charger 1033, a static eliminator unit 1034, a cleaning unit 1035, a toner cartridge 1036, a paper feeding roller 1037, a paper feeding tray 1038, a resist roller pair 1039, a fixing roller 1041, a paper discharge roller pair 1042, a paper discharge tray 1043, a communication controller 1050, and a printer controller 1060. The printer controller 1060 carries out overall control of the components of the laser printer 1000. Note that the above components are arranged at predetermined positions inside a printer case 1044.

The communication controller 1050 controls bidirectional communications with higher-level apparatuses such as personal computers via a network.

The photoreceptor drum 1030 is made of a cylindrical member having a photosensitive layer formed on its surface. That is, the surface of the photoreceptor drum 1030 is subject to scanning. The photoreceptor drum 1030 is configured to rotate in a direction indicated by an arrow X in FIG. 49.

The electrostatic charger 1031, the developing roller 1032, the transfer charger 1033, the static eliminator unit 1034, and the cleaning unit 1035 are arranged near the surface of the photoreceptor drum 1030. More specifically, the electrostatic charger 1031, the developing roller 1032, the transfer charger 1033, the static eliminator unit 1034, and the cleaning unit 1035 are arranged in this order near the surface of the photoreceptor drum 1030 along a rotational direction of the photoreceptor drum 1030.

The electrostatic charger 1031 is configured to uniformly charge the surface of the photoreceptor drum 1030.

The optical scanner device 1010 scans the surface of the photoreceptor 1030 that is electrostatically charged by the electrostatic charger 1031 with luminous flux modulated based on image information acquired from the higher-level apparatuses so as to form a latent image of the acquired image information on the surface of the photoreceptor drum 1030. The latent image formed on the surface of the photoreceptor drum 1030 travels with the rotation of the photoreceptor drum 1030 in a direction toward the developing roller 1032. Note that a configuration of the optical scanner device 1010 is described later.

The toner cartridge 1036 contains toner, which is supplied to the developing roller 1032.

The developing roller 1032 applies the toner supplied from the toner cartridge 1036 to the latent image formed on the surface of the photoreceptor drum 1030 to make the latent image visible. Note that the latent image with the toner applied (hereinafter also called a "toner image" for convenience) travels with the rotation of the photoreceptor 1030 in a direction toward the transfer charger 1033.

The paper feeding tray 1038 contains sheets of recording paper 1040. The paper feeding roller 1037 is arranged near the paper feeding tray 1038 to pick one sheet of the recording paper 1040 at a time from the paper feeding tray 1038 and then transfer the picked recording sheet 1040 to the resist roller pair 1039. The resist roller pair 1039 temporarily holds the recording sheet 1040 picked by the paper feeding roller 1037 and transfers it into a gap between the photoreceptor drum 1030 and the transfer charger 1033 with the rotation of the photoreceptor drum 1030.

The transfer charger 1033 has applied a voltage having a polarity opposite to the polarity of the toner such that the toner applied on the surface of the photoreceptor drum 1030 is electrically attracted by the recording sheet 1040. The toner image on the surface of the photoreceptor drum 1030 is thus transferred to the recording sheet 1040. The recording sheet 1040 having the transferred toner image is transferred to the fixing roller 1041.

The fixing roller 1041 applies heat and pressure to the recording sheet 1040 such that the toner image is fixed on the recording sheet 1040. The recording sheet 1040 having the fixed toner image is transferred to the paper discharge tray 1043 via the roller pair 1042 and sequentially stacked on the paper discharge tray 1043.

The static eliminator unit 1034 is configured to neutralize (diselectrify) the surface of the photoreceptor drum 1030.

The cleaning unit 1035 is configured to remove remaining toner from the surface of the photoreceptor drum 1030. The position of the surface of the photoreceptor drum 1030, from which the remaining toner is removed, returns to a position that faces the electrostatic charger 1031.

Figure 50:
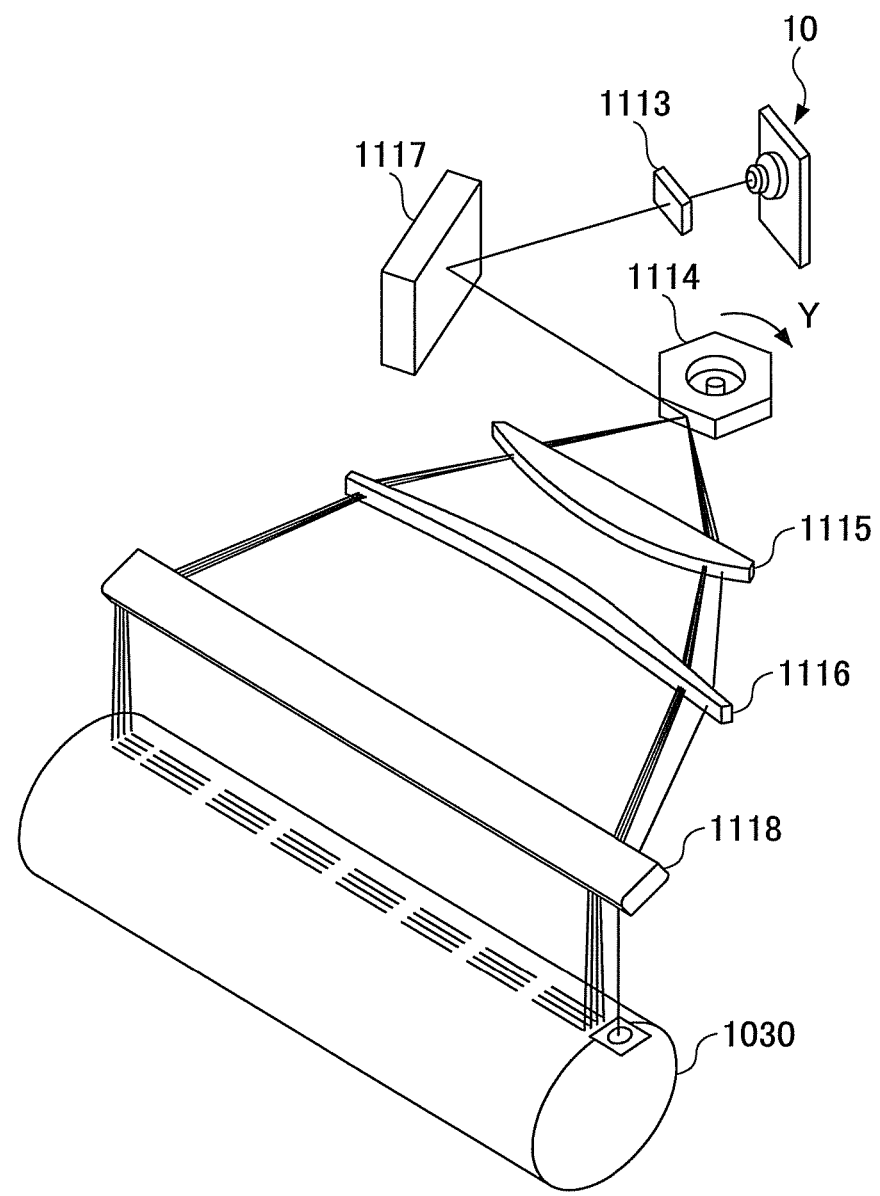
FIG. 50 is a configuration diagram illustrating an optical scanner device of the laser printer according to the third embodiment.

Next, a configuration of an optical scanner device 1010 is described with reference to FIG. 50. As illustrated in FIG. 50, the optical scanner device 1010 includes an illuminant unit 10, a not-shown coupling lens, a not-shown aperture plate, a cylindrical lens 1113, a polygon mirror 1114, a fθ lens 1115, a toroidal lens 1116, two mirrors 1117 and 1118, and a not-shown scanner controller. The not-shown controller integrally controls these components of the optical scanner device 1010. Note that the illuminant unit 10 illustrated in FIG. 50 indicates the illuminant unit 10 according to the first or the second embodiment that includes the surface-emitting laser module illustrated in FIG. 1.

The cylindrical lens 1113 converges light emitted from the illuminant unit 10 near a reflection deflecting surface of the polygon mirror 1114 via the mirror 1117.

The polygon mirror 114 is formed of a low equilateral-hexagonal column member having six reflection deflecting surfaces on its side surfaces. The polygon mirror 114 is turned by a not-shown turning mechanism at a constant angular velocity in a direction indicated by an arrow Y in FIG. 50.

With this configuration, when laser light is emitted from the illuminant unit 10 and the emitted light is converged near the reflection deflecting surface of the polygon mirror 1114, the converged light is deflected at a constant angular velocity while the polygon mirror 114 is turning in the direction indicated by the arrow Y in FIG. 50.

Since the fθ lens 1115 has a field angle in proportion to an incident angle of light obtained from the polygon mirror 1115, an image surface deflected at the constant angular velocity by the polygon mirror 1114 is moved at a constant velocity. The toroidal lens 1116 receives the light from the fθ lens 1115 and transmits the received light to the photoreceptor drum 1030 to form an image on a surface of the photoreceptor drum 1030.

The toroidal lens 1116 is arranged in the optical path of luminous flux received via the fθ lens 1115. The luminous flux received via the toroidal lens 1116 is applied on the surface of the photoreceptor drum 1030 to form optical spots. The optical spots travel with the rotation of the polygon mirror 1114 in a longitudinal direction of the photoreceptor drum 1030. That is, the optical spots scan the surface of the photoreceptor drum 1030. The moving direction of the optical spots indicates a "main-scanning direction". Further, the rotational direction of the photoreceptor drum 1030 is a "sub-scanning direction".

An optical system provided in an optical path between the polygon mirror 1114 and the photoreceptor drum 1030 may also be called a "scanning optical system". The scanning optical system in the third embodiment includes the fθ lens 1115 and the toroidal lens 1116. Note that at least one folding mirror may be arranged in at least one of an optical path between the fθ lens 1115 and the toroidal lens 1116 and an optical path between the oroidal lens 1116 and the photoreceptor drum 1030.

Since the laser printer 1000 according to the third embodiment includes the surface-emitting laser module according to the first or the second embodiment, the laser printer 1000 may print an image, even if writing dot-density is increased, without lowering the printing speed. Further, the laser printer 1000 may print the image at a higher printing speed if the writing dot-density is constant.

In this case, the polarization directions of the luminous flux emitted from the light-emitting portions are stably aligned, so that the laser printer 1000 may stably form high quality images.

Note that as already mentioned, the laser printer 1000 used in the description of the third embodiment is an example of the image forming apparatus; however, the image forming apparatus is not limited to the laser printer 1000.

For example, an image forming apparatus may be configured to directly apply laser light to a medium such as paper that is capable of developing colors by the application of laser light.

Further, an image forming apparatus may be configured to include a silver film as an image carrier. In this case, a latent image is formed on the silver film by optical scanning, and the latent image is visualized by a process similar to a developing process of an ordinary silver halide photography process. Subsequently, the visualized image is transferred onto photographic printing paper by a printing process similar to that carried out by the ordinary silver halide photography process. Such an image forming apparatus may be realized as an optical plate-making apparatus or an optical plotting apparatus that plots a CT scanned image and the like.

[Fourth Embodiment]

Next, a fourth embodiment is described. The fourth embodiment is an image forming apparatus that includes plural photoreceptor drums. A color printer 2000 is used as an example of the image forming apparatus according to the fourth embodiment that includes the plural photoreceptor drums as illustrated in FIG. 51.

The color printer 2000 as the image forming apparatus according to the fourth embodiment is described with reference to FIG. 51. The color printer 2000 is a tandem type multi-color printer that forms a full-color image by superposing four colors (black, cyan, magenta, and yellow). The color printer 2000 includes a black set of "a photoreceptor drum K1, a charging device K2, a developing device K4, a cleaning unit K5, and a transfer device K6"; a cyan set of "a photoreceptor drum C1, a charging device C2, a developing device C4, a cleaning unit C5, and a transfer device C6"; a magenta set of "a photoreceptor drum M1, a charging device M2, a developing device M4, a cleaning unit M5, and a transfer device M6"; and a yellow set of "a photoreceptor drum Y1, a charging device Y2, a developing device Y4, a cleaning unit Y5, a transfer device Y6"; an optical scanner device 2010; a transfer belt 2080; and a fixing unit 2030.

The photoreceptor drums K1, C1, M1, and Y1 are rotated along respective rotational directions as indicated by respective arrows in FIG. 51. There are provided the charging devices K2, C2, M2, and Y2, the developing devices K4, C4, M4, and Y4, the cleaning devices K5, C5, M5, and Y5, and the transfer devices K6, C6, M6, and Y6 in the corresponding periphery of the photoreceptor drums K1, C1, M1, and Y1. The charging devices K2, C2, M2, and Y2 are configured to uniformly charge respective surfaces of the photoreceptor drums K1, C1, M1, and Y1. The respective surfaces of the photoreceptor drums K1, C1, M1, and Y1 are charged by the charging devices K2, C2, M2 and Y2, and the charged surfaces of the photoreceptor drums K1, C1, M1, and Y1 have applied light emitted from the optical scanner device 2010. Accordingly, respective latent images are formed on the surfaces of the photoreceptor drums K1, C1, M1, and Y1. Thereafter, toner images of different colors are formed by the corresponding color of the developing devices K4, C4, M4, and Y4 on the surfaces of the photoreceptor drums K1, C1, M1, and Y1. Further, the toner images of the different colors formed on the photoreceptor drums K1, C1, M1, and Y1 are transferred by the corresponding colors of the transfer devices K6, C6, M6, and Y6 onto a recording sheet carried on the surface of the transfer belt 2080, and a full color image is then fixed on the recording sheet by the fixing unit 2030.

Note that since the optical scanner device 2010 includes the illuminant units 10 of different colors each having the surface-emitting laser module according to the first or the second embodiment illustrated in FIG. 1, the optical scanner device 2010 may provide effects similar to those obtained by the optical scanner device 1010. Further, since the color printer 2000 includes the optical scanner device 2010, the color printer 2000 may provide effects similar to those obtained by the laser printer 1000 described as the image forming apparatus according to the third embodiment.

Note that in the color printer 2000, color misalignment may occur due to a fabrication error or locating error of its components. However, in this case, since light sources of the optical scanner device 2010 are formed of the illuminant unit 10 illustrated in FIG. 1 each including the surface-emitting laser module according to the first or the second embodiment, color misalignment may be controlled by selecting appropriate light-emitting portions that are allowed to emit laser light.

Accordingly, since the color printer 2000 according to the fourth embodiment includes the surface-emitting laser module according to the first or the second embodiment, the color printer 2000 may form a high quality image.

According to the above-described embodiments, there are provided the surface-emitting laser module exhibiting little laser light fluctuation due to feedback light, an optical scanner device and an image forming apparatus having such a surface-emitting module.

In one embodiment, there is provided a surface-emitting laser module that includes a surface-emitting laser formed on a substrate and configured to emit light perpendicular to a surface thereof; a package including a recess portion in which the substrate having the surface-emitting laser formed thereon is arranged; and a transparent substrate arranged to cover the recess portion of the package together with the substrate having the surface-emitting laser formed thereon located in the recess portion of the package such that the transparent substrate and the package are connected to each other on a light emitting side of the surface-emitting laser. In the surface-emitting laser module, a high reflectance region having a high reflectance of the light emitted from the surface-emitting laser and a low reflectance region having a low reflectance of the light emitted therefrom are formed within a region enclosed by an electrode formed on an upper part of a mesa of the surface-emitting laser. In the surface-emitting laser module, the transparent substrate is slanted to the surface of the substrate having the surface-emitting laser formed thereon in a polarization direction of the light emitted from the surface-emitting laser determined by the high reflectance region and the low reflectance region formed within the region enclosed by the electrode on the upper part of the mesa of the surface-emitting laser.

Further, in the surface-emitting laser module, the high reflectance region formed within the region enclosed by the electrode on the upper part of the mesa of the surface-emitting laser has two different widths in two orthogonal axis directions, and the transparent substrate is slanted to the surface of the substrate having the surface-emitting laser formed thereon in a corresponding one of the two orthogonal axis directions of which the high reflectance region has a shorter width.

Moreover, in the surface-emitting laser module, the transparent substrate is not slanted to the surface of the substrate having the surface-emitting laser formed thereon in a direction perpendicular to the polarization direction of the light emitted from the surface-emitting laser determined by the high reflectance region and the low reflectance region formed within the region enclosed by the electrode on the upper part of the mesa of the surface-emitting laser.

Further, in the surface-emitting laser module, an upper surface of the mesa of the surface-emitting laser is formed in a square shape or a rectangular shape.

Moreover, in the surface-emitting laser module, the polarization direction of the light emitted from the surface-emitting laser determined by the high reflectance region and the low reflectance region formed within the region enclosed by the electrode on the upper part of the mesa of the surface-emitting laser is parallel to one of sides of the square shape or the rectangular shape.

Further, in the surface-emitting laser module, an antireflective film is formed on one of two surfaces of the transparent substrate or two surfaces of the transparent substrate.

Moreover, in the surface-emitting laser module, the high reflectance region and the low reflectance region formed within the region enclosed by the electrode on the upper part of the mesa of the surface-emitting laser are formed by forming dielectric films having two different film thicknesses on the upper surface of the mesa, and an optical film thickness of the high reflectance region formed within the region enclosed by the electrode on the upper part of the mesa of the surface-emitting laser is an even multiple of $\lambda/4$ provided that a wavelength of the light is $\lambda$.

Further, in the surface-emitting laser module, the high reflectance region and the low reflectance region formed within the region enclosed by the electrode on the upper part of the mesa of the surface-emitting laser are formed by forming dielectric films having two different film thicknesses on the upper surface of the mesa, and an optical film thickness of the low reflectance region formed within the region enclosed by the electrode on the upper part of the mesa of the surface-emitting laser is an odd multiple of λ/4 provided that a wavelength of the light is λ.

Moreover, in the surface-emitting laser module, the dielectric films are formed of a silicon oxide film, a silicon nitride film, or a silicon oxynitride film.

Further, the surface-emitting laser module further includes a surface-emitting laser array having a plurality of the surface-emitting lasers. In the surface-emitting laser module, the surface-emitting laser array having the plural surface-emitting lasers is formed on the substrate.

Moreover, the surface-emitting laser module further includes a cap to hold the transparent substrate. In the surface-emitting laser module, the cap is connected to the package via a ring to which the package is connected.

Further, in the surface-emitting laser module, the cap includes a bottom portion to which the ring is connected, and the bottom portion of the cap is formed in a square shape or a rectangular shape.

Moreover, in the surface-emitting laser module, the cap includes a bottom portion to which the ring is connected, and the bottom portion of the cap is formed in a shape analogous to a shape of the recess portion of the package.

Further, in the surface-emitting laser module, the ring and the cap is connected by seam welding.

In another embodiment, there is provided an optical scanner device to optically scan a surface subject to scanning with light. The optical scanner device includes a light source including the surface-emitting laser module; a light deflecting portion to deflect the light emitted from the light source; and a scanning optical system to converge the light deflected by the light deflecting portion onto the surface subject to scanning.

In another embodiment, there is provided an image forming apparatus that includes an image carrier; and the optical scanner device to scan light modulated based on image information on the image carrier.

The image forming apparatus further includes a plurality of the image carriers. In the image forming apparatus, the image information is multicolored image information.

Embodiments of the present invention have been described heretofore for the purpose of illustration. The present invention is not limited to these embodiments, but various variations and modifications may be made without departing from the scope of the present invention. The present invention should not be interpreted as being limited to the embodiments that are described in the specification and illustrated in the drawings.

The present application is based on Japanese Priority Application No. 2010-062220 filed on Mar. 18, 2010, and Japanese Priority Application No. 2011-008870 filed on Jan. 19, 2011, with the Japanese Patent Office, the entire contents of which are hereby incorporated by reference.

What is claimed is:

1. A surface-emitting laser module comprising:
a surface mining laser array, including a plurality of surface-emitting lasers, formed on a substrate, each of the surface-emitting lasers being configured to emit light perpendicular to a surface thereof;
a package including a recess portion in which the substrate having the surface-emitting laser array formed thereon is arranged; and
a transparent substrate arranged to cover the recess portion of the package together with the substrate having the surface-emitting laser array formed thereon located in the recess portion of the package such that the transparent substrate and the package are connected to each other on a light emitting side of the surface-emitting laser array, wherein
a high reflectance region and a low reflectance region are formed within an emission region enclosed by an electrode formed on an upper part of a mesa of each of the surface-emitting lasers, the high reflectance region being formed in a central part of the emission region and the low reflectance region being formed in a peripheral part of the emission region, the central part having a reflectance higher than the peripheral part, and wherein
the high reflectance region includes two different widths in two orthogonal axis directions on a surface in parallel with the upper part of the mesa, a width of the high reflectance region in one axis direction amongst the axis directions being shorter than a width of the high reflectance region in the other axis amongst the axis directions, and the transparent substrate is slanted to a surface of the substrate in the one axis direction having the shorter width.

2. The surface-emitting laser module as claimed in claim 1, wherein
the transparent substrate is not slanted to the surface of the substrate having the surface-emitting laser formed thereon in a direction perpendicular to the polarization direction of the light emitted from the surface-emitting laser determined by the high reflectance region and the low reflectance region formed within the region enclosed by the electrode on the upper part of the mesa of the surface-emitting laser.

3. The surface-emitting laser module as claimed in claim 1, wherein
an upper surface of the mesa of the surface-emitting laser is formed in a square shape or a rectangular shape.

4. The surface-emitting laser module as claimed in claim 3, wherein the polarization direction of the light emitted from the surface-emitting laser determined by the high reflectance region and the low reflectance region formed within the region enclosed by the electrode on the upper part of the mesa of the surface-emitting laser is parallel to one of sides of the square shape or the rectangular shape.

5. The surface-emitting laser module as claimed in claim 1, wherein
an antireflective film is formed on one of two surfaces of the transparent substrate or two surfaces of the transparent substrate.

6. The surface-emitting laser module as claimed in claim 1 wherein
the high reflectance region and the low reflectance region formed within the region enclosed by the electrode on the upper part of the mesa of the surface-emitting laser are formed by forming dielectric films having two different film thicknesses on the upper surface of the mesa, and
an optical film thickness of the high reflectance region formed within the region enclosed by the electrode on the upper part of the mesa of the surface-emitting laser is an even multiple of λ/4 provided that a wavelength of the light is λ.

7. The surface-emitting laser module as claimed in claim 6, wherein the dielectric films are formed of a silicon oxide film, a silicon nitride film, or a silicon oxynitride film.

8. The surface-emitting laser module as claimed in claim 1, wherein
the high reflectance region and the low reflectance region formed within the region enclosed by the electrode on the upper part of the mesa of the surface-emitting laser are formed by forming dielectric films having two different film thicknesses on the upper surface of the mesa, and
an optical film thickness of the low reflectance region formed within the region enclosed by the electrode on the upper part of the mesa of the surface-emitting laser is an odd multiple of $\lambda/4$ provided that a wavelength of the light is $\lambda$.

9. The surface-emitting laser module as claimed in claim 1. further comprising:
a cap to hold the transparent substrate, wherein
the cap is connected to the package via a ring to which the package is connected.

10. The surface-emitting laser module as claimed in claim 9, wherein
the cap includes a bottom portion to which the ring is connected, and
the bottom portion of the cap is formed in a square shape or a rectangular shape.

11. The surface-emitting laser module as claimed in claim 9. wherein
the cap includes a bottom portion to which the ring is connected, and
the bottom portion of the cap is formed in a shape analogous to a shape of the recess portion of the package.

12. The surface-emitting laser module as claimed in claim 9, wherein
the ring and the cap is connected by seam welding.

13. An optical scanner device to optically scan a surface subject to scanning with light, the optical scanner device comprising:
a light source including the surface-emitting laser module as claimed in claim 1;
a light deflecting portion to deflect the light emitted from the light source; and
a scanning optical system to converge the light deflected by the light deflecting portion onto the surface subject to scanning.

14. An image forming apparatus comprising.
an image carrier; and
the optical scanner device as claimed in claim 13 to scan light modulated based on image information on the image carrier.

15. The image forming apparatus as claimed in claim 14, further comprising:
a plurality of the image carriers, wherein
the image information is multicolored image information.

16. The surface-emitting laser module as claimed in claim 1, wherein an optical output of a basic transverse mode of the light emitted from the surface-emitting laser increases in the high reflectance region and an optical output of a higher-order transverse mode of the light emitted from the surface-emitting laser increases in the low reflectance region.

* * * * *